(12) United States Patent
Yamazaki et al.

(10) Patent No.: US 10,379,414 B2
(45) Date of Patent: Aug. 13, 2019

(54) DISPLAY DEVICE COMPRISING A TRANSISTOR ELECTRICALLY CONNECTED TO A RESISTOR AND A FIRST CAPACITOR AND ELECTRONIC DEVICE HAVING THE SAME

(71) Applicant: SEMICONDUCTOR ENERGY LABORATORY CO., LTD., Atsugi-shi, Kanagawa-ken (JP)

(72) Inventors: Shunpei Yamazaki, Tokyo (JP); Kensuke Yoshizumi, Kanagawa (JP); Hiroyuki Miyake, Aichi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 67 days.

(21) Appl. No.: 15/552,818

(22) PCT Filed: Feb. 23, 2016

(86) PCT No.: PCT/IB2016/050948
§ 371 (c)(1),
(2) Date: Aug. 23, 2017

(87) PCT Pub. No.: WO2016/139549
PCT Pub. Date: Sep. 9, 2016

(65) Prior Publication Data
US 2018/0046004 A1    Feb. 15, 2018

(30) Foreign Application Priority Data

Mar. 3, 2015 (JP) ................................ 2015-040962
Mar. 3, 2015 (JP) ................................ 2015-040975

(51) Int. Cl.
*G09G 3/36* (2006.01)
*G09G 5/34* (2006.01)
(Continued)

(52) U.S. Cl.
CPC .... *G02F 1/13624* (2013.01); *G02F 1/136213* (2013.01); *G02F 1/136286* (2013.01);
(Continued)

(58) Field of Classification Search
CPC ... G02F 1/1343; G02F 1/133; G02F 1/133602
See application file for complete search history.

(56) References Cited

U.S. PATENT DOCUMENTS 6,337,722 B1*  1/2002  Ha ................... G02F 1/136204
                                                         257/360
7,508,385 B2   3/2009  Ueda et al.
(Continued)

FOREIGN PATENT DOCUMENTS

CN     001441400 A    9/2003
JP     2003-047636 A  2/2003
(Continued)

OTHER PUBLICATIONS

Burr.D et al., "Impulse-response functions for chromatic and achromatic stimuli", J. Opt. Soc. Am. A(Journal of The Optical Society of America A: Optical Physics), Aug. 1, 1993, vol. 10, No. 8, pp. 1706-1713, OSA(The Optical Society of America).
(Continued)

*Primary Examiner* — Paul C Lee
(74) *Attorney, Agent, or Firm* — Fish & Richardson P.C.

(57) ABSTRACT

An object of the present invention is to provide a display device having a function of performing display that is less likely to cause eye strain.
In the configuration of the display device of the present invention, one of a source and a drain of a transistor (510) is electrically connected to one electrode of a resistor (580) and one electrode of a first capacitor (550), the other electrode of the resistor (580) is electrically connected to a first wiring (610), the other of the source and the drain of the
(Continued)

transistor (510) is electrically connected to one electrode of a liquid crystal element (570) and one electrode of a second capacitor (560), and a gate of the transistor (510) is electrically connected to a second wiring (620).

11 Claims, 43 Drawing Sheets

(51) Int. Cl.
| | |
|---|---|
| G06F 3/041 | (2006.01) |
| G02F 1/1333 | (2006.01) |
| G02F 1/1337 | (2006.01) |
| G02F 1/1343 | (2006.01) |
| G02F 1/1362 | (2006.01) |
| H01L 29/786 | (2006.01) |

(52) U.S. Cl.
CPC ......... G06F 3/0412 (2013.01); G09G 3/3648 (2013.01); H01L 29/786 (2013.01); *G02F 1/13338* (2013.01); *G02F 1/133707* (2013.01); *G02F 2001/134372* (2013.01); *G02F 2203/30* (2013.01); *G09G 5/34* (2013.01); *G09G 2300/0852* (2013.01); *G09G 2320/0247* (2013.01); *G09G 2320/0653* (2013.01); *G09G 2320/0686* (2013.01)

(56) References Cited

U.S. PATENT DOCUMENTS

| | | | |
|---|---|---|---|
| 7,978,277 B2 | 7/2011 | Kimura | |
| 8,120,721 B2 | 2/2012 | Kimura | |
| RE43,640 E | 9/2012 | Ueda et al. | |
| 8,395,718 B2 | 3/2013 | Kimura | |
| 8,487,936 B2 | 7/2013 | Suzuki | |
| 8,711,314 B2 | 4/2014 | Kimura | |
| 8,837,203 B2 | 9/2014 | Shionoiri et al. | |
| 8,848,449 B2 | 9/2014 | Endo | |
| 8,878,589 B2 | 11/2014 | Kimura | |
| 9,257,082 B2 | 2/2016 | Kimura et al. | |
| 9,336,850 B2 | 5/2016 | Shionoiri et al. | |
| 9,341,908 B2 | 5/2016 | Kimura | |
| 9,875,706 B1* | 1/2018 | Gong | G09G 3/36 |
| 2003/0160750 A1 | 8/2003 | Ueda et al. | |
| 2004/0171221 A1* | 9/2004 | Takatori | G09G 3/3648 438/281 |
| 2005/0083563 A1* | 4/2005 | Tsai | G02F 1/0121 359/237 |
| 2008/0284929 A1* | 11/2008 | Kimura | G02F 1/13624 349/38 |
| 2008/0297676 A1 | 12/2008 | Kimura | |
| 2009/0224245 A1* | 9/2009 | Umezaki | G11C 19/28 257/59 |
| 2011/0170029 A1* | 7/2011 | Kimura | G02F 1/136213 349/38 |
| 2012/0212686 A1* | 8/2012 | Kimura | G02F 1/13624 349/42 |
| 2014/0152932 A1* | 6/2014 | Miyake | G02F 1/136213 349/42 |
| 2016/0238915 A1* | 8/2016 | Kim | G02F 1/136213 |
| 2016/0357045 A1 | 12/2016 | Kimura | |

FOREIGN PATENT DOCUMENTS

| | | |
|---|---|---|
| JP | 2003-255305 A | 9/2003 |
| JP | 2008-287032 A | 11/2008 |
| JP | 2009-009553 A | 1/2009 |
| KR | 2008-0007203 A | 1/2008 |

OTHER PUBLICATIONS

International Search Report (Application No. PCT/IB2016/050948) dated May 31, 2016.
Written Opinion (Application No. PCT/IB2016/050948) dated May 31, 2016.

* cited by examiner writing period sensing period

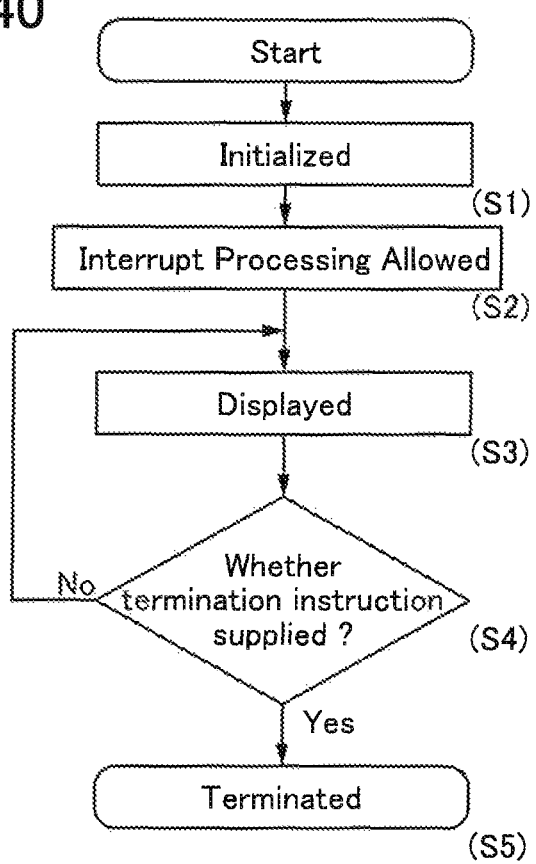

DISPLAY DEVICE COMPRISING A TRANSISTOR ELECTRICALLY CONNECTED TO A RESISTOR AND A FIRST CAPACITOR AND ELECTRONIC DEVICE HAVING THE SAME

TECHNICAL FIELD

One embodiment of the present invention relates to a display device using a liquid crystal element.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter (a composition of matter). Therefore, specific examples of the technical field of one embodiment of the present invention disclosed in this specification include a semiconductor device, a light-emitting device, a lighting device, a power storage device, a memory device, an imaging device, a method for driving any of them, and a method for manufacturing any of them.

Note that in this specification and the like, a semiconductor device generally means a device that can function by utilizing semiconductor characteristics. Furthermore, a transistor and a semiconductor circuit are embodiments of semiconductor devices. In some cases, a storage device, a display device, an imaging device, or an electronic device includes a semiconductor device.

BACKGROUND ART

With the development of information technology (IT), IT devices such as personal computers, cellular phones, and smartphones are used daily. At the same time, an eye health problem caused by continuous use of these devices has surfaced, and a device for reducing eye strain has been proposed (Patent Document 1).

Causes of eye strain due to use of personal computers and the like include intense light from screens, fast movement of text by scrolling, and the like. For a portable electronic device, such as a cellular phone, flicker reduction by increasing speed of response to text scrolling has been proposed (Patent Document 2).

PRIOR ART DOCUMENTS

Patent Documents

[Patent Document 1] Japanese Published Patent Application No. 2003-047636
[Patent Document 2] Japanese Published Patent Application No. 2009-009553

SUMMARY OF INVENTION

Problems to be Solved by Invention

One object of one embodiment of the present invention is to provide a display device having a function of performing display that is less likely to cause eye strain. Another object is to provide a display device having a function of performing eye-friendly display. Another object is to provide a semiconductor device with low power consumption. Another object is to provide a display device with little screen flicker. Another object is to provide a novel semiconductor device or the like.

Note that the descriptions of these objects do not preclude the existence of other objects. Note that in one embodiment of the present invention, there is no need to achieve all the objects. Note that other objects will be apparent from and can be derived from the description of the specification, the drawings, the claims, and the like.

Means for Solving the Problems

One embodiment of the present invention is a display device including a transistor, a resistor, a first capacitor, a second capacitor, and a liquid crystal element; one of a source and a drain of the transistor is electrically connected to one electrode of the resistor; one of the source and the drain of the transistor is electrically connected to one electrode of the first capacitor; the other electrode of the resistor is electrically connected to a first wiring; the other of the source and the drain of the transistor is electrically connected to one electrode of the liquid crystal element; the other of the source and the drain of the transistor is electrically connected to one electrode of the second capacitor; and a gate of the transistor is electrically connected to a second wiring.

The above transistor preferably includes an oxide semiconductor in a channel formation region.

Furthermore, another embodiment of the present invention is a display device including a first transistor, a second transistor, a resistor, a first capacitor, a second capacitor, and a liquid crystal element; one of a source and a drain of the first transistor is electrically connected to one electrode of the resistor; one of the source and the drain of the first transistor is electrically connected to one electrode of the first capacitor; the other electrode of the resistor is electrically connected to a first wiring; the other of the source and the drain of the first transistor is electrically connected to one electrode of the liquid crystal element; the other of the source and the drain of the first transistor is electrically connected to one electrode of the second capacitor; a gate of the first transistor is electrically connected to a second wiring; one of a source and a drain of the second transistor is electrically connected to the one electrode of the resistor, and the other of the source and the drain of the second transistor is electrically connected to the other of the source and the drain of the first transistor; and a gate of the second transistor is electrically connected to a third wiring.

Furthermore, another embodiment of the present invention is a display device including a first transistor, a second transistor, a resistor, a first capacitor, a second capacitor, and a liquid crystal element; one of a source and a drain of the first transistor is electrically connected to a first wiring; the other of the source and the drain of the first transistor is electrically connected to one electrode of the first capacitor; the other of the source and the drain of the first transistor is electrically connected to one electrode of the resistor; the other electrode of the resistor is electrically connected to one electrode of the second capacitor; the other electrode of the resistor is electrically connected to one electrode of the liquid crystal element; a gate of the first transistor is electrically connected to a second wiring; one of a source and a drain of the second transistor is electrically connected to the one electrode of the resistor; the other of the source and the drain of the second transistor is electrically connected to the other electrode of the resistor; and a gate of the second transistor is electrically connected to a third wiring.

The first transistor and the second transistor preferably each include an oxide semiconductor in a channel formation region.

Furthermore, it is preferable that a resistive layer of the resistor be an oxide.

Furthermore, when an image displayed with the liquid crystal element is scrolled at a speed equal to or faster than a first speed, an image signal is supplied to the liquid crystal element without being through the second transistor; when the image displayed with the liquid crystal element is scrolled at a second speed slower than the first speed, the image signal can be supplied to the liquid crystal element through the second transistor.

Effect of Invention

According to one embodiment of the present invention, a display device having a function of performing display that is less likely for eyes to cause strain can be provided. Alternatively, a display device having a function of performing eye-friendly display can be provided. Alternatively, a semiconductor device with low power consumption can be provided. Alternatively, a display device with little screen flicker can be provided. Alternatively, a novel semiconductor device or the like can be provided.

Note that the description of these effects does not preclude the existence of other effects. Note that one embodiment of the present invention does not necessarily achieve all the effects listed above. Note that other effects will be apparent from and can be derived from the description of the specification, the drawings, the claims, and the like.

BRIEF DESCRIPTION OF THE DRAWINGS

FIG. 40 A flow chart illustrating programs of an embodiment.
FIG. 42 Schematic views illustrating examples of a scroll instruction according to an embodiment.

MODES FOR CARRYING OUT INVENTION

Figure 1A:
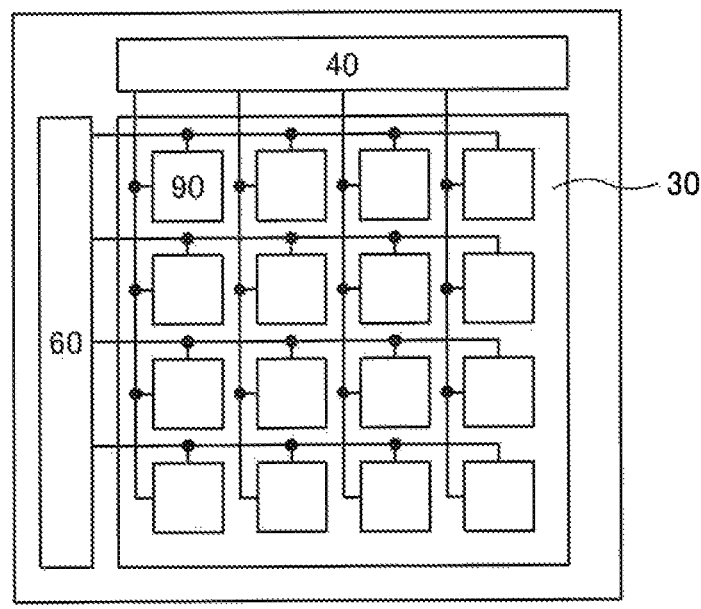
FIG. 1 Diagrams illustrating a display device.

For example, one embodiment of the present invention is configured, including a step of selecting a first mode or a second mode and a step of performing display in the selected mode. Note that one embodiment of the present invention is applied to liquid crystal display devices.

Note that, for example, one embodiment of the present invention can include a step of selecting the first mode or the second mode when a scroll event occurs, in accordance with the contrast between a dark portion and a bright portion or the area of the area of the dark portion in image information to be displayed.

«First Mode»

In the case where the first mode is selected, image information to be displayed next is displayed by the following method to reduce visual stimulation.

For example, the image information to be displayed next is displayed such that an influence of lateral inhibition caused by presently displayed image information may be avoided.

Specifically, using a function provided with a pixel circuit, gray scale is gradually changed so as not to rapidly change luminance when the image is changed.

«Second Mode»

In the case where the second mode is selected, image information is displayed by the following method. For example, a driving method without inversion driving is set to inhibit a first function provided with the pixel circuit. Alternatively, display is performed using a signal path that bypasses part of the pixel circuit.

In this manner, eye strain on a user at the time of switching displayed image information in accordance with a predetermined event such as scrolling can be reduced, whereby eye-friendly display for the user can be achieved. Consequently, a novel display device that is highly convenient or reliable can be provided.

<Display Method in which Influence of Lateral Inhibition is Avoided>

A display method in which an influence of lateral inhibition is avoided will be described with reference to FIG. 38 and FIG. 39.

FIG. 38 are schematic views illustrating an optic nerve and a visual transfer function. FIG. 38A is a schematic view illustrating an example of stimuli applied to an optic nerve when image information is switched from one to another; FIG. 38B and FIG. 38C are schematic views illustrating a positional relation between a display device and a user of the display device. Furthermore, FIG. 38D is a schematic view illustrating responses of an optic nerve to the applied stimuli which are transformed in accordance with the visual transfer function. Note that the vertical axis L represents the brightness and the brightness to which the eyes are adapted is assumed to be 0. Furthermore, the vertical axis S represents the intensity of a response.

FIG. 39 are schematic views illustrating an optic nerve and a visual transfer function. FIG. 39A is a schematic view illustrating an example of stimuli applied to an optic nerve when image information is switched from one to another. FIG. 39B is a schematic view illustrating responses to the applied stimuli which are transformed in accordance with the visual transfer function. Furthermore, FIG. 39C and FIG. 39D are schematic views illustrating the display method of one embodiment of the present invention, in which amplification of responses to applied stimuli can be suppressed.

In the first mode, for example, image information is switched from one to another at a time interval of 100 msec or longer, preferably 150 msec or longer. In this manner, an influence of lateral inhibition can be avoided. Thus, amplification of responses to visual stimuli can be reduced.

«Lateral Inhibition»

A neuron of a stimulated optic nerve is capable of inhibiting activities of adjacent other neurons. This phenomenon may cause transformation of responses to a pulsed visual stimulus.

Figure 38A:
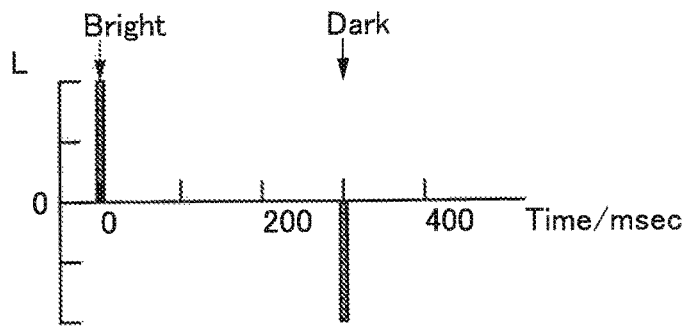
FIG. 38 Schematic views illustrating an optic nerve and a transfer function of one embodiment.
Figure 38B:
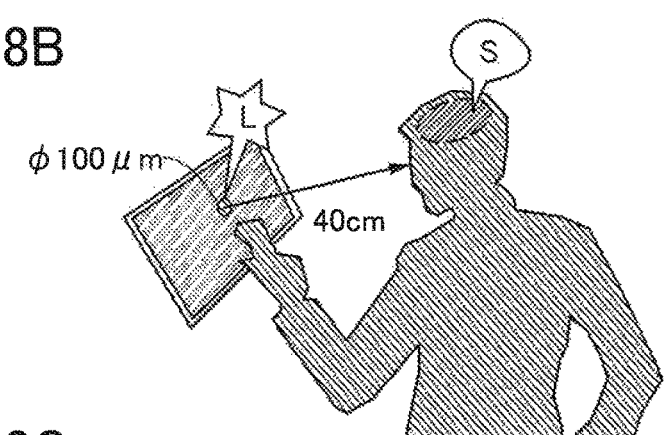

For example, a bright image and a dark image are displayed in a pulsed manner in a region which is on a plane at a distance of 40 cm and has a diameter of 100 μm (see FIG. 38A). Note that a region which is on the plane at a distance of 40 cm and has a diameter of approximately 100 μm corresponds to the size of one photoreceptor cell CELL (see FIG. 38B).

Figure 38C:
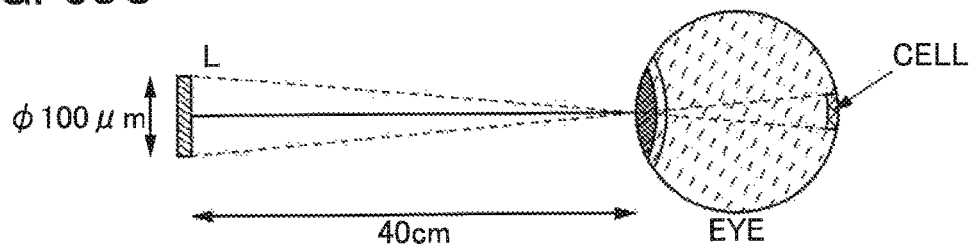
Figure 38D:
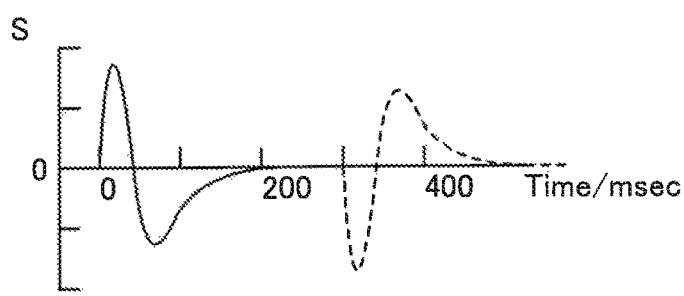
Figure 39A:
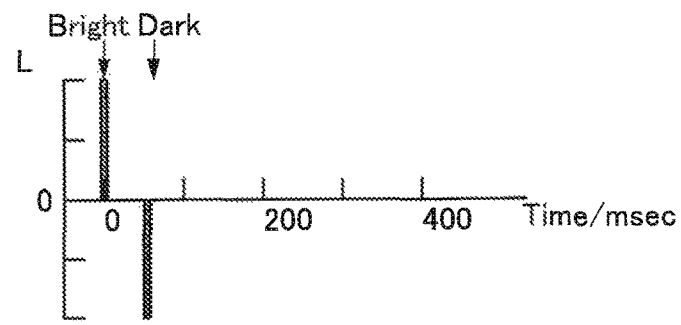
FIG. 39 Schematic views illustrating a visual transfer function of one embodiment.
Figure 39B:
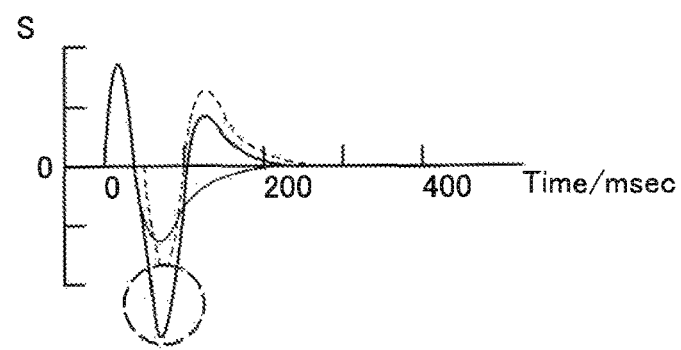
Figure 39C:
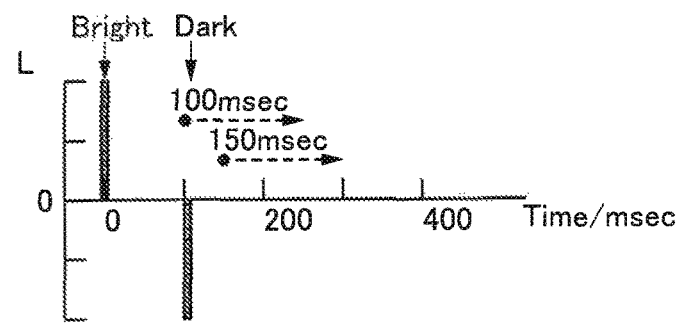
Figure 39D:
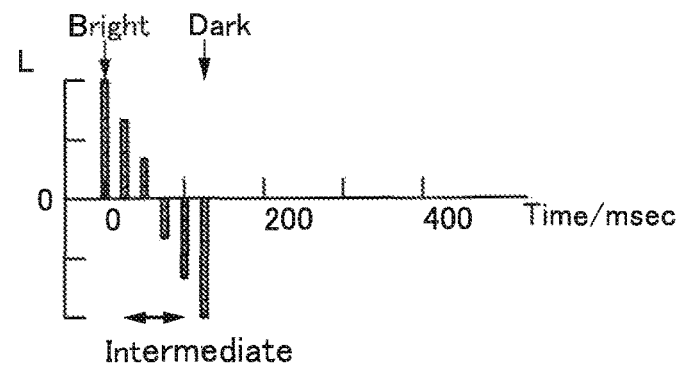

In some cases, a pulsed stimulus is transformed into wave-shaped responses in accordance with the visual transfer function (see FIG. 38A and FIG. 38C). Specifically, a pulsed positive visual stimulus is transformed into a positive response accompanied with a negative response. Meanwhile, a pulsed negative visual stimulus is transformed into a negative response accompanied with a positive response (David C. Burr and M. Concetta Morrone, "Impulse-response functions for chromatic and achromatic stimuli," Journal of Optical Society of America, 1993, Vol. 10, No. 8, p. 1706).

For example, when a bright image and a dark image are sequentially displayed at a sufficiently short time interval, a response to the preceding stimulus and a response to the following stimulus, which are both wave-shaped, may be superimposed on each other to increase the amplitude.

For example, pulsed bright first image information is displayed, and 50 msec later, pulsed dark second image information is displayed; in this case, a negative response which follows a positive response to the displayed first image information may be superimposed on a negative response to the displayed second image information. This may significantly amplify a negative response in some cases (see FIG. 39A and FIG. 39B).

For example, when displayed image information is switched from one to another, in the first mode, the display is changed at a time interval of 100 msec or longer, preferably 150 msec or longer. In this manner, the impact of the wave-shaped responses in accordance with the visual transfer function can be avoided. As a result, the amplification of responses to visual stimuli can be reduced (see FIG. 39 C).

As another example, in the first mode, displayed image information is switched from one to another with intermediate image information displayed therebetween. Specifically, a gray image or an image with a gray scale between that of the preceding image information and that of the following image information can be used for the intermediate image information (see FIG. 39D). Thus, wave-shaped responses to the preceding stimulus can be canceled by wave-shaped responses to the following stimulus, thereby weakening in amplitude.

Alternatively, image information in which the preceding image information fades out while the following image information fades in (also referred to as cross-fade) can be used as intermediate image information.

As another example, a display element may be overdriven in the second mode, whereas the overdrive may be turned down or stopped in the first mode. Specifically, the overdrive of a liquid crystal element may be stopped in the first mode, whereas the liquid crystal element may be overdriven in the second mode.

In this manner, an influence of lateral inhibition can be avoided. Thus, amplification of responses to visual stimuli can be reduced.

<Program Example>

With a program of one embodiment of the present invention, one embodiment of the present invention will be described with reference to FIG. 40 and FIG. 41.

FIG. 40 is a flow chart illustrating main processing of the program of one embodiment of the present invention. FIG. 41 is a flow chart illustrating interrupt processing of the program of one embodiment of the present invention.

The program of one embodiment of the present invention includes the following eleven steps (see FIG. 40).

In the first step, the setting is initialized. For example, the first mode or the second mode is set as initial setting, and a predetermined image is loaded.

In the second step, interrupt processing is allowed. Note that an arithmetic device allowed to execute the interrupt processing can perform the interrupt processing in parallel with the main processing. The arithmetic device which has returned from the interrupt processing to the main processing can reflect the results of the interrupt processing in the main processing.

Note that the arithmetic device may execute the interrupt processing when a counter has an initial value, and the counter may be set at a value other than the initial value when the arithmetic device returns from the interrupt processing. Thus, the interrupt processing can be always executed after the program is started up.

In the third step, image information is displayed in a predetermined mode selected in the first step or in the interrupt processing.

In the fourth step, the processing proceeds to the fifth step when a termination instruction has been supplied, whereas the processing proceeds to the third step is selected as the next step when the termination instruction has not been supplied.

In the fifth step, processing is terminated.

Figure 41:
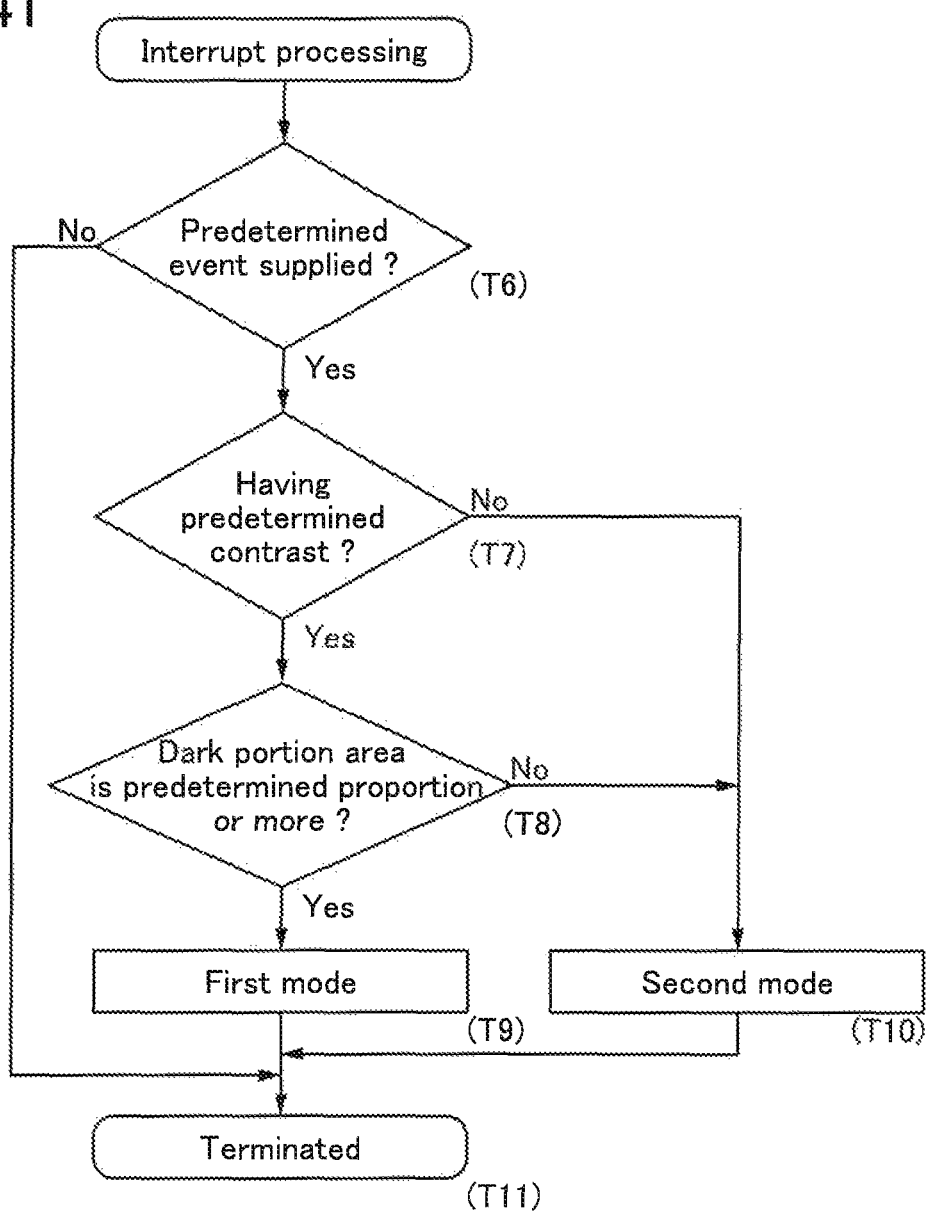
FIG. 41 A flow chart illustrating programs of an embodiment.

The interrupt processing includes the following sixth to eleventh steps (see FIG. 41).

In the sixth step, the processing proceeds to the seventh step when a predetermined event has been supplied, whereas the processing proceeds to the eleventh step when the predetermined event has not been supplied.

In the seventh step, the processing proceeds to the eighth step when image information to be displayed next has a predetermined contrast, whereas the processing proceeds to the tenth step when the image information to be displayed next does not have the predetermined contrast.

In the eighth step, the processing proceeds to the ninth step when the proportion of the area of a dark portion in the image information to be displayed next is higher than or equal to a predetermined proportion, whereas the processing proceeds to the tenth step when the proportion of the area of the dark portion is lower than the predetermined proportion.

In the ninth step, the first mode is selected.

In the tenth step, the second mode is selected.

In the eleventh step, the processing returns from the interrupt processing.

«Predetermined Event»

A variety of instructions can be associated with a variety of events.

For example, the instructions include "page-turning instruction" for switching displayed image information from one to another and "scroll instruction" for moving the display position of part of image information and displaying another part continuing from that part.

For example, the events include events supplied using a pointing device such as a mouse, e.g., "click" and "drag", and events supplied to a touch panel with a finger or the like used as a pointer, e.g., "tap", "drag" and "swipe".

For example, the position of a slide bar pointed by a pointer, the swipe speed, and the drag speed can be used as parameters assigned to various instructions.

Specifically, a parameter that determines the page-turning speed or the like can be used to execute the "page-turning instruction" and a parameter that determines the moving speed of the display position or the like can be used to execute the "scroll instruction".

Furthermore, for example, the display brightness or contrast may be changed in accordance with the page-turning speed and/or the scroll speed. Specifically, in the case where the page-turning speed and/or the scroll speed are/is higher than the speed at which eyes can follow displayed images, the display brightness or contrast may be decreased in synchronization with the page-turning speed and/or the scroll speed.

«Scroll Instruction»

Examples of a scroll instruction for moving the display position of image information at various speeds will be described with reference to FIG. 42. Note that, for example, the speed at which a touch panel is swiped can be used to determine the moving speed of the display position in the scroll instruction.

FIG. 42A-1, FIG. 42B-1, and FIG. 42C-1 are schematic views illustrating a scroll instruction for moving the display position of image information at a time-varying speed V.

Figure 2:
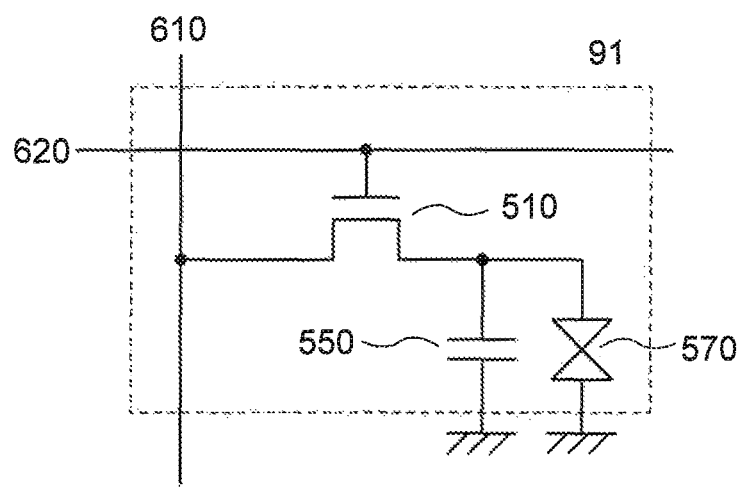
FIG. 2 A diagram illustrating a pixel circuit.
Figures 1, 42A:
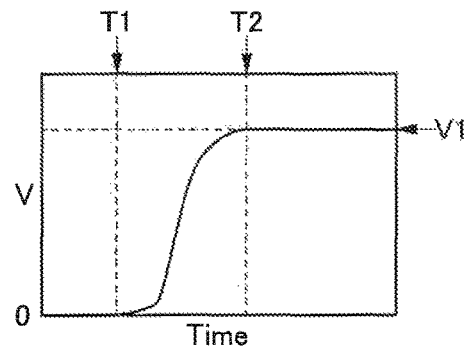
Figures 2, 42A:
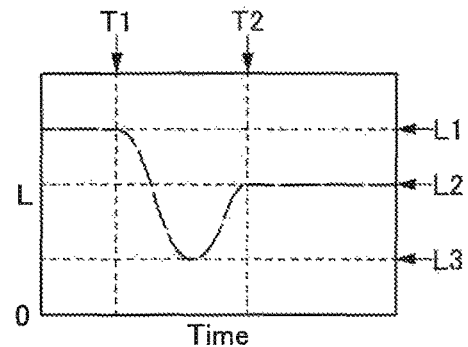

FIG. 42A-2 illustrates a method for adjusting the brightness L of the bright portion of the image information whose display position is moved at the speed shown in FIG. 42A-1.

Figures 1, 42B:
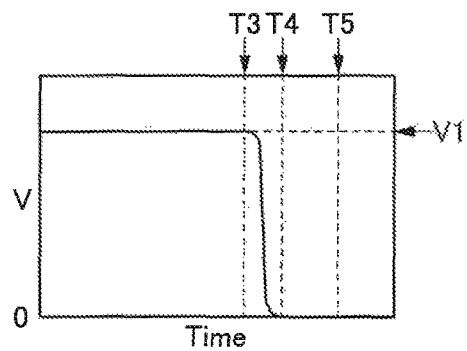
Figures 2, 42B:
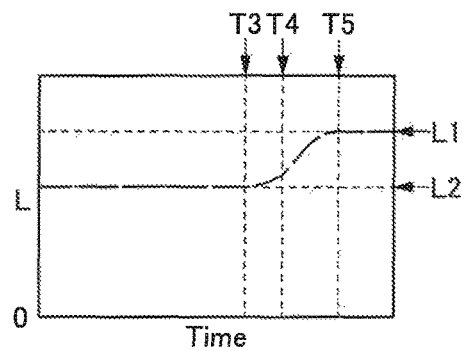

FIG. 42B-2 illustrates a method for adjusting the brightness L of the bright portion of the image information whose display position is moved at the speed shown in FIG. 42B-1.

Figures 1, 42C:
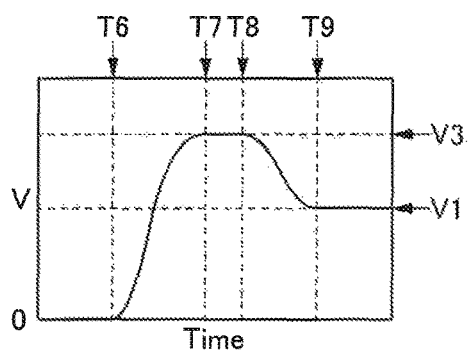
Figures 2, 42C:
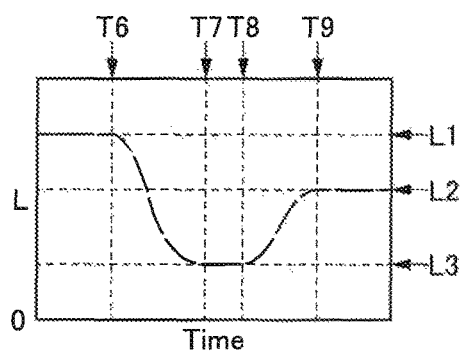

FIG. 42C-2 illustrates a method for adjusting the brightness L of the bright portion of the image information whose display position is moved at the speed illustrated in FIG. 42C-1.

«Example 1 OF Scroll Instruction»

Described will be an example of a scroll instruction in which the moving speed of the display position of the image information is increased from 0 to V1 in a period from Time T1 to Time T2 (see FIG. 42A-1 and FIG. 42A-2).

For example, in a period until Time T1, in which the display position of the image information does not change, the bright portion is displayed at Brightness L1.

In the period from Time T1 to Time T2, in which the display position of the image information is moved at an increasing speed, the bright portion is displayed at Brightness L3, which is lower than Brightness L1.

In a period after Time T2, in which the display position of the image information is moved constantly at Speed V1, the bright portion is displayed at Brightness L2, which is lower than Brightness L1 and higher than Brightness L3.

«Example 2 of Scroll Instruction»

Described will be an example of a scroll instruction in which the moving speed of the display position of the image information is decreased from V1 to 0 in a period from Time T3 to Time T4 (see FIG. 42B-1 and FIG. 42B-2).

For example, in a period until Time T3, in which the display position of the image information is moved constantly at Speed V1, the bright portion is displayed at Brightness L2.

In the period from Time T3 to Time T4, in which the display position of the image information is moved at a decreasing speed, the bright portion is displayed at a brightness increasing from Brightness L2.

In a period from Time T4 to Time T5, in which the display position of the image information is fixed, the bright portion is displayed at a brightness increasing to predetermined Brightness L1, which is higher than Brightness L2. Note that the period from Time T4 to Time T5 is preferably 0 or longer.

«Example 3 of Scroll Instruction»

The display position of the image information is moved at a speed increasing from 0 to V1 in a period from Time T6 to Time T7 and moved at Speed V1 in a period from Time T7 to Time T8. Described will be an example of a roll instruction in which the display position of the image information is moved at a speed decreasing from V1 to V2 in a period from Time T8 to Time T9 and moved at Speed V2 in a period after Time T9 (see FIG. 42C-1 and FIG. 42C-2).

For example, in a period until Time T6, in which the display position of the image information does not change, the display is at Brightness L1.

In the period from Time T6 to Time T7, in which the display position of the image information is moved at an increasing speed, the bright portion is displayed at Brightness L3, which is lower than Brightness L1.

In the period from Time T7 to Time T8, in which the display position of the image information is moved constantly at Speed V3, the bright portion is displayed at Brightness L3.

In the period from Time T8 to Time T9, in which the display position of the image information is moved at a decreasing speed, the bright portion is displayed at a brightness increasing from Brightness L3.

In the period after Time T9, in which the display position of the image information is moved constantly at Speed V1, which is lower than Speed V3, the bright portion is displayed at Brightness L2, which is lower than Brightness L1 and higher than Brightness L3.

«Condition for Mode Selection»

Next, a method in which characteristics of image information to be displayed next are used as conditions for mode selection will be described with reference to FIG. 43.

Figure 43A:
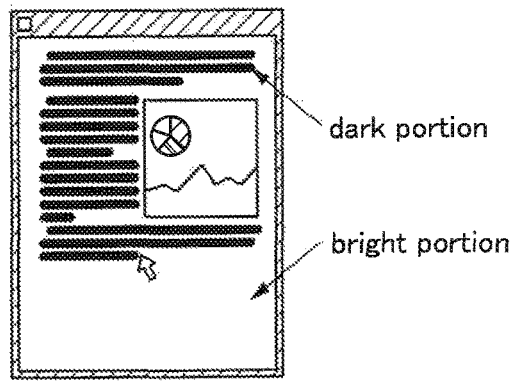
FIG. 43 Schematic views illustrating a configuration of image information of an embodiment.

FIG. 43A is a schematic view illustrating image information and a dark portion and a bright portion included in image information.

Figure 43B:
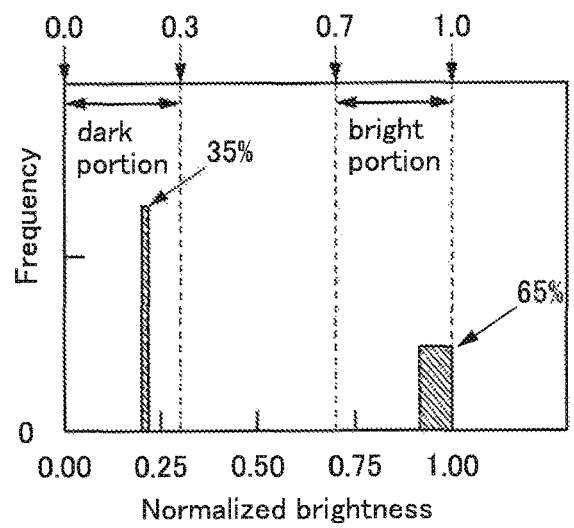

FIG. 43B is a schematic view illustrating the proportion of the area in terms of brightness in the image information to be displayed next. Note that the horizontal axis represents the normalized brightness, where the lowest brightness and the highest brightness of the display device are 0 and 1, respectively.

Figure 43C:
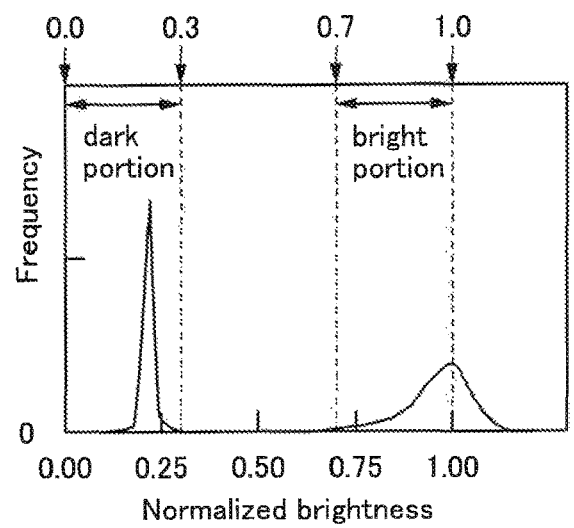

FIG. 43C is a diagram (or a histogram) showing the results of determining the proportion of the area in terms of brightness in an example of a general document in which texts are printed on white paper. Note that the horizontal axis represents the normalized brightness, where the brightness with the highest proportion of the area in the bright portion is 1.

Specifically, the case where the contrast or the proportion of the area of the dark portion in the image information to be displayed next is used as a condition for mode selection will be described.

«Contrast»

For example, the first mode can be selected depending on whether or not the contrast in the image information to be displayed next exceeds a predetermined value.

Specifically, in the image information, a region with a normalized brightness higher than or equal to 0 and lower than or equal to 0.3 is defined as a dark portion, and a region with a normalized brightness higher than or equal to 0.7 and lower than or equal to 1.0 is defined as a bright portion. The mode can be selected depending on whether or not the image information includes the bright portion and the dark portion.

For example, image information including a region with a normalized brightness of 0.2 and a region with a normalized brightness of 0.95 satisfies the condition for selection of the first mode (see FIG. 43B).

In the case where the contrast in the image information to be displayed next is lower than that in an example of a general document in which texts are printed on white paper (see FIG. 43C), the second mode may be selected because only a little visual stimulation is caused by display change.

«Proportion of Area of Dark Portion»

Furthermore, for example, as a condition for mode selection, it is also possible to use the proportion of the area of the dark portion in the image information to be displayed next.

Specifically, the mode can be selected depending on whether or not the dark portion occupies 30% or more of the image information.

For example, image information in which the proportion of the area of a region with a normalized brightness of 0.2 is 35% satisfies the condition for mode selection (see FIG. 43B).

In the case where the proportion of the area of the dark portion in the image information to be displayed next is lower than that in a general document in which, for example, texts are printed on white paper (see FIG. 43C), the second mode may be selected because only a little visual stimulation is caused by display change.

Embodiments will be described in detail with reference to the drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of embodiments below. Note that in structures of the present invention described below, the same portions or portions having similar functions are denoted by the same reference numerals in different drawings, and description thereof is not repeated in some cases. It is also to be noted that the same components are denoted by different hatching patterns in different drawings, or the hatching patterns are omitted in some cases.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable a functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that the terms "film" and "layer" can be interchanged with each other depending on the case or circumstances. For example, the term "conductive layer" can be changed into the term "conductive film" in some cases. Also, the term "insulating film" can be replaced with the term "insulating layer" in some cases.

(Embodiment 1)

Figure 1B:
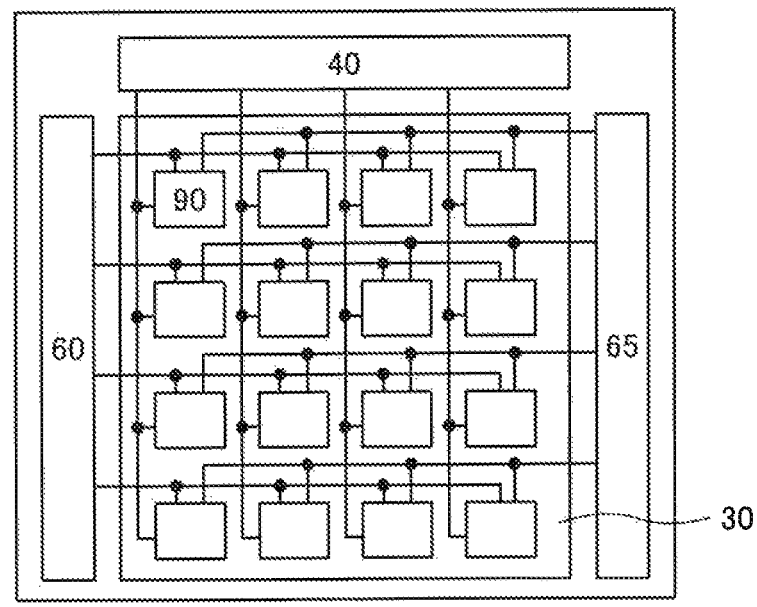

In this embodiment, a display device according to one embodiment of the present invention will be described with reference to drawings. The display device according to one embodiment of the present invention can be configured to include a pixel portion 30, a circuit 40, and a circuit 60, as shown in FIG. 1A. Alternatively, as shown in FIG. 1B, the display device according to one embodiment of the present invention can be configured to include a pixel portion 30, a circuit 40, a circuit 60, and a circuit 65.

The pixel portion 30 has a configuration in which pixel circuits 90 are arranged in a matrix. Note that although FIG. 1A and FIG. 1B illustrate a configuration of the pixel circuits 50 simplified to be 4×4, the configuration can specifically be 1920×1080, 4K×2K, or 8K×4K, for example.

The circuit 40 can have a function of a signal line driver circuit. Furthermore, the circuit 60 and the circuit 65 can have a function of a scan line driver circuit. Note that although FIG. 1A illustrates a configuration in which the circuit 60 is arranged in a region of an edge portion of the pixel portion 30, the circuit 60 can be divided and arranged also on the opposite side of the region.

Note that the display device of one embodiment of the present invention is a liquid crystal display device. Therefore, the pixel circuit 90 includes a transistor and a liquid crystal element. FIG. 2 illustrates a general pixel circuit 91, which can be used as the pixel circuit 90. Note that the pixel circuit 91 can be used as the display device in FIG. 1A.

In the pixel circuit 91, one of a source and a drain of a transistor 510 is electrically connected to a signal line 610. Furthermore, the other of the source and the drain of the transistor 510 is electrically connected to one electrode of a liquid crystal element 570 and one electrodes of a capacitor 550. Furthermore, a gate of the transistor 510 is electrically connected to a scan line 920. Furthermore, the signal line 610 is electrically connected to the circuit 40, and the scan line 620 is electrically connected to the circuit 60.

When a potential (hereinafter, ON signal) that turns on the transistor 510 is supplied to the scan line 620, a signal potential (image signal) of the signal line 610 is immediately supplied to the liquid crystal element 70. Therefore, an image can be switched at a high speed. For example, the frame frequency can be 60 Hz, 120 Hz, 240 Hz, or the like, and display of videos can be accommodated.

Meanwhile, when there is continuous rapid change in luminance, e.g., when an image with a low gray scale is switched to an image with a high gray scale, eye strain may be triggered. For example, even with a still image, a case in which a page is switched, a case in which an image is scrolled, and the like may correspond to rapid change in luminance. To prevent eye strain from being induced, it is preferable to gradually change a gray scale and not to change luminance rapidly in switching an image. In the display device of one embodiment of the present invention, a pixel circuit is provided with a function of gradually changing a gray scale. The function corresponds to the above-described first mode.

Figure 3:
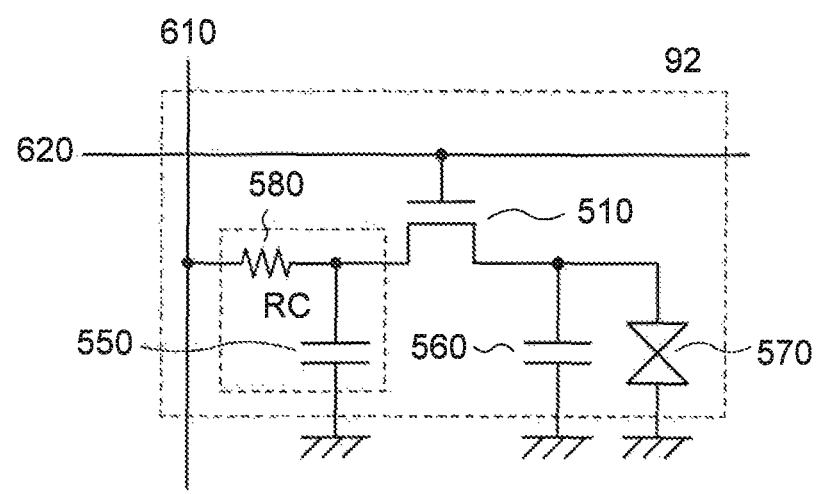
FIG. 3 A diagram illustrating a pixel circuit.

FIG. 3 illustrates a pixel circuit 92 of one embodiment the present invention. Note that the pixel circuit 92 can be used as the pixel circuit 90 in the display device illustrated in FIG. 1A. In the pixel circuit 92, one of a source and a drain of the transistor 510 is electrically connected to one electrode of a resistor 580 and one electrode of the capacitor 550. Further, the other electrode of the resistor 580 is electrically connected to the signal line 610. Further, the other of the source and the drain of the transistor 510 is electrically connected to one electrode of the liquid crystal element 570 and one electrode of a capacitor 560. Further, a gate of the transistor 510 is electrically connected to the scan line 620.

In the pixel circuit 92, the capacitor 550 and the resistor 580 form an RC circuit, and can delay writing of an image signal input from the signal line 610 to the capacitor 550 and the liquid crystal element 570. In other words, when the image signal supply to the signal line 610 is synchronized with the ON signal supply to the scan line 620, the liquid crystal element 570 can be operated in a manner in which a gray scale is gradually changed. Note that in the case where operation that gradually changes a gray scale is unnecessary, i.e., in the case of the above-described second mode, operation may be performed in a manner in which inversion driving is not performed.

Figure 4:
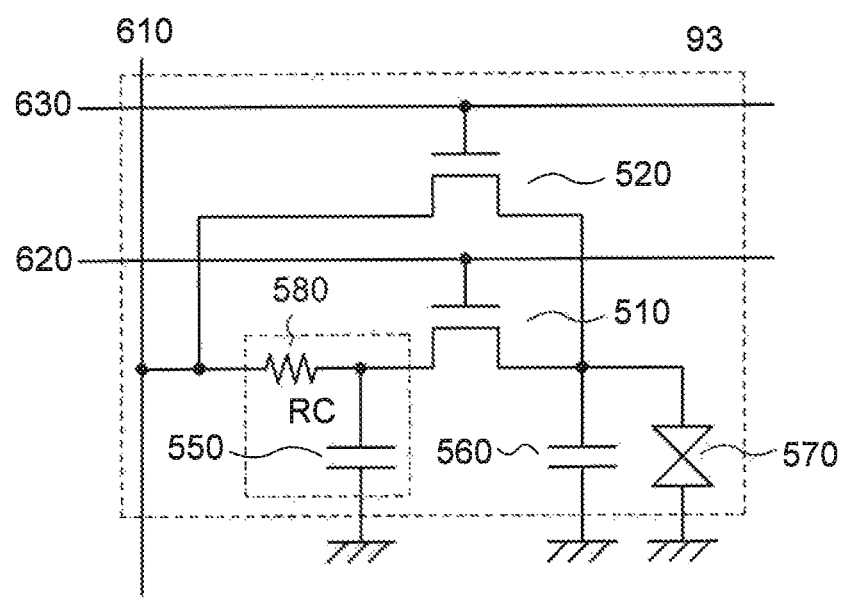
FIG. 4 A diagram illustrating a pixel circuit.

Furthermore, the pixel circuit of one embodiment of the present invention may have a configuration illustrated in FIG. 4. Note that a pixel circuit 93 illustrated in FIG. 4 can be used as the pixel circuit 90 in the display device illustrated in FIG. 1B.

The pixel circuit 93 has a configuration of the pixel circuit 92 to which a transistor 520 and a scan line 630 are added. One of a source and a drain of the transistor 520 is electrically connected to the scan line 620. Further, the other of the source and the drain of the transistor 520 is electrically connected to one electrode of the liquid crystal element 570 and one electrode of the capacitor 560. Note that the scan line 620 is electrically connected to the circuit 60 and the scan line 630 is electrically connected to the circuit 65.

The pixel circuit 92 illustrated in FIG. 3 is configured to operate in a manner in which a gray scale is gradually changed in all images. On the other hand, the pixel circuit 93 illustrated in FIG. 4 includes a signal path that bypasses an RC circuit; in the case where operation that gradually changes a gray scale is unnecessary (the second mode), the ON signal is supplied to the scan line 630 and only the transistor 520 is turned on.

Note that in the signal path that includes an RC circuit in the pixel circuit 92 and in the pixel circuit 93, a signal potential needs to be written in one horizontal period (a period in which one line is supplied with the ON signal). Therefore, writing to the RC circuit needs to be processed in a period shorter than one horizontal period. Further, in the pixel circuit 92 and the pixel circuit 93, the signal line 610 is directly connected to the RC circuit; thus, when a signal potential is supplied to the signal line 610, capacitors 550 of all the rows connected to the signal line 610 are charged. Thus, depending on the number of pixels and the resistance of the signal line 610, the response speed may vary in some cases between a pixel close to the circuit 40 and a pixel distant from the circuit 40.

Figure 5:
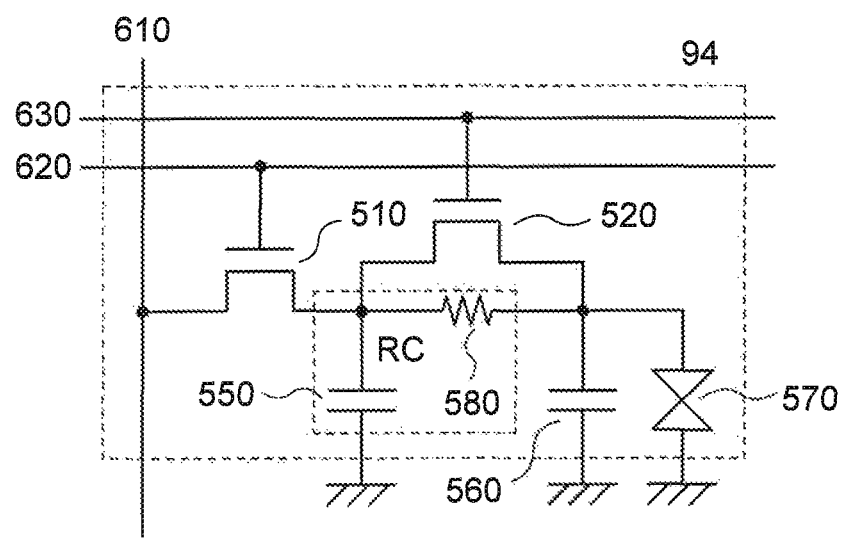
FIG. 5 A diagram illustrating a pixel circuit.

Thus, the pixel circuit of one embodiment of the present invention may have a configuration illustrated in FIG. 5. Note that a pixel circuit 94 illustrated in FIG. 5 can be used as the pixel circuit 90 in the display device illustrated in FIG. 1B.

In the pixel circuit 94, one of the source and the drain of the transistor 510 is electrically connected to the signal line 610. Further, the other of the source and the drain of the transistor 510 is electrically connected to one electrode of the capacitor 550 and one electrode of the resistor 580. Further, the other electrode of the resistor 580 is electrically connected to one electrode of the capacitor 560 and one electrode of the liquid crystal element 570. Further, the gate of the transistor 510 is electrically connected to the scan line 620. Further, one of the source and the drain of the transistor 520 is electrically connected to the one electrode of the resistor 580. Further, the other of the source and the drain of the transistor 520 is electrically connected to the other electrode of the resistor 580. Further, the gate of the transistor 510 is electrically connected to the scan line 620. Further, a gate of the transistor 520 is electrically connected to the scan line 630.

In the pixel circuit 94, in the case where the operation that gradually changes a gray scale is necessary (the first mode), the ON signal is supplied to the scan line 620 and only the transistor 510 is turned on. Alternatively, in the case where the operation that gradually changes a gray scale is unnecessary (the second mode), the ON signal is supplied to the scan line 620 and the scan line 630, thereby turning on the transistor 510 and the transistor 520 at the same time. Alternatively, the transistor 520 is kept at an on state and the on/off control is performed with the transistor 510.

Furthermore, in the pixel circuit 94, since the transistor 510 is provided between the RC circuit and the scan line 620, when a signal potential is supplied to the signal line 610, the capacitors 81 are not charged in all the rows, and only in the pixel circuit that turns on the transistor 510, the capacitor 550 is charged. Therefore, the above-described issue of the response speed of the pixel is less likely to occur.

Note that, when the capacitance of the capacitor 550 is represented by C1 and the capacitance of the capacitor 560 and the liquid crystal element 570 is represented by C2, it is preferable that C1 be sufficiently larger than C2 because the final potential is determined by the capacitance distribution between C1 and C2. Furthermore, it is preferable that the time constant of the RC circuit including the capacitor 550 and the resistor 580 be large. For example, C1 may be 1 pF or less, C2 may be 50 fF or less, and the resistance of the resistor 580 may be 10 GΩ or less.

Figure 6:
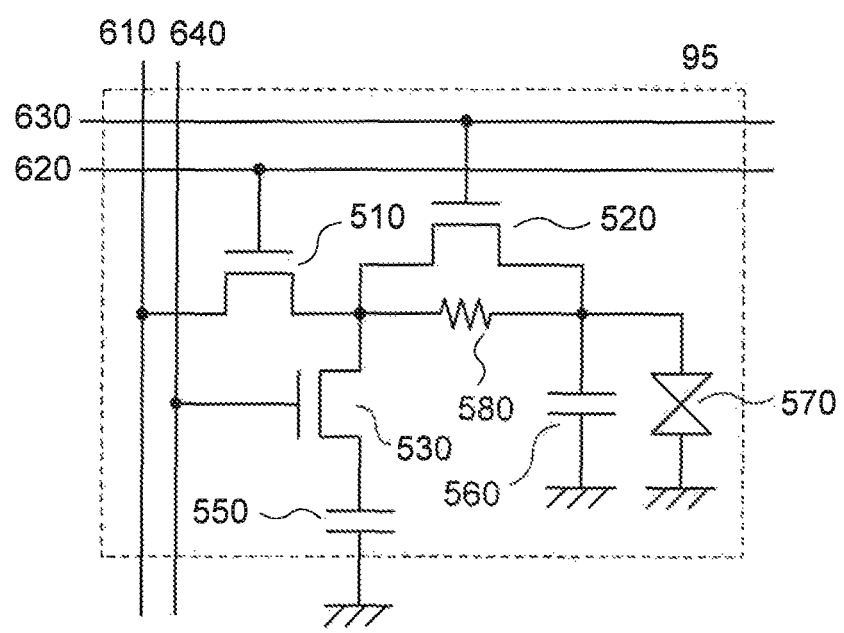
FIG. 6 A diagram illustrating a pixel circuit.

Furthermore, in the pixel circuit of one embodiment of the present invention, as illustrated in FIG. 6, a transistor 530 may be provided between the other of the source and the drain of the transistor 510 and one electrode of the capacitor 550. In the case of this configuration, in the case where the operation that gradually changes a gray scale is necessary (the first mode), the ON signal is supplied to a wiring 640 to turn on the transistor 520, and the RC circuit formed by the capacitor 550 and the resistor 580 is used. In the case where the operation that gradually changes a gray scale is unnecessary (the second mode), the transistor 530 is turned off. By turning off the transistor 530, the charging of the capacitor 550 by a signal potential from the signal line 610 can be avoided, and the response speed of the pixel can be increased.

Figure 7A:
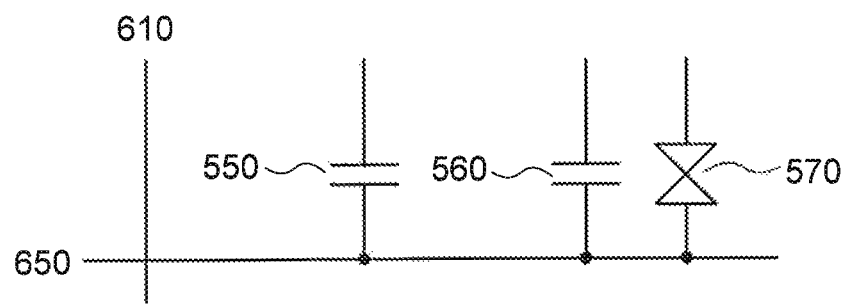
FIG. 7 Diagrams illustrating pixel circuits.
Figure 7B:
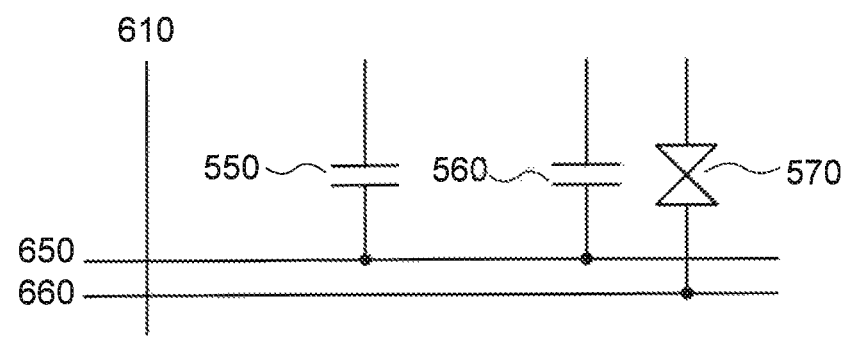
Figure 7C:
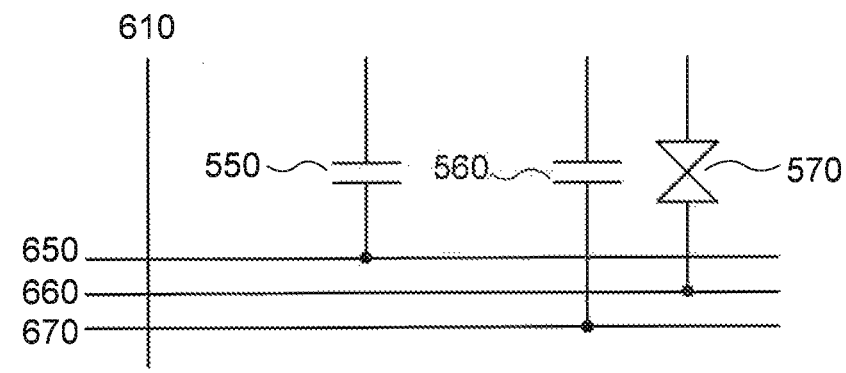

In the pixel circuit 92 illustrated in FIG. 3, the pixel circuit 93 illustrated in FIG. 4, the pixel circuit 94 illustrated in FIG. 5, and the pixel circuit 95 illustrated in FIG. 6, the other electrode of the capacitor 550, the other electrode of the capacitor 560, and the other electrode of the liquid crystal element 570 are connected to a GND; however, a different configuration may be used. For example, as illustrated in FIG. 7A, the other electrodes of the capacitor 550, the capacitor 560, and the liquid crystal element 570 may be connected to a wiring 650 that can supply a given potential. Alternatively, as shown in FIG. 7B, the other electrode of the liquid crystal element 570 may be connected to a wiring 660 that can supply a potential different from a potential supplied from the wiring 650. Alternatively, as illustrated in FIG. 7C, the other electrode of the capacitor 560 may be connected to a wiring 670 that can supply potential different from potentials supplied from the wiring 650 and the wiring 660. Note that any one or two of the wiring 650 to the wiring 670 may be a GND potential.

Figure 8A:
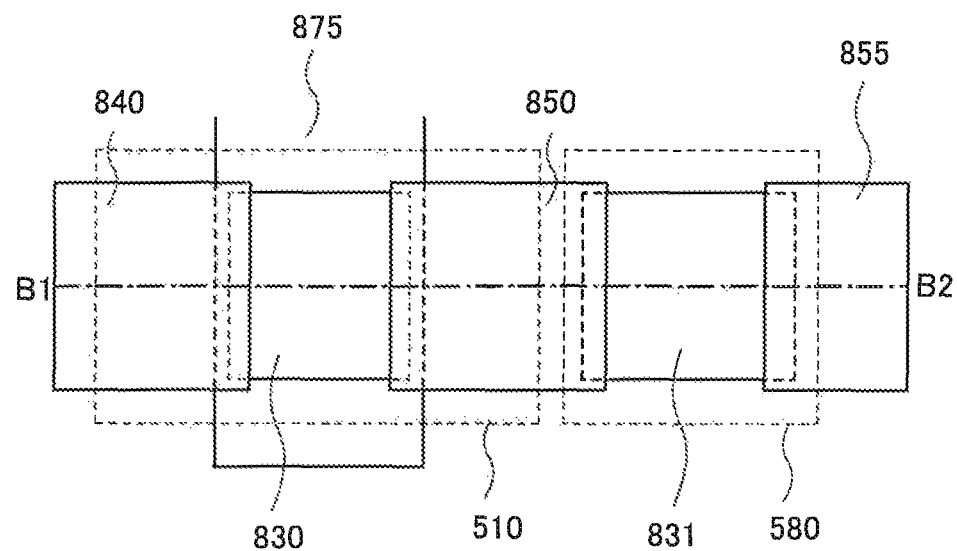
FIG. 8 A top view and a cross-sectional view illustrating a pixel circuit.
Figure 8B:
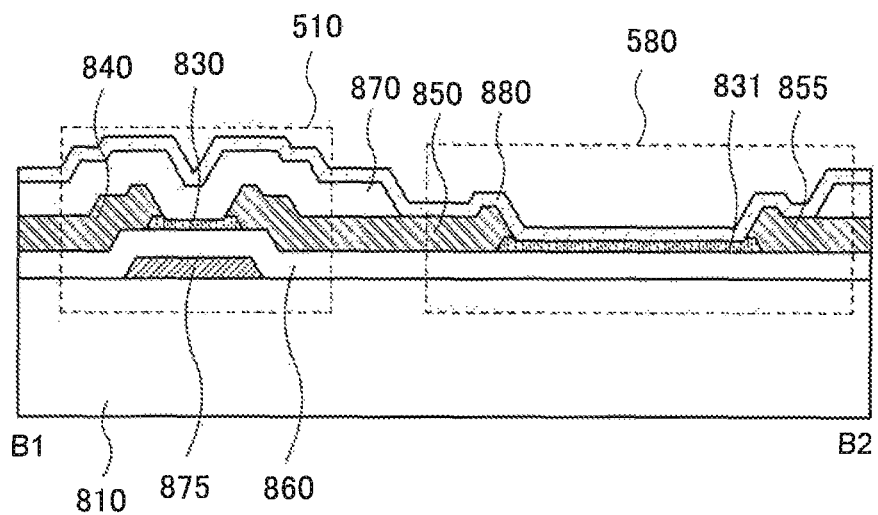

FIGS. 8A and 8B illustrate a top view and a cross-sectional view of the transistor 510 and the resistor 580 in the pixel circuit 94, respectively. The transistor 510 includes a conductive layer 875 having a function of a gate electrode provided over a substrate 810, an insulating layer 860 having a function of a gate insulating film, a semiconductor layer 830 having a function of an active layer, a conductive layer 840 having a function of one of a source electrode and a drain electrode, and a conductive layer 850 having a function of the other of the source electrode and the drain electrode. Furthermore, a protective film 870 and a protective film 880 can be provided over the transistor 510.

The resistor 580 includes a resistive layer 831 provided over the insulating layer 860, a conductive layer 850 functioning as one electrode, and a conductive layer 855 functioning as the other electrode. Note that the conductive layer 850 is also a component of the transistor 510.

Here, the resistive layer 831 can be an oxide layer fabricated with the same process as the semiconductor layer 830. For example, in the case where the semiconductor layer 830 is an oxide semiconductor, the resistive layer 831 can be an oxide layer containing the same extent of impurities as the semiconductor layer 830, and furthermore, can be an oxide layer to which impurities such as hydrogen are diffused from the protective film 880. For example, as the semiconductor layer 830 and the resistive layer 831, In—Ga—Zn oxide can be used. Furthermore, as the protective film 880, a silicon nitride film containing hydrogen or the like can be used.

Alternatively, the resistive layer 831 can be a semiconductor layer 830 fabricated with the same process as the semiconductor layer. For example, in the case where the semiconductor layer 830 is a silicon layer, the resistive layer 831 can be a silicon layer containing the same extent of impurities as the semiconductor layer 830, and furthermore, can be a silicon layer to which phosphorus, boron, or the like is added to the semiconductor layer 830. For example, as the semiconductor layer 830 and the resistive layer 831, an amorphous silicon layer, a polycrystalline silicon layer, or a single crystal silicon layer can be used. Of course, the resistive layer 831 and the semiconductor layer 830 may be fabricated with different materials and with different processes. The resistive layer 831 and the semiconductor layer 830 may have different crystallinity; for example, one of the resistive layer 831 and the semiconductor layer 830 may be formed with amorphous silicon, and the other of the resistive layer 831 and the semiconductor layer 830 may be formed with polycrystalline silicon. In the case where the resistance of the resistive layer 831 is preferred to be relatively high, it is preferable to use amorphous silicon. Note that the above-described structures of the transistor 510 and the resistor 580 are an example, and they may have different structure.

The structures described in this embodiment can be used as appropriate in combination with any of the structures described in the other embodiments and examples.

(Embodiment 2)

In this embodiment, specific structure examples of the display device of one embodiment of the present invention are described below with reference to drawings.

Figure 9:
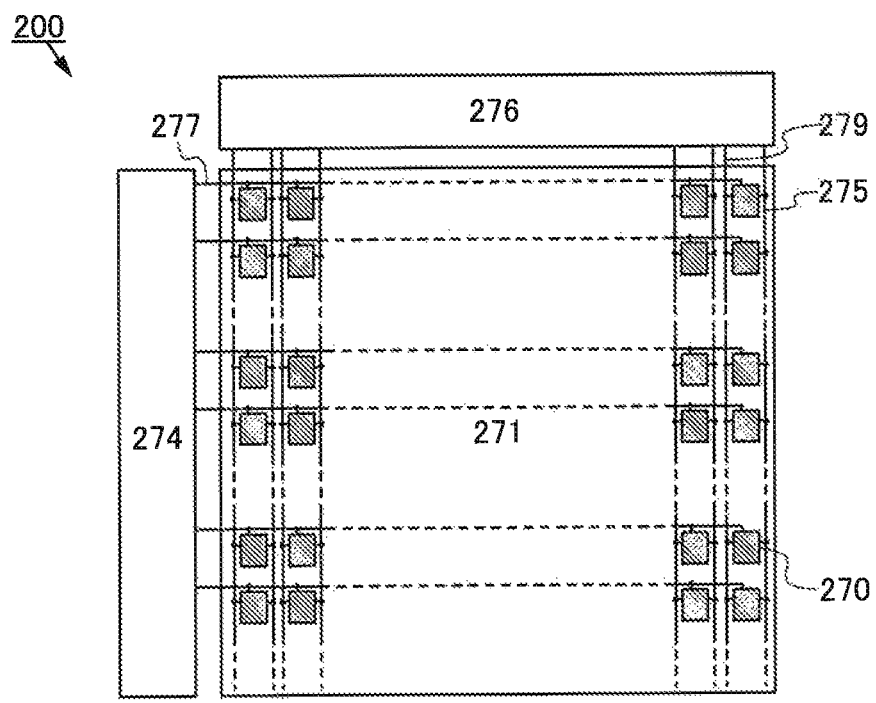
FIG. 9 A top view illustrating one embodiment of a display device and a circuit diagram illustrating one embodiment of a pixel.

The display device 200 illustrated in FIG. 9 includes a pixel portion 271, a scan line driver circuit 274, a signal line driver circuit 276, m scan lines 277 that are arranged parallel or substantially parallel to each other and whose potentials are controlled by the scan line driver circuit 274, and n signal lines 279 that are arranged parallel or substantially parallel to each other and whose potentials are controlled by the signal line driver circuit 276. Furthermore, the pixel portion 271 includes a plurality of pixels 270 arranged in a matrix. Furthermore, common lines 275 which are arranged parallel or substantially parallel to each other are provided along the signal lines 279. Furthermore, the scan line driver circuit 274 and the signal line driver circuit 276 are collectively referred to as a driver circuit portion in some cases.

Each scan line 277 is electrically connected to n pixels 270 in a row among the pixels 270 arranged in m rows and n columns in the pixel portion 271. Each signal line 279 is electrically connected to m pixels 270 in a column among the pixels 270 arranged in m rows and n columns. Variables m and n are each an integer of 1 or more. Each common line 275 is electrically connected to m pixels 270 in a row among the pixels 270 arranged in m rows and n columns.

Note that, as the above-described display device 200, the display device and the pixel circuit 90 illustrated in FIG. 1A, one embodiment of the present invention, can be used.

Further, by providing a scan line driver circuit that differs from the above description, the display device illustrated in FIG. 1B can be used.

In this embodiment, horizontal electric field modes typified by an FFS mode and an IPS mode are mainly described.

<Structure Example of Pixel>

Figure 10:
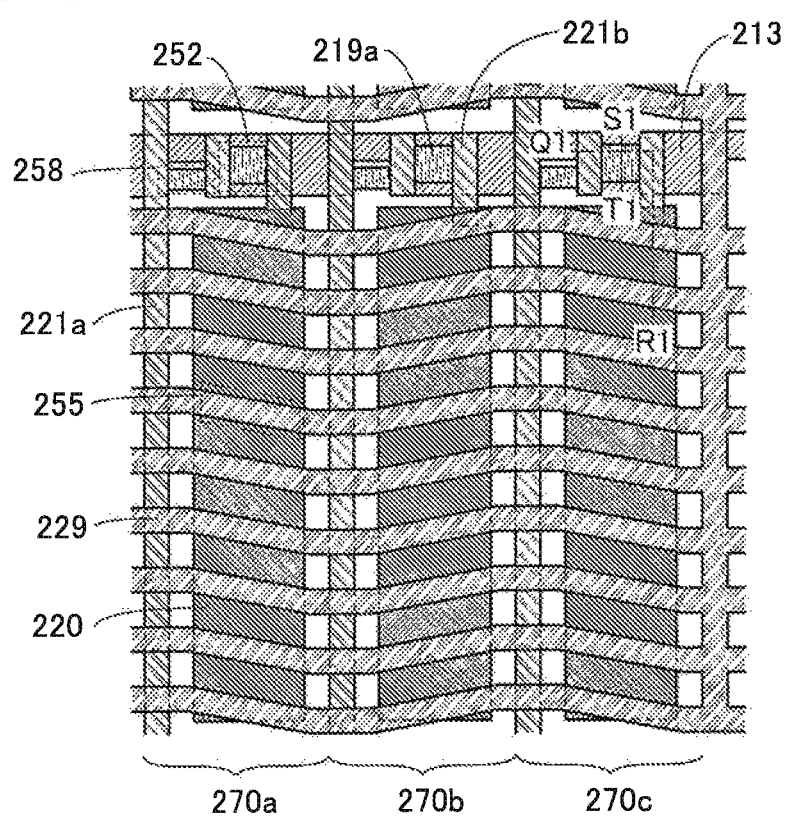
FIG. 10 A top view illustrating one embodiment of pixels.

Next, a specific structure of the pixel included in the display device 200 will be described. FIG. 10 is a top view illustrating pixels 270a, 270b, and 270c included in the display device 200 driven in the FFS mode.

Note that in the illustrated structure, a resistor 258 and a transistor 252 illustrated in the top view of pixels correspond to the resistor 580 and the transistor 510 of the pixel circuit 92 illustrated in FIG. 3, as an example.

In FIG. 10, a conductive film 213 functioning as a scan line extends substantially perpendicularly to the signal line (in the horizontal direction in the drawing). A conductive film 221a functioning as a signal line extends substantially perpendicularly to the scan line (in the vertical direction in the drawing). Note that the conductive film 213 functioning as a scan line is electrically connected to the scan line driver circuit 274, and the conductive film 221a functioning as a signal line is electrically connected to the signal line driver circuit 276 (see FIG. 9).

The transistor 252 is provided near the intersection portion of the scan line and the signal line. The transistor 252 includes the conductive film 213 functioning as a gate electrode, a gate insulating film (not illustrated in FIG. 10), a semiconductor film 219, where a channel region is formed, over the gate insulating film, and the conductive film 221a and a conductive film 221b which function as a source electrode and a drain electrode. The conductive film 213 also functions as a scan line, and a region of the conductive film 213 that overlaps with the semiconductor film 219 functions as the gate electrode of the transistor 252. The conductive film 221a also functions as a signal line, and a region of the conductive film 221a that overlaps with the semiconductor film 219 functions as the source electrode or the drain electrode of the transistor 252. In the top view of FIG. 10, an end portion of the scan line is located on the outer side of an end portion of the semiconductor film 219. Thus, the scan line also serves as a light-blocking film for blocking light from a light source such as a backlight. For this reason, the semiconductor film 219 included in the transistor is not irradiated with light, so that a change in the electrical characteristics of the transistor can be reduced.

The conductive film 221b is electrically connected to a conductive film 220 functioning as a pixel electrode. Furthermore, a common electrode 229 is provided over the conductive film 220 with an insulating film (not illustrated in FIG. 10) provided therebetween.

The common electrode 229 has stripe regions extending in a direction intersecting with the signal line. The stripe regions are connected to a region extending in a direction parallel or substantially parallel to the signal line. Therefore, in the plurality of pixels included in the display device 200, the stripe regions of the common electrode 229 have the same potential.

The capacitor 255 is formed in a region where the conductive film 220 and the common electrode 229 overlap with each other. The conductive film 220 and the common electrode 229 each have a light-transmitting property. That is, the capacitor 255 has a light-transmitting property.

Owing to the light-transmitting property of the capacitor 255, the capacitor 255 can be formed large (in a large area) in the pixel 270. Thus, a display device with a large-capacitance capacitor as well as an aperture ratio increased to typically 50% or more, preferably 60% or more can be provided. For example, in a high-resolution display device such as a liquid crystal display device, the area of a pixel is small and accordingly the area of a capacitor is also small. For this reason, the amount of charge accumulated in the capacitor is small in the high-resolution display device. However, when the capacitor 255 of this embodiment, which transmits light, is provided in each pixel, enough capacitance can be obtained in the pixel and the aperture ratio can be increased. Typically, the capacitor 255 can be favorably used for a high-resolution display device with a pixel density of 200 ppi or more, 300 ppi or more, or furthermore, 500 ppi or more.

In a liquid crystal display device, with an increase in the capacitance value of a capacitor, the alignment of liquid crystal molecules of a liquid crystal element can be kept constant for a longer period in the state where an electric field is applied. Since the period can be made longer in a display device which is displaying a still image, the number of times of rewriting image data can be reduced, leading to a reduction in power consumption. Furthermore, according to the structure of this embodiment, the aperture ratio can be improved even in a high-resolution display device, which makes it possible to use light from a light source such as a backlight efficiently, so that power consumption of the display device can be reduced.

Figure 11:
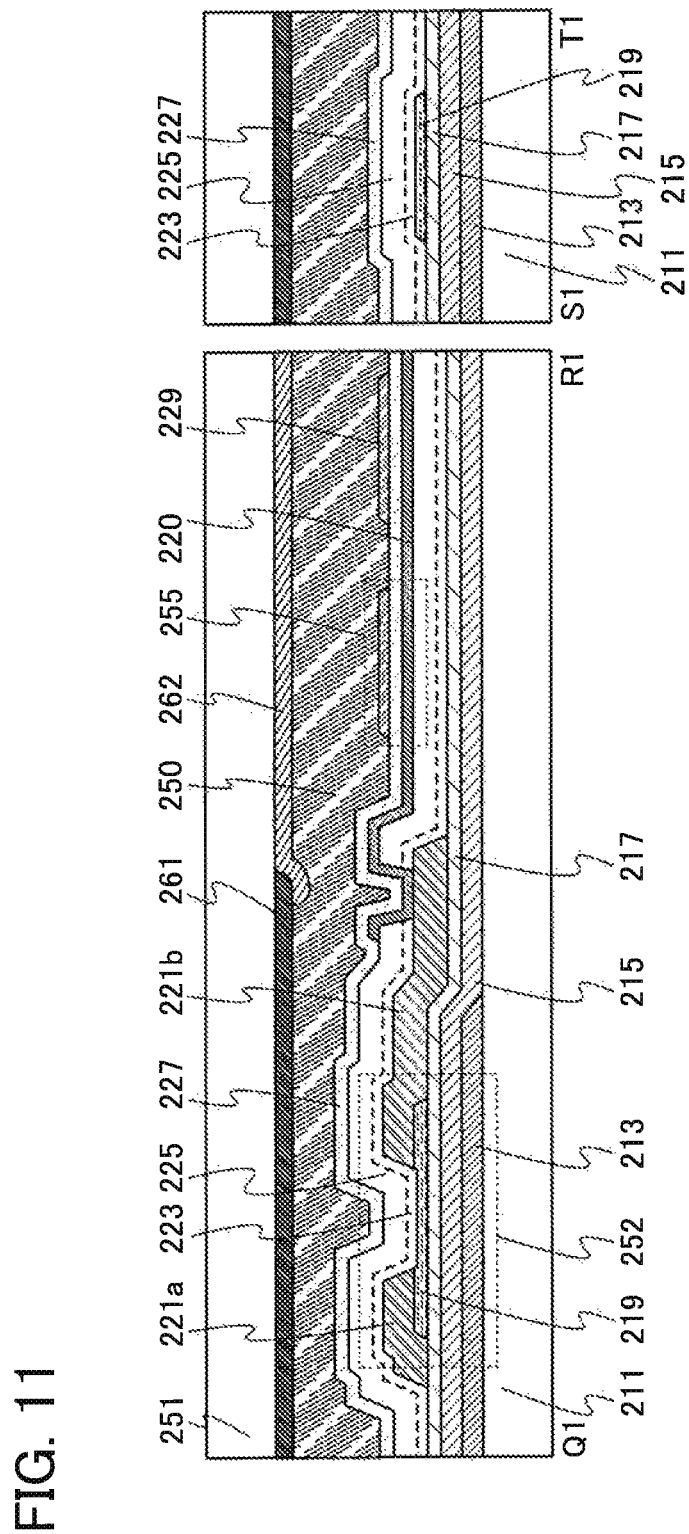
FIG. 11 A cross-sectional view illustrating one embodiment of a pixel.

FIG. 11 is a cross-sectional view taken along the dashed-dotted line Q1-R1 and the dashed-dotted line S1-T1 in FIG. 10. The transistor 252 illustrated in FIG. 11 is a channel-etched transistor. Note that the transistor 252 in the channel length direction and the capacitor 255 are illustrated in the cross-sectional view taken along dashed-dotted line Q1-R1, and the transistor 252 in the channel width direction is illustrated in the cross-sectional view taken along dashed-dotted line S1-T1.

The transistor 252 in FIG. 11 has a single-gate structure and includes the conductive film 213 functioning as a gate electrode over a substrate 211. In addition, the transistor 252 includes an insulating film 215 which is formed over the substrate 211 and the conductive film 213 functioning as a gate electrode, an insulating film 217 which is formed over the insulating film 215, the semiconductor film 219 which overlaps with the conductive film 213 functioning as a gate electrode with the insulating film 215 and the insulating film 217 positioned therebetween, and the conductive films 221a and 221b which are in contact with the semiconductor film 219 and function as a source electrode and a drain electrode. Moreover, an insulating film 223 is formed over the insulating film 217, the semiconductor film 219, and the conductive films 221a and 221b functioning as a source electrode and a drain electrode, and an insulating film 225 is formed over the insulating film 223. The conductive film 220 is formed over the insulating film 225. The conductive film 220 is electrically connected to one of the conductive films 221a and 221b functioning as a source electrode and a drain electrode (here, the conductive film 221b) through an opening in the insulating film 223 and the insulating film 225. An insulating film 227 is formed over the insulating film 225 and the conductive film 220. The common electrode 229 is formed over the insulating film 227.

FIG. 11 illustrates the case where a liquid crystal layer 250 is interposed between a substrate 251 and the substrate 211. A light-blocking film 261 functioning as a black matrix, a color film 262 functioning as a color filter, and the like are provided on a surface of the substrate 251 facing the substrate 211.

The conductive film 220 may be provided over the insulating film 225 so as to overlap with the semiconductor film 219, in which case the transistor 252 has a double-gate structure in which the conductive film 220 is used as a second gate electrode.

A region where the conductive film 220, the insulating film 227, and the common electrode 229 overlap one another functions as the capacitor 255.

Note that a cross-sectional view of one embodiment of the present invention is not limited to this. The display device can have a variety of different structures. For example, the conductive film 220 may have a slit. Alternatively, the conductive film 220 may have a comb-like shape.

Figure 12:
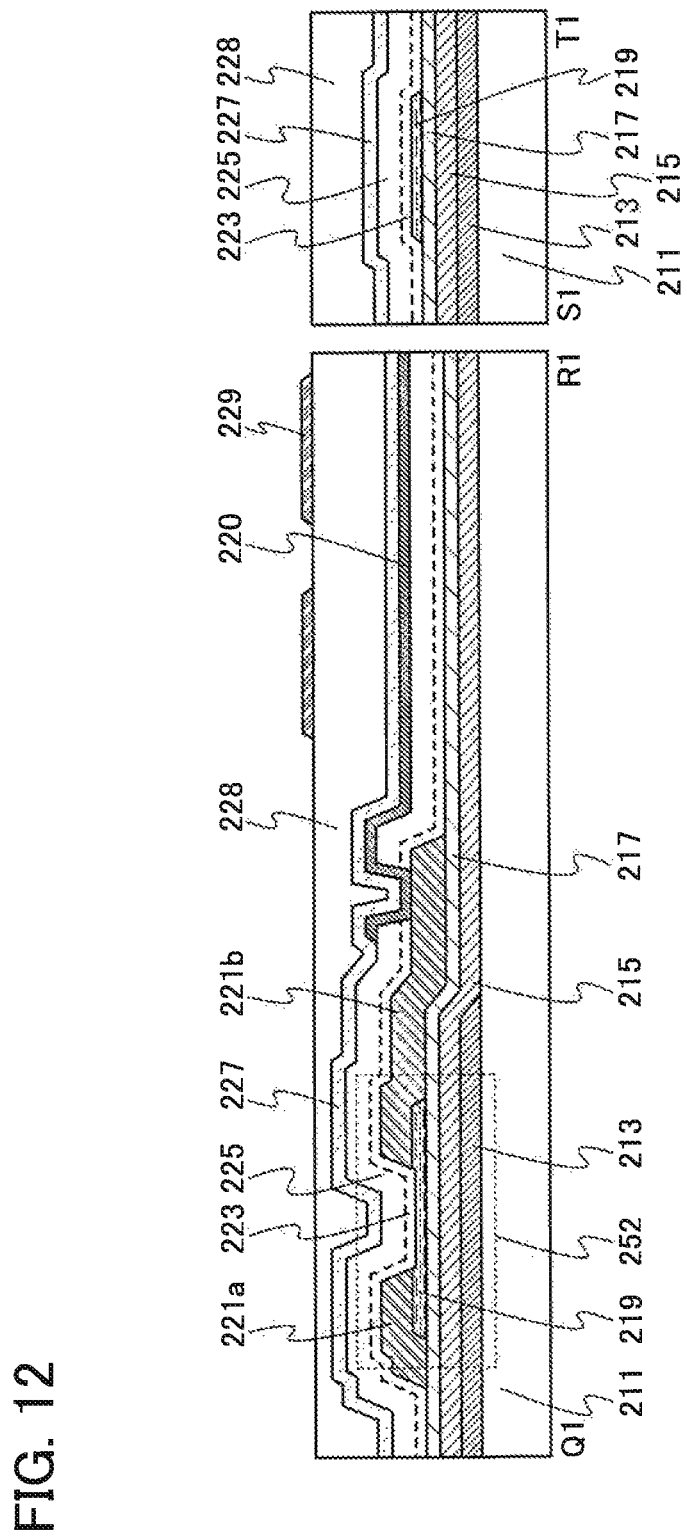
FIG. 12 A cross-sectional view illustrating one embodiment of a pixel.

Note that as illustrated in FIG. 12, the common electrode 229 may be provided over an insulating film 228 over the insulating film 227. The insulating film 228 functions as a planarization film.

Figure 13:
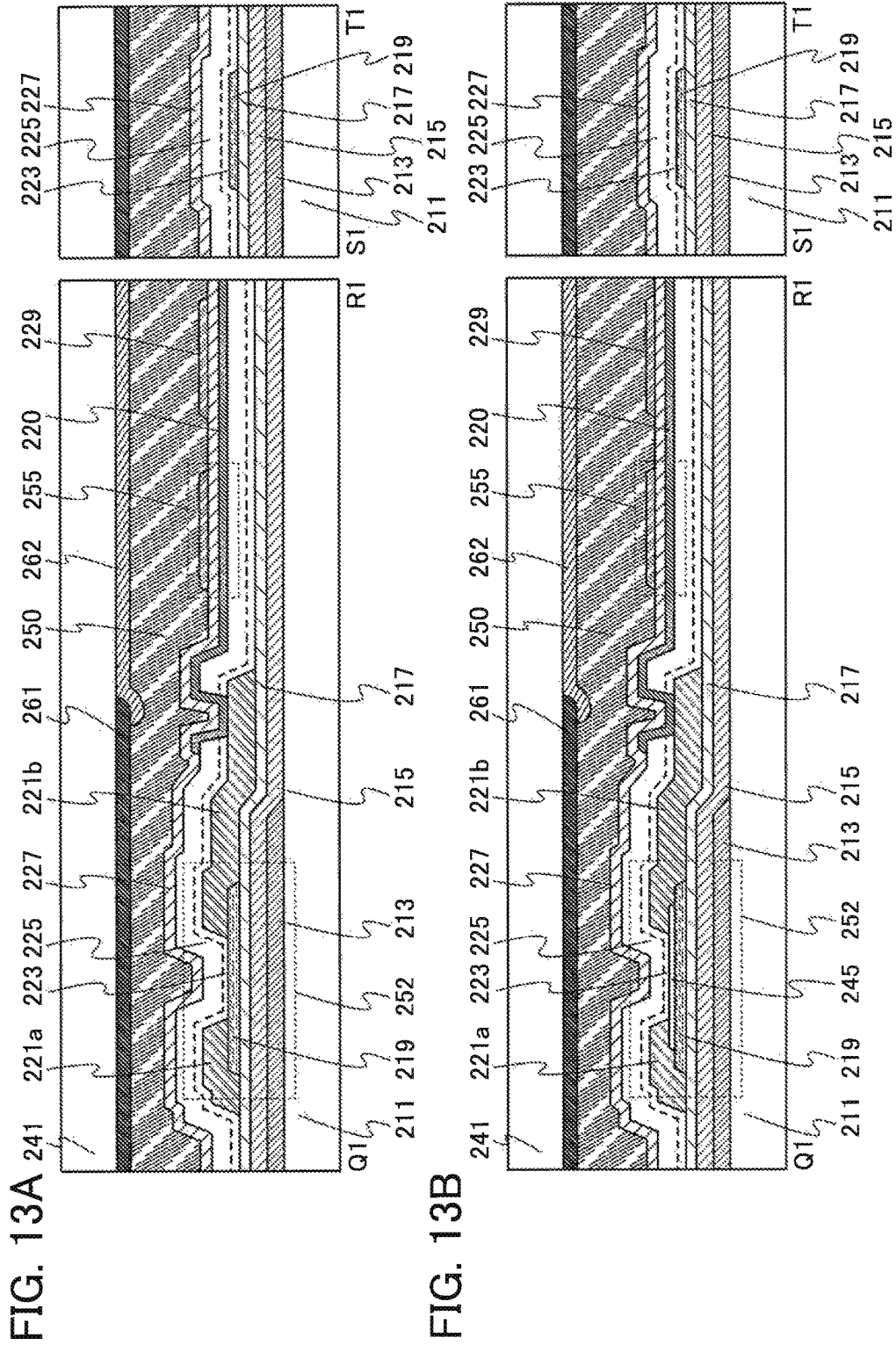
FIG. 13 Diagrams illustrating structure examples of a display device.

Furthermore, although FIG. 11 and the like illustrate the case where part of the exposed top surface of the semiconductor film 219 is thinned by etching, the part of the exposed top surface of the semiconductor film 219 is not necessarily thinned, as illustrated in FIG. 13A. As illustrated in FIG. 13B, an insulating film 245 which protects the semiconductor film 219 may also be provided.

Figure 14:
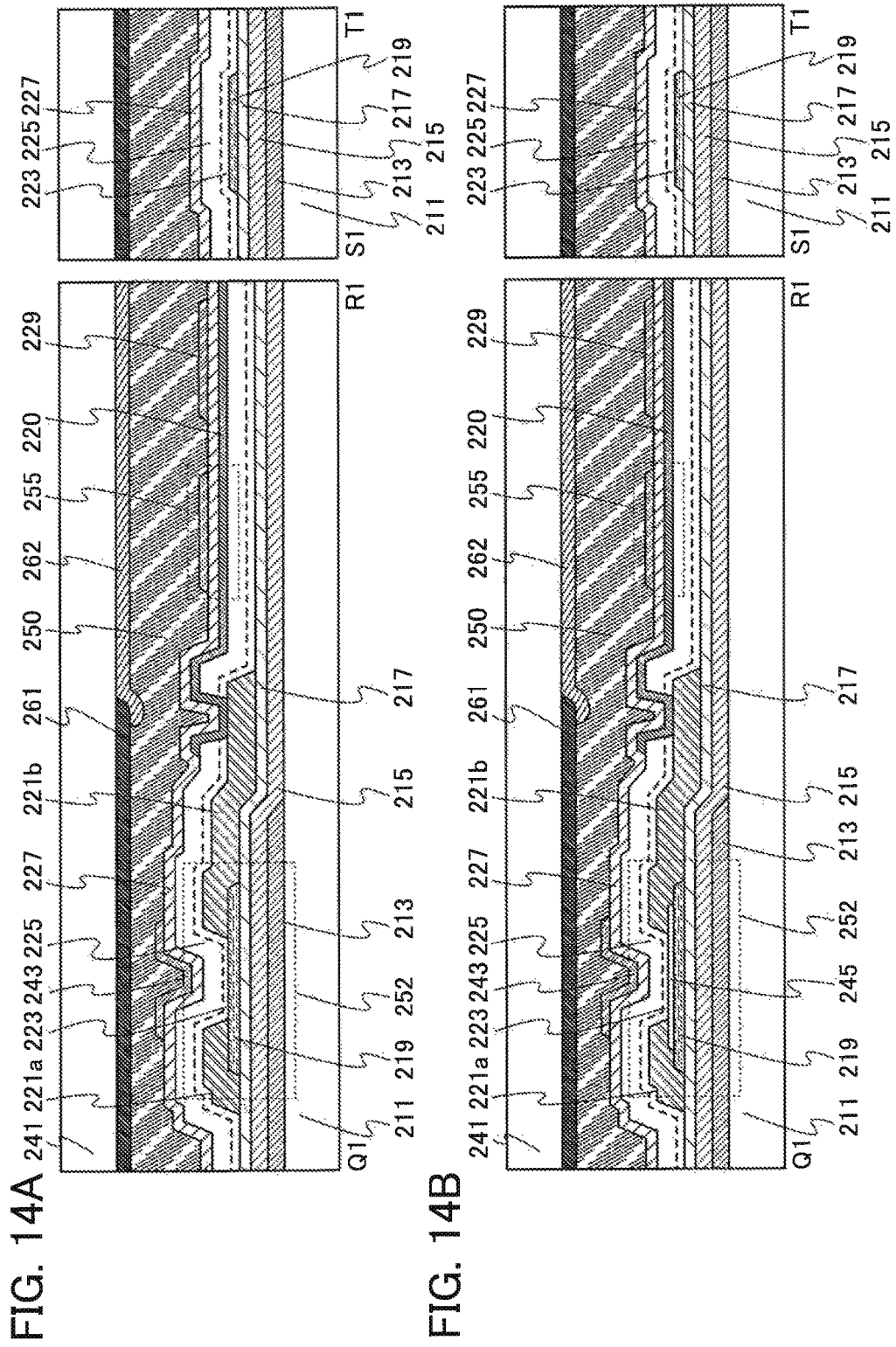
FIG. 14 Diagrams illustrating structure examples of a display device.

FIGS. 14A and 14B each illustrate an example in which a conductive film 243 functioning as a second gate electrode is provided. The second gate electrode can be used to control the threshold voltage of the transistor. Furthermore, when the same potential is supplied to the conductive film 243 and the conductive film 213, the field-effect mobility of the transistor can be increased.

<Structure Example of Element Substrate (Modification Example 1)>

Figure 15:
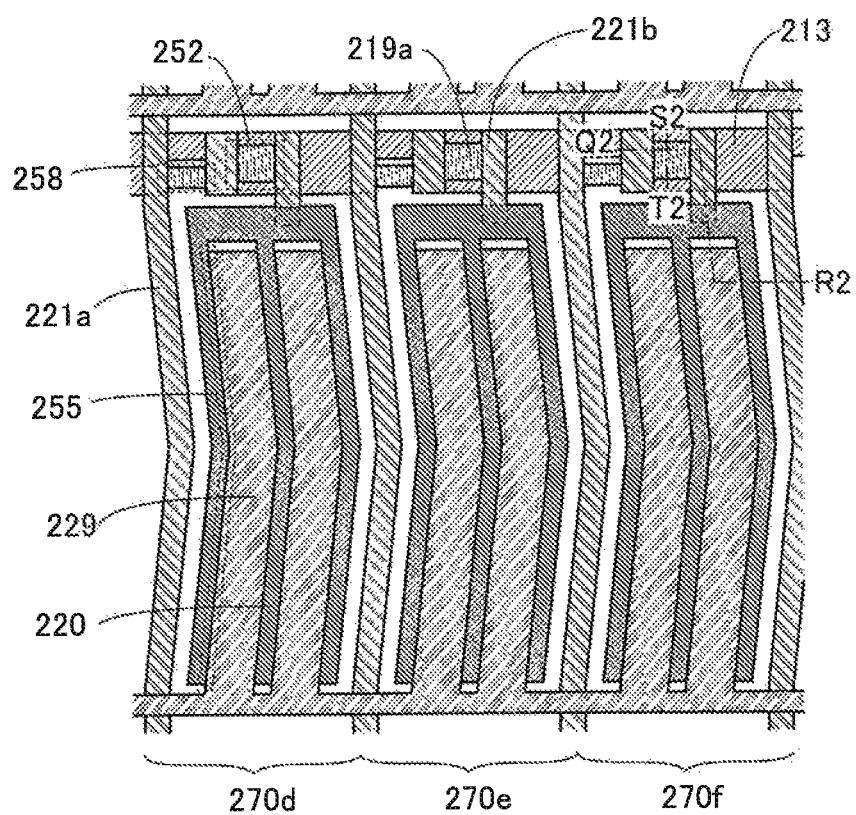
FIG. 15 A top view illustrating one embodiment of pixels.

FIG. 15 is a top view illustrating pixels 270d, 270e, and 270f which are included in the display device 200 and are different from the pixels in FIG. 10.

In FIG. 15, the conductive film 213 functioning as a scan line extends in the horizontal direction in the drawing. The conductive film 221a functioning as a signal line extends substantially perpendicularly to the scan line (in the vertical direction in the drawing) and has partly a dogleg shape (V-like shape). Note that the conductive film 213 functioning as a scan line is electrically connected to the scan line driver circuit 274, and the conductive film 221a functioning as a signal line is electrically connected to the signal line driver circuit 276 (see FIG. 9).

The transistor 252 is provided near the intersection portion of the scan line and the signal line. The transistor 252 includes the conductive film 213 functioning as a gate electrode, a gate insulating film (not illustrated in FIG. 15), a semiconductor film 219, where a channel region is formed, over the gate insulating film, and the conductive film 221a and a conductive film 221b which function as a source electrode and a drain electrode. The conductive film 213 also functions as a scan line, and a region of the conductive film 213 that overlaps with the semiconductor film 219 functions as the gate electrode of the transistor 252. The conductive film 221a also functions as a signal line, and a region of the conductive film 221a that overlaps with the semiconductor film 219 functions as the source electrode or the drain electrode of the transistor 252. In the top view of FIG. 15, an end portion of the scan line is located on the outer side of an end portion of the semiconductor film 219. Thus, the scan line also serves as a light-blocking film for blocking light from a light source such as a backlight. For this reason, the semiconductor film 219 included in the transistor is not irradiated with light, so that a change in the electrical characteristics of the transistor can be reduced.

The conductive film 221b is electrically connected to a conductive film 220 functioning as a pixel electrode. The conductive film 220 is formed in a comb-like shape. An insulating film (not illustrated in FIG. 15) is provided over the conductive film 220, and the common electrode 229 is provided over the insulating film. The common electrode 229 has a comb-like shape so as to overlap with part of the conductive film 220 and engage with the conductive film 220 in the top view. The common electrode 229 is connected to a region extending in a direction parallel or substantially parallel to the scan line. Accordingly, the comb-teeth regions of the common electrode 229 are at the same potential in the plurality of pixels included in the display device 200. Note that the conductive film 220 and the common electrode 229 have a dogleg shape (V-like shape) bent along the signal line (the conductive film 221a).

The capacitor 255 is formed in a region where the conductive film 220 and the common electrode 229 overlap with each other. The conductive film 220 and the common electrode 229 each have a light-transmitting property. That is, the capacitor 255 has a light-transmitting property.

Figure 16:
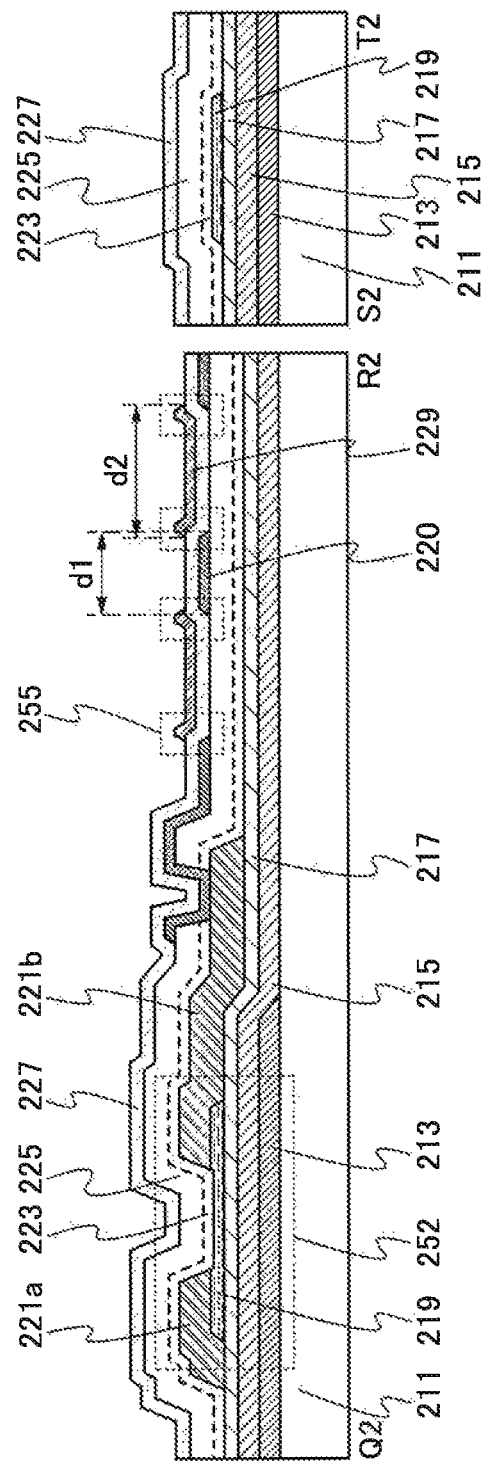
FIG. 16 A cross-sectional view illustrating one embodiment of a pixel.

FIG. 16 is a cross-sectional view taken along the dashed-dotted line Q2-R2 and the dashed-dotted line S2-T2 in FIG. 15. The transistor 252 illustrated in FIG. 16 is a channel-etched transistor. Note that the transistor 252 in the channel length direction and the capacitor 255 are illustrated in the cross-sectional view taken along dashed-dotted line Q2-R2, and the transistor 252 in the channel width direction is illustrated in the cross-sectional view taken along dashed-dotted line S2-T2.

The transistor 252 in FIG. 16 has a single-gate structure and includes the conductive film 213 which is provided over a substrate 211 and functions as a gate electrode. In addition, the transistor 252 includes an insulating film 215 which is formed over the substrate 211 and the conductive film 213 functioning as a gate electrode, an insulating film 217 which is formed over the insulating film 215, the semiconductor film 219 which overlaps with the conductive film 213 functioning as a gate electrode with the insulating film 215 and the insulating film 217 positioned therebetween, and the conductive films 221a and 221b which are in contact with the semiconductor film 219 and function as a source electrode and a drain electrode. Moreover, an insulating film 223 is formed over the insulating film 217, the semiconductor film 219, and the conductive films 221a and 221b functioning as a source electrode and a drain electrode, and an insulating film 225 is formed over the insulating film 223. The conductive film 220 is formed over the insulating film 225. The conductive film 220 is electrically connected to one of the conductive films 221a and 221b functioning as a source electrode and a drain electrode (here, the conductive film 221b) through an opening in the insulating film 223 and the insulating film 225. An insulating film 227 is formed over the insulating film 225 and the conductive film 220. The common electrode 229 is formed over the insulating film 227.

The conductive film 220 may be provided over the insulating film 225 so as to overlap with the semiconductor film 219, in which case the transistor 252 has a double-gate structure in which the conductive film 220 is used as a second gate electrode.

A region where the conductive film 220, the insulating film 227, and the common electrode 229 overlap one another functions as the capacitor 255.

In the liquid crystal display device in FIG. 15 and FIG. 16, a capacitor in a pixel is formed in regions in which end portions of the conductive film 220 and end portions of the common electrode 229 overlap with each other. With this structure, a capacitor with a suitable size, not a too large size, can be formed in a large liquid crystal display device.

Figure 17:
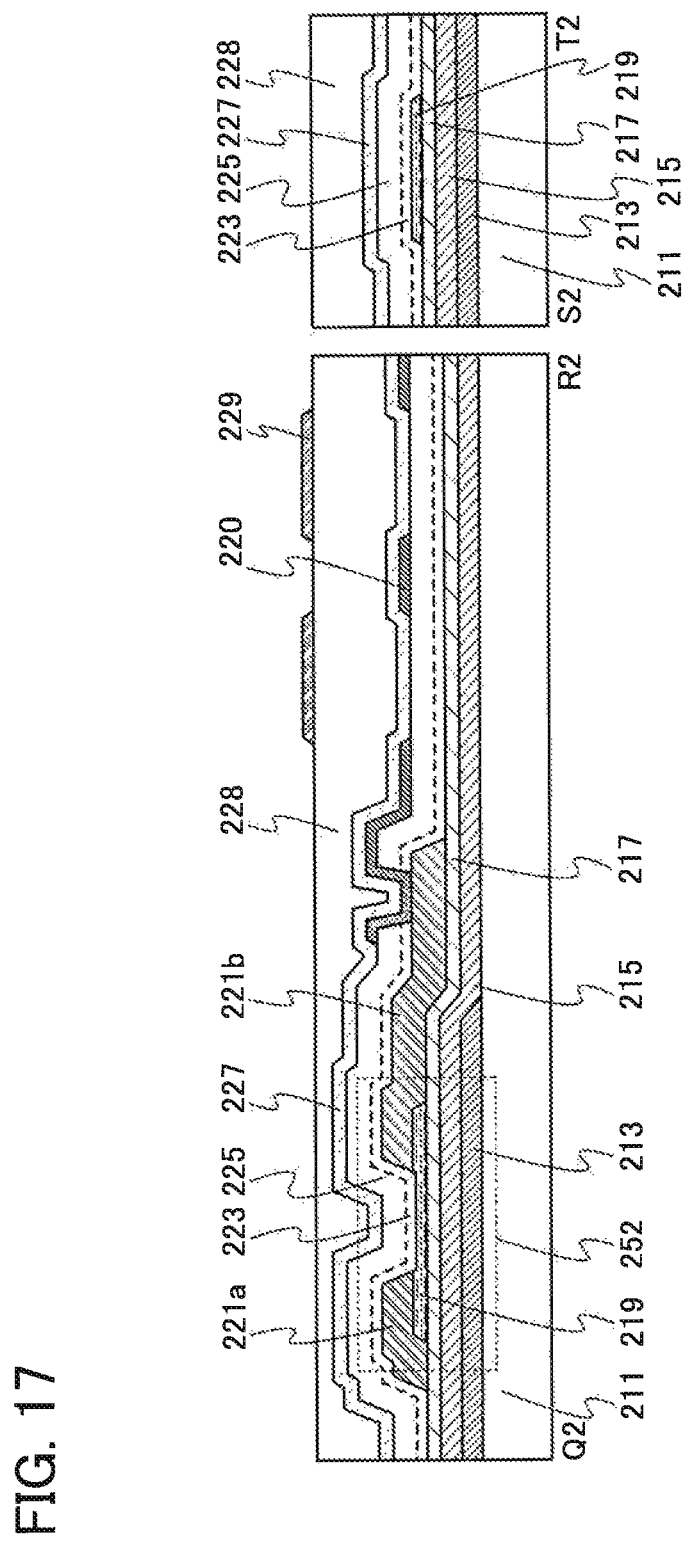
FIG. 17 A cross-sectional view illustrating one embodiment of a pixel.

As illustrated in FIG. 17, the common electrode 229 may be provided over the insulating film 228 over the insulating film 227.

Figure 18:
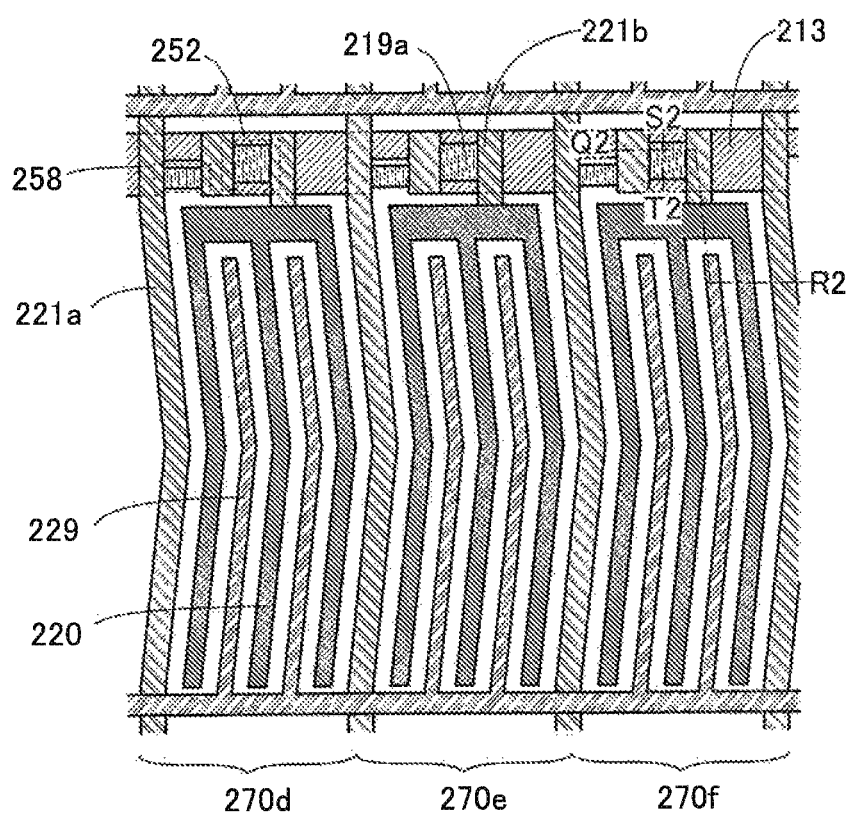
FIG. 18 A top view illustrating one embodiment of pixels.
Figure 19:
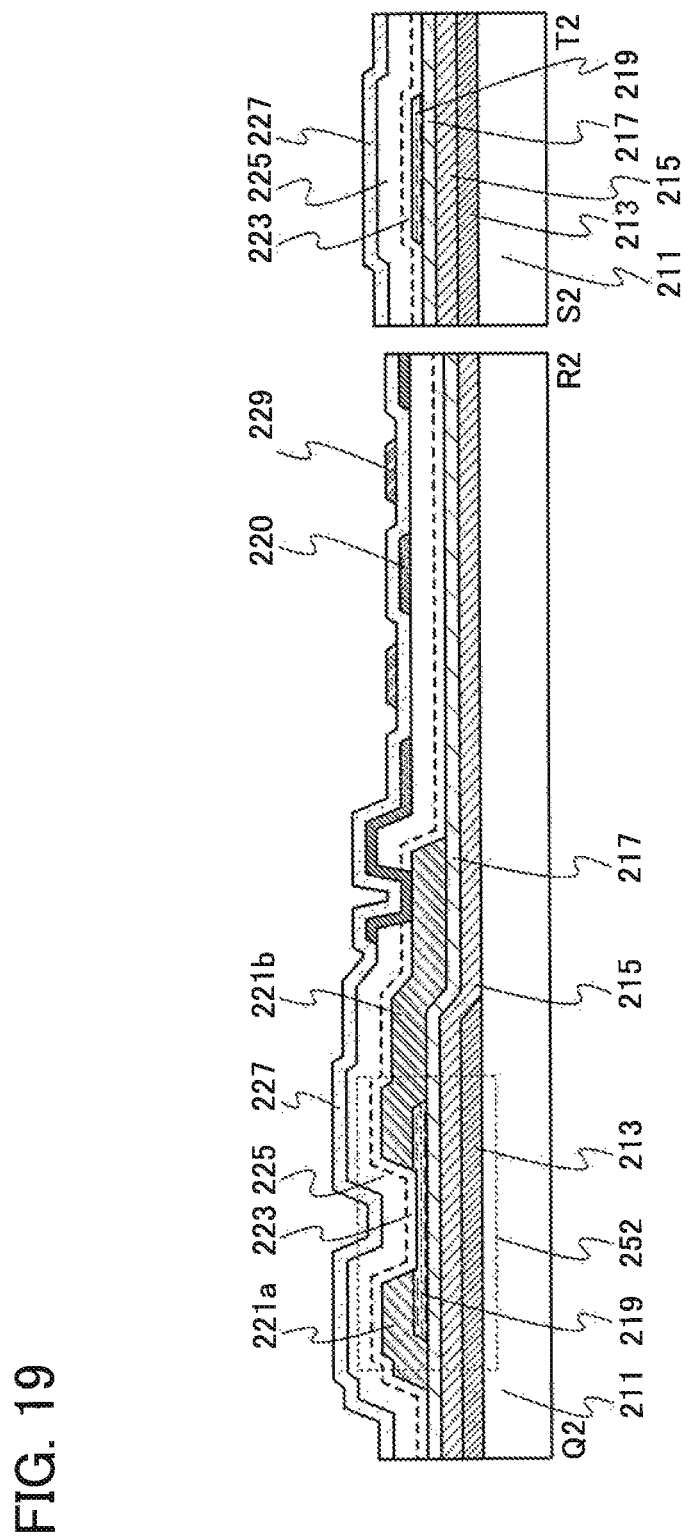
FIG. 19 A cross-sectional view illustrating one embodiment of a pixel.
Figure 20:
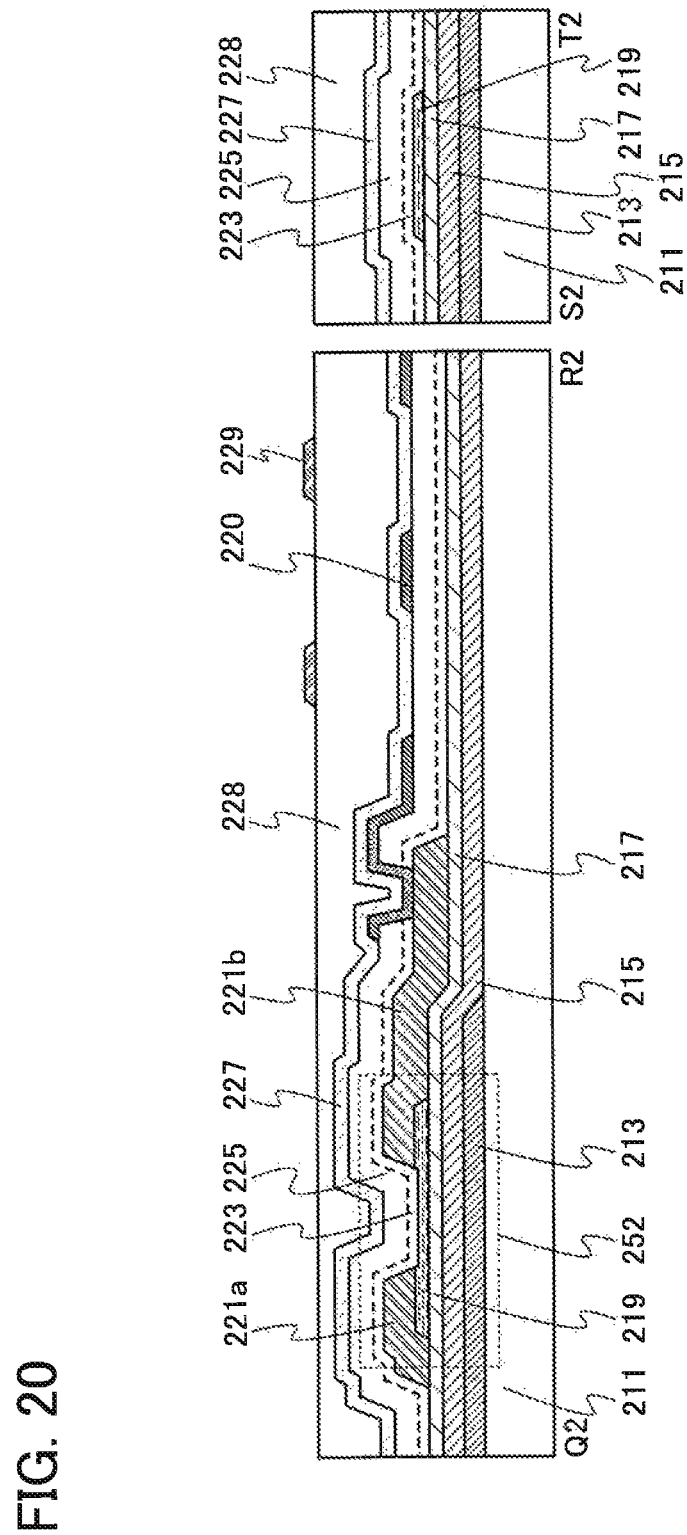
FIG. 20 A cross-sectional view illustrating one embodiment of a pixel.

A structure in which the conductive film 220 does not overlap with the common electrode 229 as illustrated in FIG. 18 and FIG. 19 may also be used. The positional relation of the conductive film 220 and the common electrode 229 can be determined as appropriate depending on the size of a capacitor in accordance with the driving method and the resolution of the display device. Note that the common electrode 229 included in the display device illustrated in FIG. 19 may be provided over the insulating film 228 functioning as a planarization film (see FIG. 20).

Figure 21:
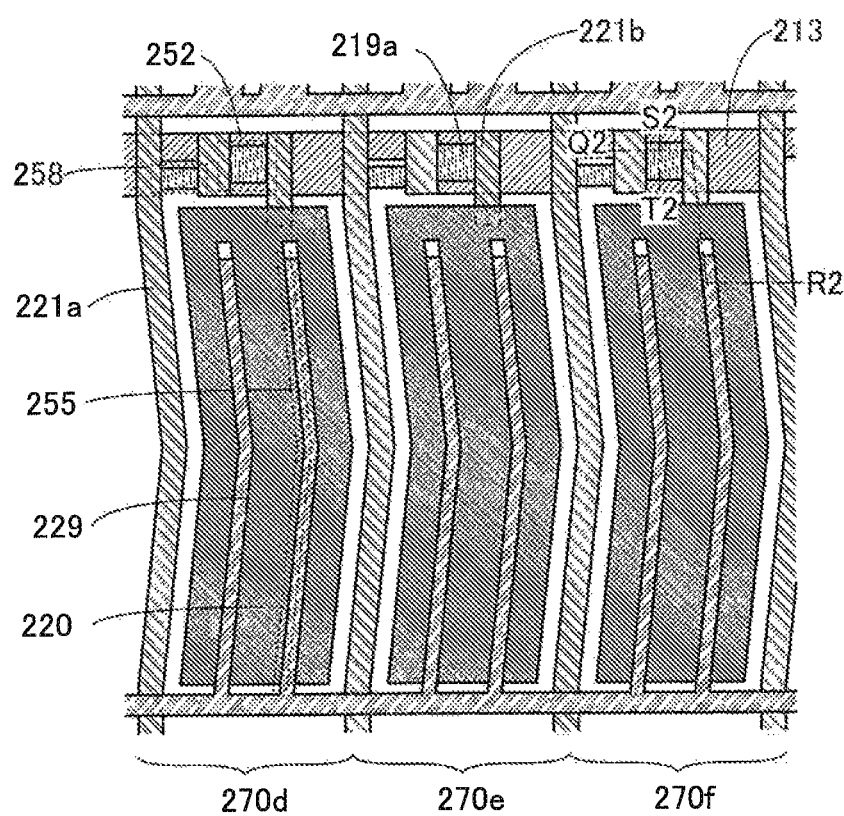
FIG. 21 A top view illustrating one embodiment of pixels.
Figure 22:
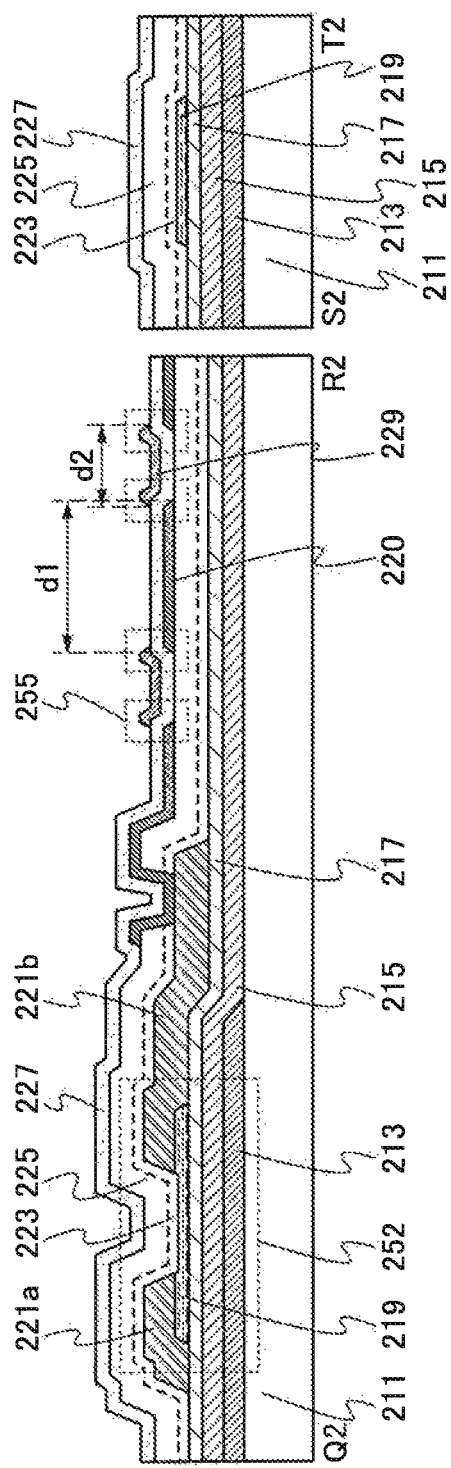
FIG. 22 A cross-sectional view illustrating one embodiment of a pixel.

In the liquid crystal display device illustrated in FIG. 15 and FIG. 16, a width (d1 in FIG. 16) of a region of the conductive film 220 extending in a direction parallel or substantially parallel to the signal line (the conductive film 221a) is smaller than a width (d2 in FIG. 16) of a region of the common electrode 229 extending in a direction parallel or substantially parallel to the signal line, but the widths are not limited to this relation. As illustrated in FIG. 21 and FIG. 22, the width d1 may be larger than the width d2. Alternatively, the width d1 may be equal to the width d2. Further alternatively, in a pixel (e.g., the pixel 270d), the widths of a plurality of regions extending in a direction parallel or substantially parallel to the signal line of the conductive film 220 and/or the common electrode 229 may be different from one another.

Figure 23:
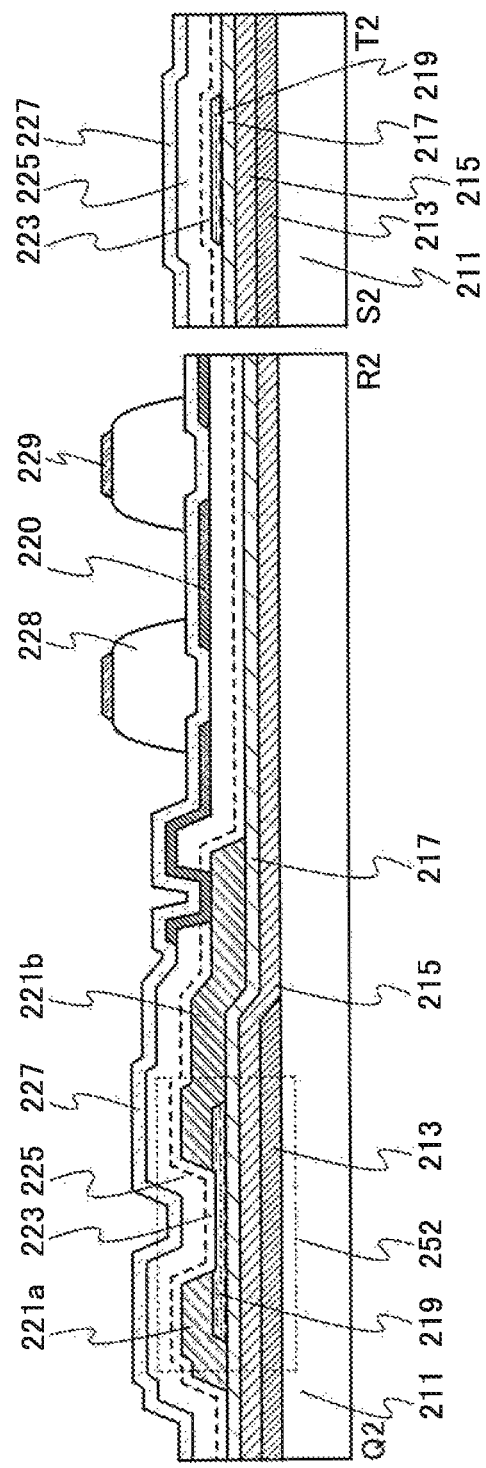
FIG. 23 A cross-sectional view illustrating one embodiment of a pixel.
Figure 24:
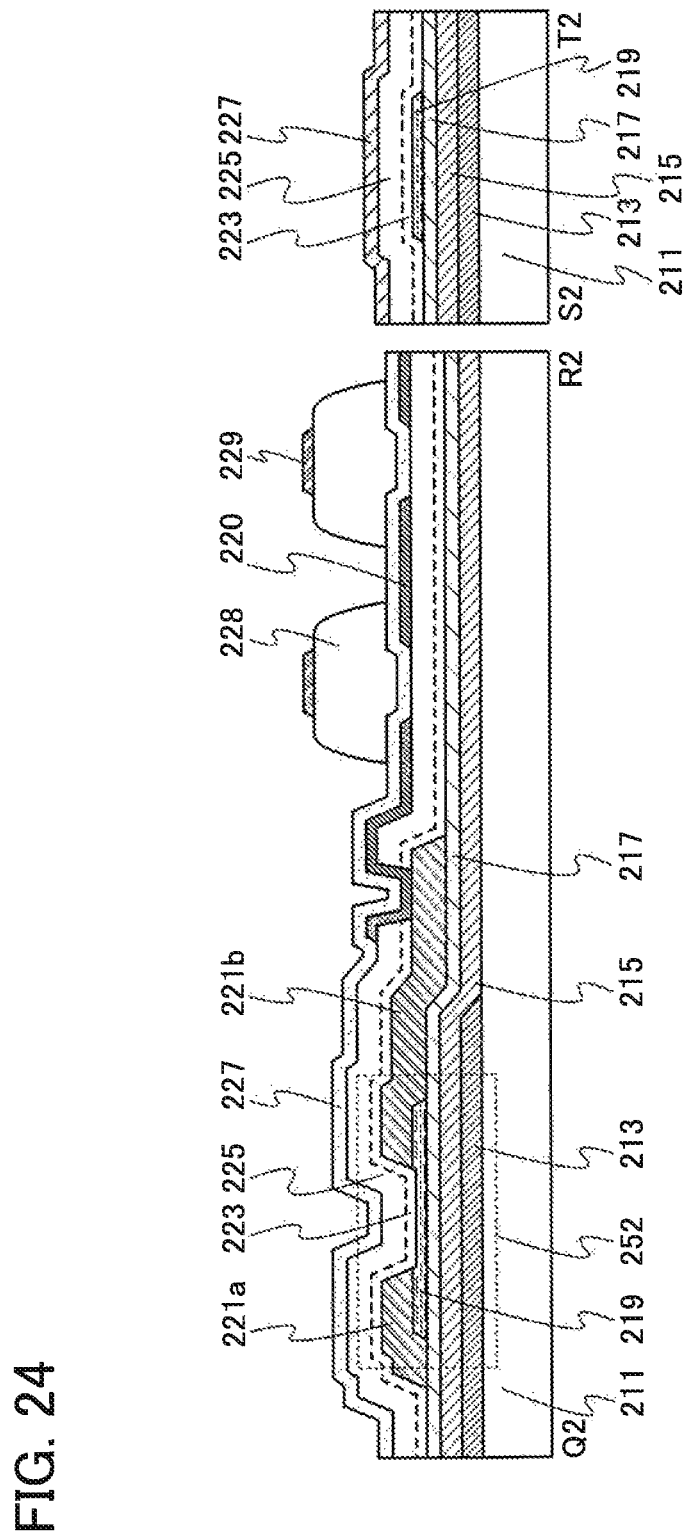
FIG. 24 A cross-sectional view illustrating one embodiment of a pixel.

A structure as illustrated in FIG. 23 may also be used in which, in the insulating film 228 over the insulating film 227, only a region overlapping with the common electrode 229 over the insulating film 228 is left and the other region is removed. In this case, the insulating film 228 can be etched using the common electrode 229 as a mask. Unevenness of the common electrode 229 over the insulating film 228 having a function of a planarization film can be reduced, and the insulating film 228 can have a gentle side surface from an end portion of the common electrode 229 to the insulating film 227. As illustrated in FIG. 24, a structure in which part of a top surface of the insulating film 228 parallel to the substrate 211 is not covered with the common electrode 229 may be employed.

Figure 25:
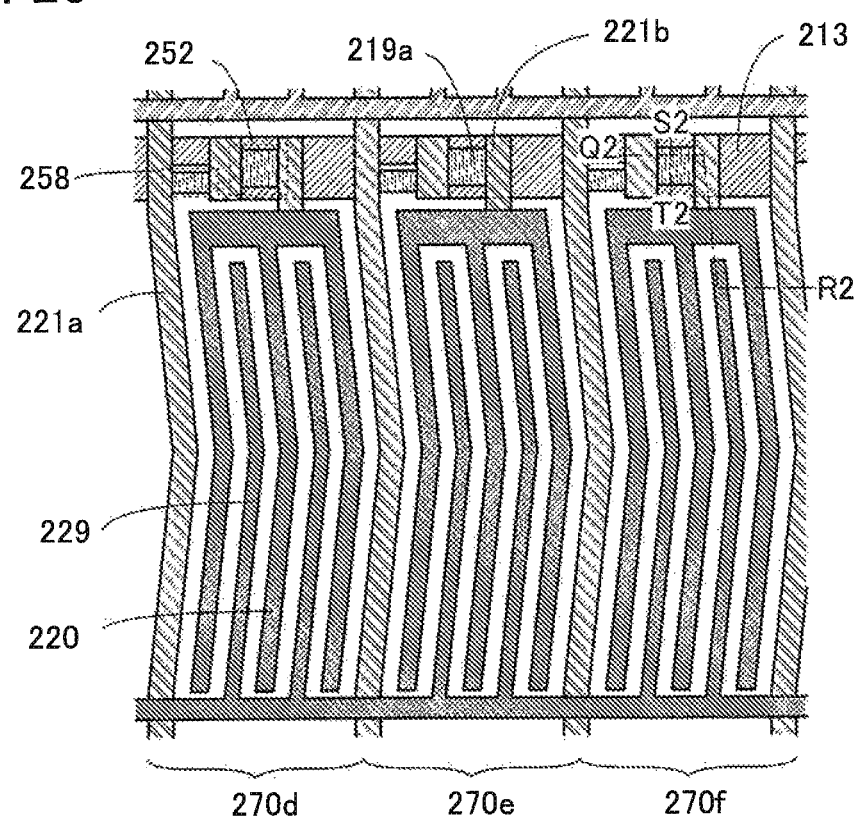
FIG. 25 A top view illustrating one embodiment of pixels.
Figure 26:
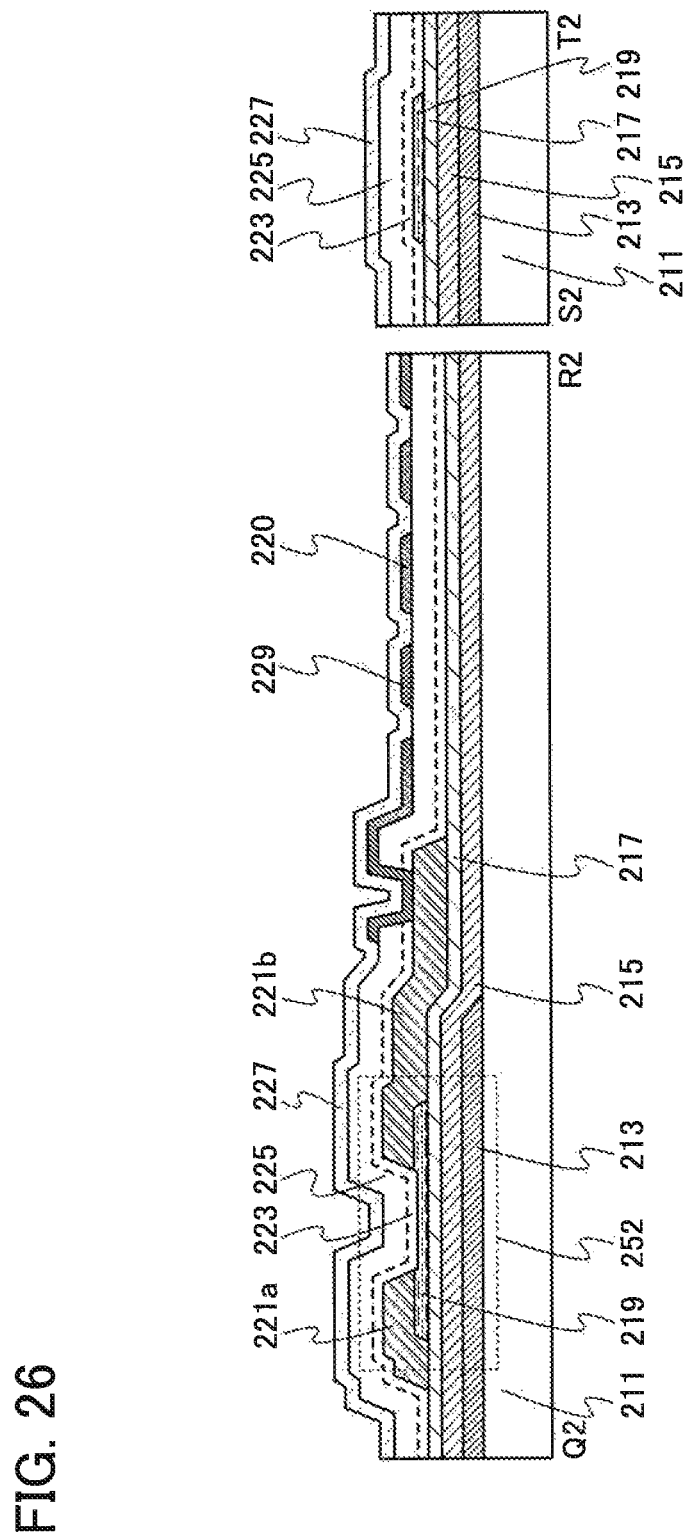
FIG. 26 A cross-sectional view illustrating one embodiment of a pixel.

As illustrated in FIG. 25 and FIG. 26, a common electrode and the conductive film 220 may be formed on the same layer, that is, on the insulating film 225. The common electrode 229 illustrated in FIG. 25 and FIG. 26 and the conductive film 220 can be formed at the same time using the same material.

Figure 27:
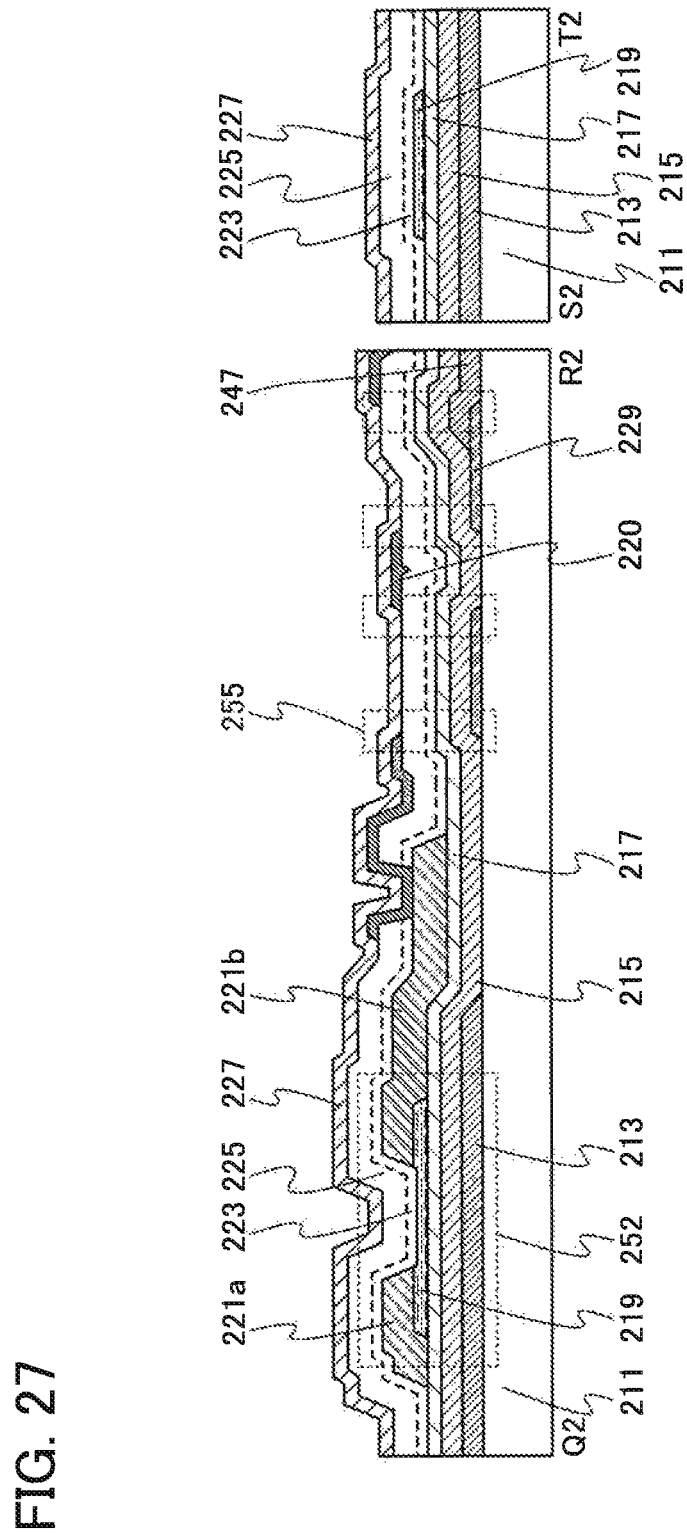
FIG. 27 A diagram illustrating a structure example of a display device.

As illustrated in FIG. 27, the common electrode 229 may be positioned between the insulating film 215 and the substrate 211. In this case, as illustrated in FIG. 27, a conductive film 247 which is formed by processing the same film as the conductive film 213 functioning as the gate electrode of the transistor 252 is preferably used as a wiring.

Note that the liquid crystal element controls transmission or non-transmission of light utilizing an optical modulation action of liquid crystal. Note that the optical modulation action of liquid crystal is controlled by an electric field applied to the liquid crystal (including a lateral electric field, a vertical electric field, and a diagonal electric field). As the liquid crystal used for the liquid crystal element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time and optical isotropy. In addition, the liquid crystal composition which includes liquid crystal exhibiting a blue phase and a chiral material makes the alignment process unneeded and has a small viewing angle dependence. Furthermore, since an alignment film does not need to be provided and thus rubbing treatment is thus not necessary, electrostatic discharge damage caused by the rubbing treatment can be prevented and defects and damage of the liquid crystal display device in the manufacturing process can be reduced.

The display device 200 including the liquid crystal element can be driven in a TN (Twisted Nematic) mode, an IPS (In-Plane-Switching) mode, an FFS (Fringe Field Switching) mode, an ASM (Axially Symmetric Aligned Micro-cell) mode, an OCB (Optical Compensated Birefringence) mode, an FLC (Ferroelectric Liquid Crystal) mode, an AFLC (Antiferroelectric Liquid Crystal) mode, or the like.

The display device 200 may be a normally black liquid crystal display device such as a transmissive liquid crystal display device utilizing a vertical alignment (VA) mode. As a vertical alignment mode, an MVA (Multi-Domain Vertical Alignment) mode, a PVA (Patterned Vertical Alignment) mode, or an ASV mode can be employed, for example.

The display device 200 can employ various modes and include various display elements. Examples of the display element include a liquid crystal element, an EL (electroluminescent) element (an EL element including organic and inorganic materials, an organic EL element, or an inorganic EL element) including an LED (e.g., a white LED, a red LED, a green LED, or a blue LED), a transistor (a transistor that emits light depending on current), an electron emitter, an electrophoretic element, a display element using MEMS (micro electro mechanical systems) such as a grating light valve (GLV), a digital micromirror device (DMD), a DMS (digital micro shutter) element, a MIRASOL (registered trademark) display, an IMOD (interferometric modulation) element, or a piezoelectric ceramic display, and an electrowetting element. In addition to the above, a display medium whose contrast, luminance, reflectivity, transmittance, or the like changes by electrical or magnetic action may be included. Alternatively, quantum dots may be used as the display element. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Note that examples of display devices having EL elements include an EL display. Examples of display devices including electron emitters are a field emission display (FED) and an SED-type flat panel display (SED: Surface-conduction Electronemitter Display). Examples of display devices including quantum dots include a quantum dot display. An example of a display device including electronic ink or electrophoretic elements is electronic paper. In the case of achieving a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. This can further reduce the power consumption.

As a display method of the display device 200, a progressive method, an interlace method, or the like can be employed. Furthermore, color elements controlled in a pixel at the time of color display are not limited to three colors: R, G, and B (R, G, and B represent red, green, and blue, respectively). For example, four pixels of the R pixel, the G pixel, the B pixel, and a W (white) pixel may be included. Alternatively, a color element may be composed of two colors among R, G, and B as in PenTile layout; the two colors may differ depending on the color elements. Alternatively, one or more colors of yellow, cyan, magenta, and the like may be added to RGB. Furthermore, each dot of the color components may have a different size of a display region. Embodiments of the disclosed invention are not limited to a display device for color display; the disclosed invention can also be applied to a display device for monochrome display.

Color films (also referred to as color filters) may be used to obtain a full-color display device in which white light (W) for a backlight (e.g., an organic EL element, an inorganic EL element, an LED, or a fluorescent lamp) is used. For example, a red (R) color film, a green (G) color film, a blue (B) color film, and a yellow (Y) color film may be combined as appropriate. With the use of the color film, higher color reproducibility can be obtained than in the case without the color film. Here, by providing a region with the color film and a region without the color film, white light in the region without the color film may be directly utilized for display. By partly providing the region without the color film, a decrease in the luminance of a bright image due to the color film can be suppressed, and approximately 20% to 30% of power consumption can be reduced in some cases. Note that in the case where full-color display is performed using a self-luminous element such as an organic EL element or an inorganic EL element, elements may emit light of their respective colors R, G, B, Y, and W. By using a self-luminous element, power consumption may be further reduced compared with the case of using the color film.

<Substrate>

There is no particular limitation on a material and the like of the substrate 211 as long as the material has heat resistance high enough to withstand at least heat treatment performed later. For example, a glass substrate, a ceramic substrate, a quartz substrate, or a sapphire substrate may be used as the substrate 211. Alternatively, a single crystal semiconductor substrate or a polycrystalline semiconductor substrate made of silicon or silicon carbide, a compound semiconductor substrate made of silicon germanium or the like, an SOI substrate, or the like may be used as the substrate 211; still alternatively, any of these substrates provided with a semiconductor element may be used as the substrate 211. In the case where a glass substrate is used as the substrate 211, a large substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large display device can be manufactured. Alternatively, a flexible substrate may be used as the substrate 211, and the transistor, the capacitor, and the like may be formed directly on the flexible substrate.

Other than the above, a transistor can be formed using various substrates as the substrate 211. The type of a substrate is not limited to a certain type. As the substrate, a plastic substrate, a metal substrate, a stainless steel substrate, a substrate including stainless steel foil, a tungsten substrate, a substrate including tungsten foil, a flexible substrate, an attachment film, paper containing a fibrous material, or a base film can be used, for example. As an example of a glass substrate, a barium borosilicate glass substrate, an aluminoborosilicate glass substrate, a soda lime glass substrate, or the like can be given. Examples of a flexible substrate include a flexible synthetic resin such as plastics typified by polyethylene terephthalate (PET), polyethylene naphthalate (PEN), and polyether sulfone (PES), and acrylic. Examples of an attachment film are attachment films formed using polypropylene, polyester, polyvinyl fluoride, polyvinyl chloride, and the like. For a base material film, polyester, polyamide, polyimide, an inorganic vapor deposition film, paper, or the like can be used, for example. In particular, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

Note that a transistor may be formed using one substrate, and then the transistor may be transferred to another substrate. Examples of a substrate to which a transistor is transferred include, in addition to the above substrates over which the transistor can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, and a rubber substrate. When such a substrate is used, a transistor with excellent properties or a transistor with low power consumption can be formed, a device with high durability, high heat resistance can be provided, or reduction in weight or thickness can be achieved.

<Semiconductor Layer>

Examples of a material that can be used for the semiconductor film 219 include silicon, germanium, and an organic semiconductor. Alternatively, an oxide semiconductor containing at least one of indium, gallium, and zinc, such as an In—Ga—Zn-based metal oxide, may be used.

There is no particular limitation on the crystallinity of a semiconductor material used for the transistor, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be inhibited.

In the case of using an oxide semiconductor as the semiconductor film 219, it is preferable to include a film represented by an In-M-Zn oxide that contains at least indium (In), zinc (Zn), and M (M is a metal such as Al, Ti, Ga, Y, Zr, La, Ce, Sn, or Hf). In order to reduce variations in electrical characteristics of the transistor including the oxide semiconductor, the oxide semiconductor preferably contains a stabilizer in addition to In and Zn.

Examples of the stabilizer, including metals that can be used as M, are gallium (Ga), tin (Sn), hafnium (Hf), aluminum (Al), and zirconium (Zr). As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be used.

As an oxide semiconductor included in the semiconductor film 219, for example, the following oxide can be used: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main components and there is no limitation on the ratio of In:Ga:Zn. Further, a metal element in addition to In, Ga, and Zn may be contained.

The semiconductor film 219 and the conductive film 220 may contain the same metal element selected from metal elements contained in the above oxides. The use of the same metal element for the semiconductor film 219 and the conductive film 220 can reduce the manufacturing cost. For example, the manufacturing cost can be reduced by using a metal oxide target with the same metal composition. Furthermore, by using metal oxide targets with the same metal composition, the same etching gas or etchant used in the processing of the oxide semiconductor film can be used. However, even when the semiconductor film 219 and the conductive film 220 contain the same metal element, they have different compositions in some cases. For example, a metal element in a film is released during the manufacturing process of the transistor and the capacitor, which might result in different metal compositions.

In the case where the semiconductor film 219 includes an In-M-Zn oxide, the proportions of In and M the sum of which is assumed to be 100 atomic %, are preferably as follows: the proportion of In is higher than 25 atomic % and the proportion of M is lower than 75 atomic %, further preferably, the proportion of In is higher than 34 atomic % and the proportion of M is lower than 66 atomic %.

The energy gap of the semiconductor film 219 is 2 eV or more, preferably 2.5 eV or more, further preferably 3 eV or more. The use of such an oxide semiconductor having a wide energy gap leads to a reduction in off-state current of a transistor.

The thickness of the semiconductor film 219 is greater than or equal to 3 nm and less than or equal to 200 nm, preferably greater than or equal to 3 nm and less than or equal to 100 nm, further preferably greater than or equal to 3 nm and less than or equal to 50 nm.

In the case where the semiconductor film 219 includes an In-M-Zn oxide (M represents Al, Ga, Y, Zr, La, Ce, or Nd), the atomic ratio of metal elements in a sputtering target used for depositing the In-M-Zn oxide preferably satisfies In≥M and Zn≥M. As the atomic ratio of metal elements of such a sputtering target, In:M:Zn=1:1:1, In:M:Zn=1:1:1.2, and In:M:Zn=3:1:2 are preferable. Note that the proportion of each metal element in the atomic ratio of the deposited semiconductor film 219 varies within a range of error of ±40% of that in the above atomic ratio of the sputtering target.

An oxide semiconductor film with low carrier density is used as the semiconductor film 219. For example, an oxide semiconductor film whose carrier density is $1\times10^{17}/cm^3$ or lower, preferably $1\times10^{15}/cm^3$ or lower, further preferably $1\times10^{13}/cm^3$ or lower, still further preferably $1\times10^{11}/cm^3$ or lower is used as the semiconductor film 219.

Note that without limitation to the compositions and materials described above, a material with an appropriate composition can be used depending on required semiconductor characteristics and electrical characteristics (e.g., field-effect mobility and threshold voltage) of a transistor. To obtain required semiconductor characteristics of a transistor, it is preferable that the carrier density, the impurity concentration, the defect density, the atomic ratio of a metal element to oxygen, the interatomic distance, the density, and the like of the semiconductor film 219 be set as appropriate.

If silicon or carbon, which are elements belonging to Group 14, is contained in the semiconductor film 219, the number of oxygen vacancies is increased in the semiconductor film 219, and the semiconductor film 219 becomes an n-type film. Thus, the concentration of silicon or carbon (measured by secondary ion mass spectrometry) in the semiconductor film 219 is lower than or equal to $2\times10^{18}$ atoms/cm$^3$, preferably lower than or equal to $2\times10^{17}$ atoms/cm$^3$.

The concentration of alkali metal or alkaline earth metal in the semiconductor film 219, which is measured by secondary ion mass spectrometry, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal in the semiconductor film 219.

If nitrogen is contained in the semiconductor film 219, electrons serving as carriers are generated and the carrier density increases, so that the semiconductor film 219 easily becomes an n-type film. Thus, a transistor including an oxide semiconductor that contains nitrogen is likely to be normally-on. For this reason, nitrogen in the oxide semiconductor film is preferably reduced as much as possible; the concentration of nitrogen which is measured by secondary ion mass spectrometry is preferably set to, for example, lower than or equal to $5\times10^{18}$ atoms/cm$^3$.

The semiconductor film 219 may have a non-single-crystal structure, for example. The non-single crystal structure includes a CAAC-OS (C Axis Aligned-Crystalline Oxide Semiconductor), which is described later, a polycrystalline structure, a microcrystalline structure, which is described later, or an amorphous structure, for example. Among the non-single crystal structure, the amorphous structure has the highest density of defect states, whereas CAAC-OS has the lowest density of defect states.

The semiconductor film 219 may have an amorphous structure, for example. An oxide semiconductor film having the amorphous structure has disordered atomic arrangement and no crystalline component, for example. Alternatively, the oxide films having an amorphous structure have, for example, an absolutely amorphous structure and no crystal part.

Note that the semiconductor film 219 may be a mixed film including two or more of the following: a region having an amorphous structure, a region having a microcrystalline structure, a region having a polycrystalline structure, a CAAC-OS region, and a region having a single crystal structure. The mixed film may include, for example, two or more of a region having an amorphous structure, a region having a microcrystalline structure, a region having a polycrystalline structure, a CAAC-OS region, and a region having a single-crystal structure. Alternatively, the mixed film may have a layered structure of two or more of a region having an amorphous structure, a region having a microcrystalline structure, a region having a polycrystalline structure, a CAAC-OS region, and a region having a single-crystal structure.

Alternatively, as the semiconductor film 219, amorphous silicon or silicon having crystallinity can be used. As silicon having crystallinity, for example, microcrystalline silicon, polycrystalline silicon, or single crystal silicon is preferably used. In particular, polycrystalline silicon can be formed at a lower temperature than single crystal silicon and has higher field effect mobility and higher reliability than amorphous silicon. When such a polycrystalline semiconductor is used for a pixel, the aperture ratio of the pixel can be improved. Furthermore, even in the case where pixels are provided with an extremely high density, a gate driver circuit and a source driver circuit can be formed over a substrate over which the pixels are formed, and the number of components of an electronic device can be reduced.

The bottom-gate transistor described in this embodiment is preferable because the number of manufacturing steps can be reduced. Furthermore, using amorphous silicon, which can be formed at a lower temperature than polycrystalline silicon, materials with low heat resistance can be used for an electrode and a substrate, regarding wirings below the semiconductor film 219, so that the range of choices of materials can be widened. For example, the above-mentioned large glass substrate can be favorably used.

<Insulating Film>

As each of the insulating films 215 and 217 functioning as a gate insulating film of the transistor 252, an insulating film including at least one of the following films formed by a plasma-CVD (CVD: Chemical Vapor Deposition) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Instead of the stacked insulating films 215 and 217, a single-layer insulating film selected from the above films may be used.

In the case where an oxide semiconductor is used for the semiconductor film 219, the insulating film 215 preferably has a function of a blocking film that inhibits permeation of oxygen. For example, in the case where excess oxygen is supplied to the insulating films 217, the insulating film 223, the insulating film 225, and/or the semiconductor film 219, the insulating film 215 can inhibit oxygen permeation.

Note that the insulating film 217 that is in contact with the semiconductor film 219 functioning as a channel region of the transistor 252 is preferably an oxide insulating film and preferably includes a region including oxygen in excess of the stoichiometric composition (an oxygen-excess region). In other words, the insulating film 217 is an insulating film capable of releasing oxygen. To provide the oxygen-excess region in the insulating film 217, the insulating film 217 may be formed in an oxygen atmosphere, for example. Alternatively, the oxygen excess region may be formed by introduction of oxygen into the deposited insulating film 217. Oxygen can be introduced by an ion implantation method, an ion doping method, a plasma immersion ion implantation method, plasma treatment, or the like.

In the case where hafnium oxide is used for the insulating films 215 and 217, the following effect is attained. Hafnium oxide has higher dielectric constant than silicon oxide and silicon oxynitride. Therefore, when hafnium oxide is used, a thickness can be made larger than when silicon oxide is used; thus, leakage current due to tunnel current can be made low. That is, it is possible to provide a transistor with a low off-state current. Moreover, hafnium oxide with a crystal structure has a higher dielectric constant than hafnium oxide with an amorphous structure. Therefore, it is preferable to use hafnium oxide with a crystal structure in order to provide a transistor with low off-state current. Examples of the crystal structure include a monoclinic crystal structure and a cubic crystal structure. Note that one embodiment of the present invention is not limited to the above examples.

Note that in this embodiment, a silicon nitride film is formed as the insulating film 215, and a silicon oxide film is formed as the insulating film 217. A silicon nitride film has a higher dielectric constant than a silicon oxide film and needs a larger thickness for capacitance equivalent to that of the silicon oxide film; thus, when the gate insulating film of the transistor 252 includes a silicon nitride film, the physical thickness of the gate insulating film can be increased. This makes it possible to inhibit a decrease in the withstand voltage of the transistor 252 and rather to increase the withstand voltage, thereby inhibiting electrostatic discharge damage of the transistor 252.

The insulating film 228 can be formed using a heat-resistant organic material such as a polyimide resin, an acrylic resin, a polyimide amide resin, a benzocyclobutene resin, a polyamide resin, or an epoxy resin, for example. For example, the insulating film 228 can be formed by forming an organic resin film over an insulating film, patterning the organic resin film into a desired region, and etching the insulating film to remove unnecessary regions.

<Gate Electrode, Source Electrode, and Drain Electrode>

The conductive film 213 functioning as a gate electrode and the conductive films 221a and 221b functioning as a source electrode or a drain electrode can be formed to have a single-layer structure or a stacked-layer structure using, as a material of the conductive film, any of metals such as aluminum, titanium, chromium, nickel, copper, yttrium, zirconium, molybdenum, silver, tantalum, and tungsten, or an alloy containing any of these metals as its main component. For example, a two-layer structure in which a titanium film is stacked over an aluminum film; a two-layer structure in which a titanium film is stacked over a tungsten film; a two-layer structure in which a copper film is stacked over a molybdenum film; a two-layer structure in which a copper film is stacked over an alloy film containing molybdenum and tungsten; a two-layer structure in which a copper film is stacked over an alloy film containing copper, magnesium, and aluminum; a three-layer structure in which titanium film or a titanium nitride film, an aluminum film or a copper film, and a titanium film or a titanium nitride film are stacked in this order; or a three-layer structure in which a molybdenum film or a molybdenum nitride film, an aluminum film or a copper film, and a molybdenum film or a molybdenum nitride film are stacked in this order can be employed. In the case where the conductive films 221a and 221b functioning as a source electrode or a drain electrode have a three-layer structure, it is preferable that each of the first and third layers be a film formed of titanium, titanium nitride, molybdenum, tungsten, an alloy containing molybdenum and tungsten, an alloy containing molybdenum and zirconium, or molybdenum nitride, and that the second layer be a film formed of a low-resistance material such as copper, aluminum, gold, silver, or an alloy containing copper and manganese. Note that it is also possible to use a light-transmitting conductive material such as indium thin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. The materials that can be used for the conductive film 213 and the conductive films 221a and 221b functioning as a source electrode or a drain electrode, the conductive film 221a, and the conductive film 221b can be deposited by a sputtering method, for example.

<Conductive Film>

A material that transmits visible light is used for a conductive film functioning as the common electrode 229, for example. Specifically, a material containing one of indium (In), zinc (Zn), and tin (Sn) is preferably used. For example, a light-transmitting conductive material such as indium oxide containing tungsten oxide, indium zinc oxide containing tungsten oxide, indium oxide containing titanium oxide, indium tin oxide containing titanium oxide, indium tin oxide (ITO: Indium Tin Oxide), indium zinc oxide, or indium tin oxide to which silicon oxide is added can be used for the conductive film. Moreover, the conductive film can be formed by a sputtering method, for example.

The conductive film 220 functions as a pixel electrode. The same material as used for the conductive film functioning as the common electrode 229 can be used for the conductive film 220.

Alternatively, when the semiconductor film 219 is an oxide semiconductor, an oxide semiconductor similar to that of the semiconductor film 219 is preferably used for the conductive film 220. In this case, it is preferable that the conductive film 220 be formed to have a lower electrical resistance than a region of the semiconductor film 219 in which a channel is formed.

<Method for Controlling Resistivity of Oxide Semiconductor>

An oxide semiconductor film that can be used as each of the semiconductor film 219 and the conductive film 220 is a semiconductor material whose resistivity can be controlled by oxygen vacancies in the film and/or the concentration of impurities such as hydrogen or water in the film. Thus, to control the resistivity of each of the oxide semiconductor films, treatment to be performed on the semiconductor film 219 and the conductive film 220 is selected from treatment for increasing oxygen vacancies and/or impurity concentration and treatment for reducing oxygen vacancies and/or impurity concentration.

Specifically, plasma treatment is performed on the oxide semiconductor film that is used as the conductive film 220 functioning as an electrode of the capacitor 255 to increase oxygen vacancies and/or impurities such as hydrogen or water in the oxide semiconductor film; thus, the oxide semiconductor film can have a high carrier density and a low resistivity. Furthermore, an insulating film containing hydrogen is formed, for example, as the insulating film 227 in contact with the oxide semiconductor film so that hydrogen may be diffused from the insulating film containing hydrogen into the oxide semiconductor film; thus, the oxide semiconductor film can have a high carrier density and a low resistivity.

The semiconductor film 219 functioning as a channel region of the transistor 252 is not in contact with the insulating films 215 and 227 containing hydrogen by providing the insulating films 217, 223, and 225. With the use of an insulating film containing oxygen, that is, an insulating film capable of releasing oxygen for at least one of the insulating films 217, 223, and 225, oxygen can be supplied to the semiconductor film 219. The semiconductor film 219 to which oxygen is supplied has a high resistivity because oxygen vacancies in the film or at the interface are filled. Note that as the insulating film capable of releasing oxygen, a silicon oxide film or a silicon oxynitride film can be used, for example.

In order to obtain the oxide semiconductor film with a low resistivity, an ion implantation method, an ion doping method, a plasma immersion ion implantation method, or the like can be employed to inject hydrogen, boron, phosphorus, or nitrogen into the oxide semiconductor film.

In order to obtain the oxide semiconductor film with a low resistivity, plasma treatment may be performed on the oxide semiconductor film. For the plasma treatment, a gas containing at least one of a rare gas (He, Ne, Ar, Kr, or Xe), hydrogen, and nitrogen is typically used. Specifically, plasma treatment in an Ar atmosphere, plasma treatment in a mixed gas atmosphere of Ar and hydrogen, plasma treatment in an ammonia atmosphere, plasma treatment in a mixed gas atmosphere of Ar and ammonia, plasma treatment in a nitrogen atmosphere, or the like can be employed.

The above-described plasma treatment causes the oxide semiconductor film to form an oxygen vacancy in a lattice from which oxygen is released (or in a portion from which oxygen is released). This oxygen vacancy can cause carrier generation. When hydrogen is supplied from an insulating film that is in the vicinity of the oxide semiconductor film, or more specifically, from an insulating film that is in contact with the lower surface or the upper surface of the oxide semiconductor film, hydrogen is bonded to the oxygen vacancy and an electron serving as a carrier might be generated in some cases.

Meanwhile, the oxide semiconductor film in which oxygen vacancies are compensated with oxygen and in which the hydrogen concentration is reduced can be referred to as a highly purified intrinsic or substantially highly purified intrinsic oxide semiconductor film. The term "substantially intrinsic" refers to the state in which an oxide semiconductor film has a carrier density lower than $8 \times 10^{11}/cm^3$, preferably lower than $1 \times 10^{11}/cm^3$, further preferably lower than $1 \times 10^{10}/cm^3$. A highly purified intrinsic or substantially highly purified intrinsic oxide semiconductor film has few carrier generation sources, and thus can have a low carrier density. The highly purified intrinsic or substantially highly purified intrinsic oxide semiconductor film has a low density of defect states and can accordingly have a low density of trap states.

Further, the highly purified intrinsic or substantially highly purified intrinsic oxide semiconductor film has an extremely low off-state current; even when an element has a channel width of $1 \times 10^6$ μm and a channel length (L) of 10 μm, the off-state current can be less than or equal to the measurement limit of a semiconductor parameter analyzer, i.e., less than or equal to $1 \times 10^{-13}$ A, at a voltage between a source electrode and a drain electrode (drain voltage) of from 1 V to 10 V. Accordingly, the transistor 252 in which a channel region is formed using the semiconductor film 219a that is a highly purified intrinsic or substantially highly purified intrinsic oxide semiconductor film can have a small change in electrical characteristics and high reliability.

For example, an insulating film containing hydrogen, that is, an insulating film capable of releasing hydrogen, typically, a silicon nitride film, is used as the insulating film 227, whereby hydrogen can be supplied to the conductive film 220. The hydrogen concentration of the insulating film capable of releasing hydrogen is preferably higher than or equal to $1 \times 10^{22}$ atoms/cm$^3$. Such an insulating film is formed in contact with the conductive film 220, whereby hydrogen can be effectively contained in the conductive film 220. Thus, the resistivity of the oxide semiconductor film can be controlled by changing the structure of insulating films in contact with the semiconductor film 219 and the conductive film 220. Note that a material of the insulating film 215 may be similar to the material of the insulating film 227. When silicon nitride is used for the insulating film 215, oxygen released from the insulating film 217 can be prevented from being supplied to the conductive film 213 functioning as a gate electrode, so that oxidation of the conductive film 213 can be inhibited.

Hydrogen contained in the oxide semiconductor film reacts with oxygen bonded to a metal atom to form water, and also causes oxygen vacancies in a lattice from which oxygen is released (or a portion from which oxygen is released). Entry of hydrogen into the oxygen vacancy generates an electron serving as a carrier in some cases. Furthermore, in some cases, bonding of part of hydrogen to oxygen bonded to a metal atom causes generation of an electron serving as a carrier. Accordingly, the conductive film 220 provided in contact with the insulating film containing hydrogen is an oxide semiconductor film that has a higher carrier density than the semiconductor film 219.

Hydrogen in the semiconductor film 219 of the transistor 252 in which a channel region is formed is preferably reduced as much as possible. Specifically, in the semiconductor film 219, the concentration of hydrogen, which is measured by secondary ion mass spectrometry (SIMS: Secondary Ion Mass Spectrometry), is lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, more preferably lower than $5 \times 10^{18}$ atoms/cm$^3$, more preferably lower than or equal to $1 \times 10^{18}$ atoms/cm$^3$, more preferably lower than or equal to $5 \times 10^{17}$ atoms/cm$^3$, more preferably lower than or equal to $1 \times 10^{16}$ atoms/cm$^3$.

Meanwhile, the conductive film 220 functioning as an electrode of the capacitor 255 is an oxide semiconductor film that has a higher hydrogen concentration and/or a larger number of oxygen vacancies, and a lower resistivity than the semiconductor film 219. The concentration of hydrogen contained in the conductive film 220 is higher than or equal to $8 \times 10^{19}$ atoms/cm$^3$, preferably higher than or equal to $1 \times 10^{20}$ atoms/cm$^3$, further preferably higher than or equal to $5 \times 10^{20}$ atoms/cm$^3$. The concentration of hydrogen contained in the conductive film 220 is twice or more, preferably 10 times or more that in the semiconductor film 219. In addition, the resistivity of the conductive film 220 is preferably greater than or equal to $1 \times 10^{-8}$ times and less than $1 \times 10^{-1}$ times the resistivity of the semiconductor film 219; the resistivity of the conductive film 220 is typically higher than or equal to $1 \times 10^{-3}$ Ωcm and lower than $1 \times 10^{4}$ Ωcm, preferably higher than or equal to $1 \times 10^{-3}$ Ωcm and lower than $1 \times 10^{-1}$ Ωcm.

<Protective Insulating Film>

As each of the insulating films 223, 225 and 227 functioning as a protective insulating film of the transistor 252, an insulating film including at least one of the following films formed by a plasma-CVD method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

When the semiconductor film 219 functioning as a channel region of the transistor 252 is an oxide semiconductor, it is preferable to use an insulating film that is an oxide insulating film and capable of releasing oxygen as the insulating film 223. In other words, the insulating film capable of releasing oxygen is an insulating film which includes a region containing oxygen in excess of that in the stoichiometric composition (oxygen-excess region). To provide the oxygen-excess region in the insulating film 223, the insulating film 223 may be formed in an oxygen atmosphere, for example. Alternatively, the oxygen excess region may be formed by introduction of oxygen into the deposited insulating film 223. Oxygen can be introduced by an ion implantation method, an ion doping method, a plasma immersion ion implantation method, plasma treatment, or the like.

The use of the insulating film capable of releasing oxygen as the insulating film 223 enables oxygen to move to the semiconductor film 219 functioning as a channel region of the transistor 252, so that the number of oxygen vacancies in the semiconductor film 219 can be reduced. For example, the number of oxygen vacancies in the semiconductor film 219 can be reduced by using an insulating film with the number of oxygen molecules released from the insulating film at a film surface temperature higher than or equal to 100° C. and lower than or equal to 700° C. or higher than or equal to 100° C. and lower than or equal to 500° C. being greater than or equal to $1.0 \times 10^{18}$ molecules/cm$^3$ when measured by thermal desorption spectroscopy (hereinafter referred to as TDS).

In addition, the number of defects in the insulating film 223 is preferably small; typically, in ESR measurement, the spin density of a signal that appears at g=2.001 due to a dangling bond of silicon is preferably lower than or equal to $3 \times 10^{17}$ spins/cm$^3$. This is because a high density of defects in the insulating film 223 causes oxygen to be bonded to the defects and decreases the amount of oxygen that permeates the insulating film 223. Furthermore, the number of defects at the interface between the insulating film 223 and the semiconductor film 219 is preferably small; typically, in ESR measurement, the spin density of a signal that appears at g=1.89 or more and 1.96 or less due to a defect in the semiconductor film 219 is preferably lower than or equal to $1 \times 10^{17}$ spins/cm$^3$, further preferably lower than or equal to the lower limit of detection.

Note that all oxygen having entered the insulating film 223 from the outside moves to the outside of the insulating film 223 in some cases. Alternatively, part of oxygen having entered the insulating film 223 from the outside remains in the insulating film 223 in some cases. In some cases, movement of oxygen occurs in the insulating film 223 in such a manner that oxygen enters the insulating film 223 from the outside and oxygen contained in the insulating film 223 moves to the outside of the insulating film 223. When an oxide insulating film which is permeable to oxygen is formed as the insulating film 223, oxygen released from the insulating film 225 over the insulating film 223 can be moved to the semiconductor film 219 through the insulating film 223.

The insulating film 223 can be formed using an oxide insulating film having a low density of states of nitrogen oxide. Note that the density of states of nitrogen oxide can be formed between the energy of the valence band maximum ($E_{v\_os}$) and the energy of the conductor minimum ($E_{c\_os}$) of the oxide semiconductor film. A silicon oxynitride film that releases less nitrogen oxide, an aluminum oxynitride film that releases less nitrogen oxide, or the like can be used as the oxide insulating film in which the density of states of nitrogen oxide is low between $E_{v\_os}$ and $E_{c\_os}$.

Note that a silicon oxynitride film that releases less nitrogen oxide is a film which releases more ammonia than the nitrogen oxide in thermal desorption spectroscopy analysis; the number of ammonia molecules released from the silicon oxynitride film is typically greater than or equal to $1 \times 10^{18}/cm^3$ and less than or equal to $5 \times 10^{19}/cm^3$. Note that the amount of released ammonia is the amount of ammonia released by heat treatment with which the surface temperature of the film becomes higher than or equal to 50° C. and lower than or equal to 650° C., preferably higher than or equal to 50° C. and lower than or equal to 550° C.

Nitrogen oxide ($NO_x$; x is greater than or equal to 0 and less than or equal to 2, preferably greater than or equal to 1 and less than or equal to 2), typically $NO_2$ or NO, forms levels in the insulating film 223, for example. The state is positioned in the energy gap of the semiconductor film 219. Therefore, when nitrogen oxide is diffused into the interface between the insulating film 223 and the semiconductor film 219, an electron is trapped by the state on the insulating film 223 side in some cases. As a result, the trapped electron remains in the vicinity of the interface between the insulating film 223 and the semiconductor film 219; thus, the threshold voltage of the transistor shifts in the positive direction.

Nitrogen oxide reacts with ammonia and oxygen in heat treatment. Since nitrogen oxide contained in the insulating film 223 reacts with ammonia contained in the insulating film 225 in heat treatment, the amount of nitrogen oxide contained in the insulating film 223 is reduced. Therefore, an electron is hardly trapped at the interface between the insulating film 223 and the semiconductor film 219.

By using the oxide insulating film having a low density of states of nitrogen oxide between $E_{v\_os}$ and $E_{c\_os}$ for the insulating film 223, the shift in the threshold voltage of the transistor can be reduced, which leads to a smaller change in the electrical characteristics of the transistor.

Note that in an ESR spectrum at 100 K or lower of the insulating film 223 subjected to heat treatment in a manufacturing process of the transistor, typically heat treatment at a temperature lower than 400° C. or lower than 375° C. (preferably higher than or equal to 340° C. and lower than or equal to 360° C.), a first signal that appears at a g-factor greater than or equal to 2.037 and less than or equal to 2.039, a second signal that appears at a g-factor greater than or equal to 2.001 and less than or equal to 2.003, and a third signal that appears at a g-factor greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor greater than or equal to 2.037 and less than or equal to 2.039, the second signal that appears at a g-factor greater than or equal to 2.001 and less than or equal to 2.003, and the third signal that appears at a g-factor greater than or equal to 1.964 and less than or equal to 1.966 is lower than $1 \times 10^{18}$ spins/cm$^3$, typically higher than or equal to $1 \times 10^{17}$ spins/cm$^3$ and lower than $1 \times 10^{18}$ spins/cm$^3$.

Note that in the spectrum obtained by ESR measurement at 100 K or lower, a first signal seen at a g value of greater than or equal to 2.037 and less than or equal to 2.039, a second signal seen at a g value of greater than or equal to 2.001 and less than or equal to 2.003, and a third signal seen at a g value of greater than or equal to 1.964 and less than or equal to 1.966 are assigned to a nitrogen oxide ($NO_x$, x is greater than or equal to 0 and less than or equal to 2, preferably greater than or equal to 1 and less than or equal to 2). Typical examples of the nitrogen oxide include nitrogen monoxide and nitrogen dioxide. Accordingly, the smaller the sum of the spin densities of the first signal that appears at a g-factor greater than or equal to 2.037 and less than or equal to 2.039, the second signal that appears at a g-factor greater than or equal to 2.001 and less than or equal to 2.003, and the third signal that appears at a g-factor greater than or equal to 1.964 and less than or equal to 1.966 is, the lower the content of nitrogen oxide in the oxide insulating film is.

The nitrogen concentration of the oxide insulating film having a low density of states of nitrogen oxide between $E_{v\_os}$ and $E_{c\_os}$ measured by SIMS is lower than or equal to $6 \times 10^{20}$ atoms/cm$^3$.

The oxide insulating film having a low density of states of nitrogen oxide between $E_{v\_os}$ and $E_{c\_os}$ is formed by a PECVD method at a substrate temperature of higher than or equal to 220° C. and lower than or equal to 350° C. using silane and nitrogen oxide, whereby a dense and hard film can be formed.

The insulating film 225 that is formed to be in contact with the insulating film 223 is formed using an oxide insulating film whose oxygen content is higher than that in the stoichiometric composition. Part of oxygen is released by heating from the oxide insulating film containing oxygen in excess of that in the stoichiometric composition. The oxide insulating film whose oxygen content is higher than that in the stoichiometric composition is an oxide insulating film of which the amount of released oxygen converted into oxygen atoms is greater than or equal to $1.0 \times 10^{19}$ atoms/cm$^3$, preferably greater than or equal to $3.0 \times 10^{20}$ atoms/cm$^3$ in thermal desorption spectroscopy (TDS: Thermal Desorption Spectroscopy). Note that the film surface temperature in TDS is preferably higher than or equal to 100° C. and lower than or equal to 700° C., or higher than or equal to 100° C. and lower than or equal to 500° C.

In addition, the number of defects in the insulating film 225 is preferably small; typically, in ESR measurement, the spin density of a signal that appears at g=2.001 due to a dangling bond of silicon is preferably lower than $1.5 \times 10^{18}$ spins/cm$^3$, further preferably lower than or equal to $1 \times 10^{18}$ spins/cm$^3$. Note that the insulating film 225 is provided more apart from the semiconductor film 219 than the insulating film 223; thus, the insulating film 225 may have a higher density of defects than the insulating film 223.

The thickness of the insulating film 223 can be greater than or equal to 5 nm and less than or equal to 150 nm, preferably greater than or equal to 5 nm and less than or equal to 50 nm, further preferably greater than or equal to 10 nm and less than or equal to 30 nm. The thickness of the insulating film 225 can be greater than or equal to 30 nm and less than or equal to 500 nm, preferably greater than or equal to 150 nm and less than or equal to 400 nm.

Furthermore, the insulating films 223 and 225 can be formed using the same kinds of materials; thus, an interface between the insulating films 223 and 225 cannot be clearly observed in some cases. Therefore, in this embodiment, the interface between the insulating films 223 and 225 is shown by a dashed line. Although the two-layer structure of the insulating films 223 and 225 is described in this embodiment, one embodiment of the present invention is not limited thereto. For example, a single-layer structure of the insulating film 223, a single-layer structure of the insulating film 225, or a stacked-layer structure including three or more layers may be used.

The insulating film 227 functioning as a dielectric film of the capacitor 255 is preferably a nitride insulating film. In particular, a silicon nitride film has a higher dielectric constant than a silicon oxide film and needs a larger thickness for capacitance equivalent to that of the silicon oxide film. Thus, when a silicon nitride film is provided as the insulating film 227 functioning as a dielectric film of the capacitor 255, the physical thickness of the insulating film can be increased. This makes it possible to inhibit a decrease in the withstand voltage of the capacitor 255 and rather to increase the withstand voltage, thereby inhibiting electrostatic discharge damage of the capacitor 255. Note that the insulating film 227 also has a function of decreasing the resistivity of the conductive film 220 that functions as an electrode of the capacitor 255.

The insulating film 227 also has a function of blocking oxygen, hydrogen, water, alkali metal, alkaline earth metal, and the like. The insulating film 227 can prevent outward diffusion of oxygen from the semiconductor film 219, outward diffusion of oxygen contained in the insulating films 223 and 225, and entry of hydrogen, water, and the like into the semiconductor film 219 from the outside. Note that instead of the nitride insulating film having a blocking effect against oxygen, hydrogen, water, alkali metal, alkaline earth metal, and the like, an oxide insulating film having a blocking effect against oxygen, hydrogen, water, and the like, may be provided. The oxide insulating film having a blocking effect against oxygen, hydrogen, water, and the like is formed using aluminum oxide, aluminum oxynitride, gallium oxide, gallium oxynitride, yttrium oxide, yttrium oxynitride, hafnium oxide, hafnium oxynitride, or the like.

The structure described in this embodiment can be used as appropriate in combination with any of the structures described in the other embodiments and an example.

(Embodiment 3)

In this embodiment, other structural examples of a display device that can be used for the display system described in the above embodiment will be described.

Figure 28A:
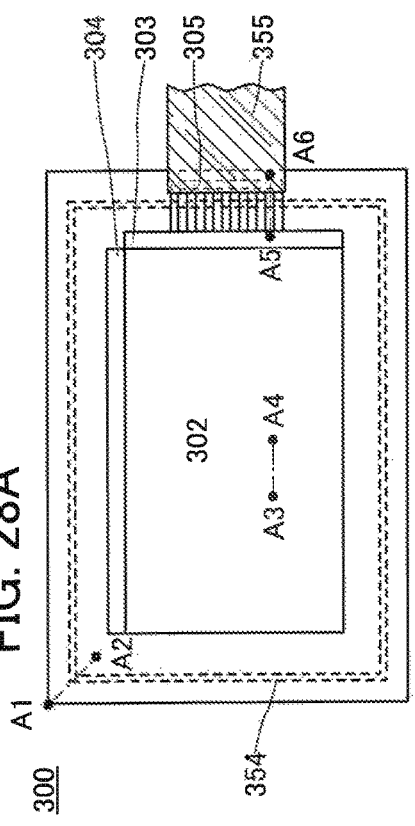
FIG. 28 Diagrams illustrating a structure example of a display device.
Figure 28B:
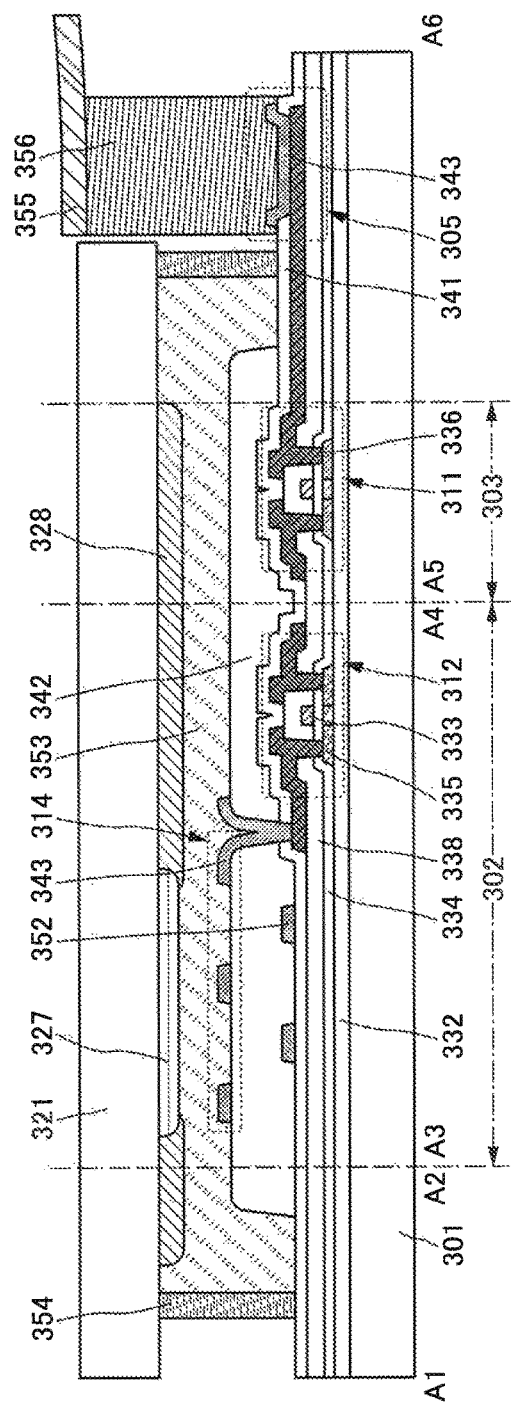
Figure 31A:
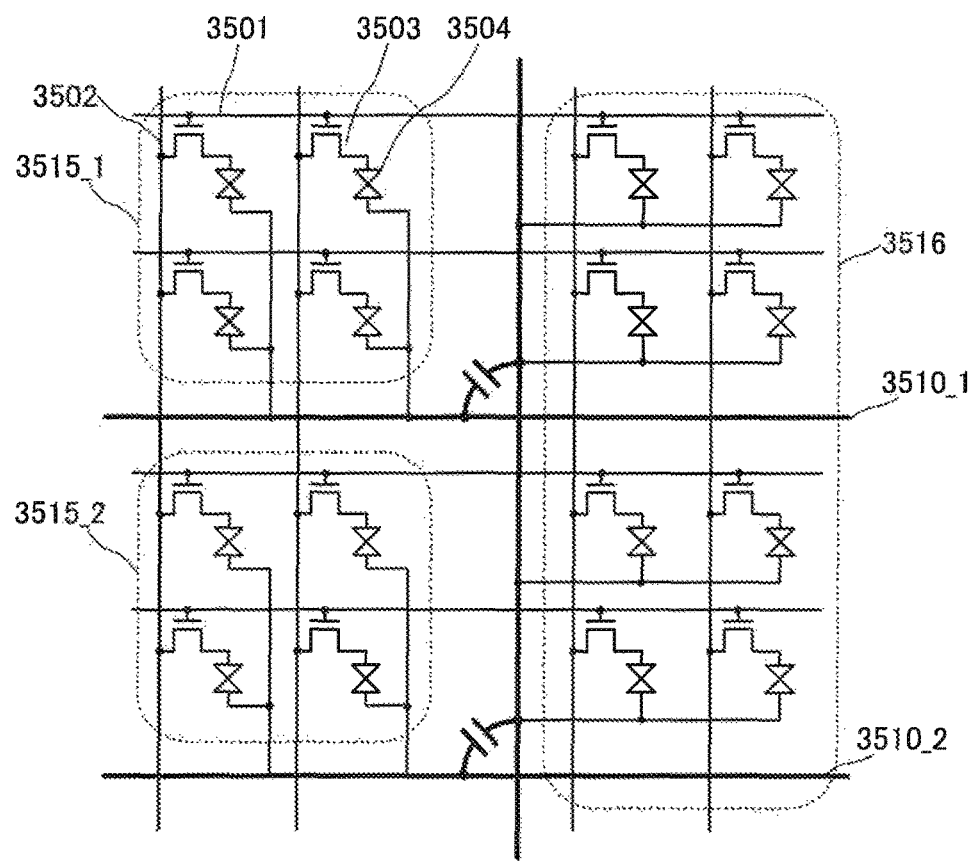
FIG. 31 Diagrams illustrating pixels including touch sensors.

FIG. 31A is a schematic top view of a display device 300. FIG. 28B is a schematic cross-sectional view taken along lines A1-A2, A3-A4, and A5-A6 in FIG. 28A. Note that in FIG. 28A, some components are not illustrated for clarity.

The display device 300 includes, over a top surface of a substrate 301, a display portion 302, a signal line driver circuit 303, a scan line driver circuit 304, and an external connection terminal 305.

The display portion 302 includes a liquid crystal element 314. In the liquid crystal element 314, the alignment of liquid crystal is controlled by an electric field generated in a direction parallel to the substrate surface.

The display device 300 includes an insulating layer 332, an insulating layer 334, an insulating layer 338, an insulating layer 341, an insulating layer 342, a transistor 311, a transistor 312, the liquid crystal element 314, a first electrode 343, a liquid crystal 353, a second electrode 352, a color filter 327, a light-blocking layer 328, and the like.

A pixel includes at least one switching transistor 312 and a storage capacitor (not illustrated). A comb-shaped second electrode 352 and a comb-shaped first electrode 343 electrically connected to one of a source electrode and a drain electrode of the transistor 312 are provided apart from each other over the insulating layer 342.

For the first electrode 343 and/or the second electrode 352, a light-transmitting conductive material is used. It is preferable to use a light-transmitting conductive material for both of the electrodes because the aperture ratio of the pixel can be increased.

The color filter 327 is provided in a position overlapping with the first electrode 343 and the second electrode 352. The light-blocking layer 328 is provided to cover a side surface of the color filter 327. Although the color filter 327 is provided on a substrate 321 in FIG. 28B, the position of the color filter is not limited to this position.

The liquid crystal 353 is provided between the substrate 301 and the substrate 321. An image can be displayed in the following manner: voltage is applied between the first electrode 343 and the second electrode 352 to generate an electric field substantially in the horizontal direction, the alignment of the liquid crystal 353 is controlled by the electric field, and polarization of light from a backlight provided outside the display device is controlled in each pixel.

Alignment films for controlling the alignment of the liquid crystal 353 are preferably provided on surfaces in contact with the liquid crystal 353. A light-transmitting material is used for the alignment film. Although not illustrated here, polarizing plates are provided on an outer surface of the substrate 321 and an outer surface of the substrate 301 with respect to the liquid crystal element 314.

As the liquid crystal 353, thermotropic liquid crystal, low-molecular liquid crystal, high-molecular liquid crystal, ferroelectric liquid crystal, anti-ferroelectric liquid crystal, or the like can be used. Moreover, a liquid crystal exhibiting a blue phase is preferably used because an alignment film is not needed and a wide viewing angle is obtained in that case.

A high-viscosity and low-fluidity material is preferably used for the liquid crystal 353.

Although the liquid crystal element 314 using an IPS mode is described in this structural example, the mode of the liquid crystal element is not limited to this, and a TN (Twisted Nematic) mode, a FFS (Fringe Field Switching) mode, an ASM (Axially Symmetric Aligned Micro-cell) mode, an OCB (Optically Compensated Birefringence) mode, an FLC (Ferroelectric Liquid Crystal) mode, an AFLC (AntiFerroelectric Liquid Crystal) mode, or the like can be used.

The transistors (e.g., the transistor 311 and the transistor 312) provided in the display device 300 are top-gate transistors. Each of the transistors includes a semiconductor layer 335, the insulating layer 334 functioning as a gate insulating layer, and a gate electrode 333. In addition, an insulating layer 338 and an insulating layer 339 are stacked to cover the gate electrode 333; a pair of electrodes 336 of the semiconductor layer 335 is provided through an opening formed in the insulating layers 334, 338, and 339.

Here, an oxide semiconductor can be used for the semiconductor layer 335. As the oxide semiconductor, for example, the oxide semiconductor described in the above embodiment can be used.

The semiconductor layer 335 may include a region functioning as a source region or a drain region which has lower resistance than a region functioning as a channel. For example, the source region and the drain region can be provided such that the source region and the drain region are in contact with the pair of electrodes 336 or that the region functioning as a channel is positioned between the source region and the drain region. For example, the source region and the drain region may be regions whose resistivity is controlled by the method described in the above embodiment.

Alternatively, silicon can be used for the semiconductor layer 335. It is preferable to use silicon also for semiconductor devices such as transistors used for pixels in display regions or driver circuits of the display device 300.

Silicon may be amorphous silicon but is preferably silicon having crystallinity, such as microcrystalline silicon, polycrystalline silicon, or single crystal silicon. In the case where polycrystalline silicon or single crystal silicon transferred to an insulating layer is used for a semiconductor layer, a top-gate transistor is preferably employed. By using a top-gate transistor, a low heat-resistance material can be used for a wiring or an electrode over the semiconductor layer, and a range of choices of the material can be widened. Note that in the case where a high heat-resistance material is used for the gate electrode or in the case where polycrystalline silicon is formed at a very low temperature (e.g., lower than 450° C.), the bottom-gate structure described in the above embodiment is preferably employed because the number of manufacturing steps can be reduced.

In one embodiment of the present invention, an active matrix method in which a pixel includes an active element or a passive matrix method in which a pixel does not include an active element can be used.

In an active matrix method, as an active element (a non-linear element), not only a transistor but also various active elements (non-linear elements) can be used. For example, an MIM (Metal Insulator Metal), a TFD (Thin Film Diode), or the like can also be used. Since such an element has few numbers of manufacturing steps, manufacturing cost can be reduced or yield can be improved. Alternatively, since the size of the element is small, the aperture ratio can be improved, so that power consumption can be reduced or higher luminance can be achieved.

As a method other than the active matrix method, the passive matrix method in which an active element (an active element, a non-linear element) is not used can also be used. Since an active element (a non-linear element) is not used, the number of manufacturing steps is small, so that manufacturing cost can be reduced or yield can be improved. Alternatively, since an active element (a non-linear element) is not used, the aperture ratio can be improved, so that power consumption can be reduced or higher luminance can be achieved, for example.

The structure described in this embodiment can be used as appropriate in combination with any of the structures described in the other embodiments and an example.

(Embodiment 4)

In this embodiment, examples of a driving method of an input device or an input/output device of one embodiment of the present invention are described with reference to drawings.

[Example of Sensing Method of Sensor]

Figure 29A:
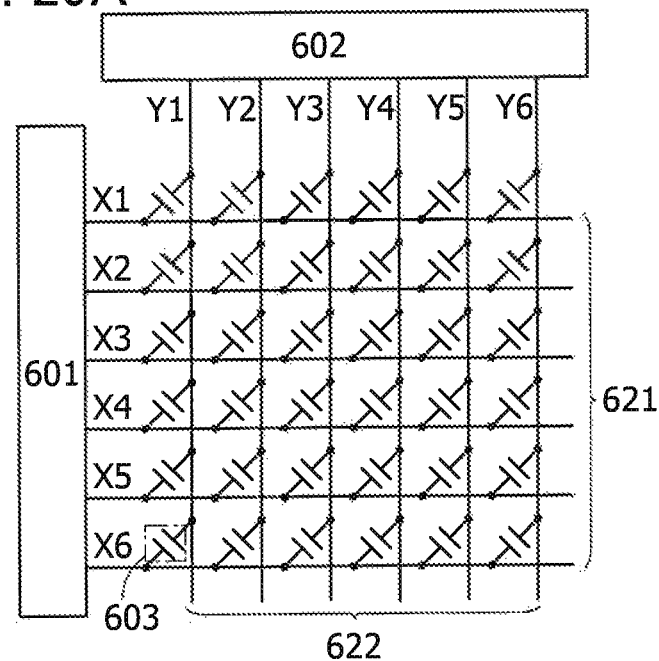
FIG. 29 A block diagram and a timing chart of a touch sensor.

FIG. 29A is a block diagram illustrating a structure of a mutual capacitive touch sensor. FIG. 29A illustrates a pulse voltage output circuit 601 and a current detector circuit 602. Note that in FIG. 29A, six wirings X1 to X6 represent electrodes 621 to which a pulse voltage is applied, and six wirings Y1 to Y6 represent electrodes 622 that sense changes in current. Furthermore, FIG. 29A also illustrates a capacitor 603 that is formed by the overlap of the electrode 621 and the electrode 622. Note that functions of the electrodes 621 and 622 are interchangeable.

The pulse voltage output circuit 601 is a circuit for sequentially applying a pulse to the wirings X1 to X6. By application of a pulse voltage to the wirings X1 to X6, an electric field is generated between the electrodes 621 and 622 of the capacitor 603. When the electric field between the electrodes is shielded, for example, a change occurs in the capacitor 603 (mutual capacitance); the approach or contact of a sensing target can be sensed by utilizing this change.

The current sensing circuit 602 is a circuit for detecting changes in current flowing through the wirings Y1 to Y6 that are caused by the change in mutual capacitance in the capacitor 603. No change in current value is sensed in the wirings Y1 to Y6 when there is no approach or contact of a sensing target, whereas a decrease in current value is sensed when mutual capacitance is decreased owing to the approach or contact of a sensing target. Note that an integrator circuit or the like is used for sensing of current.

Figure 29B:
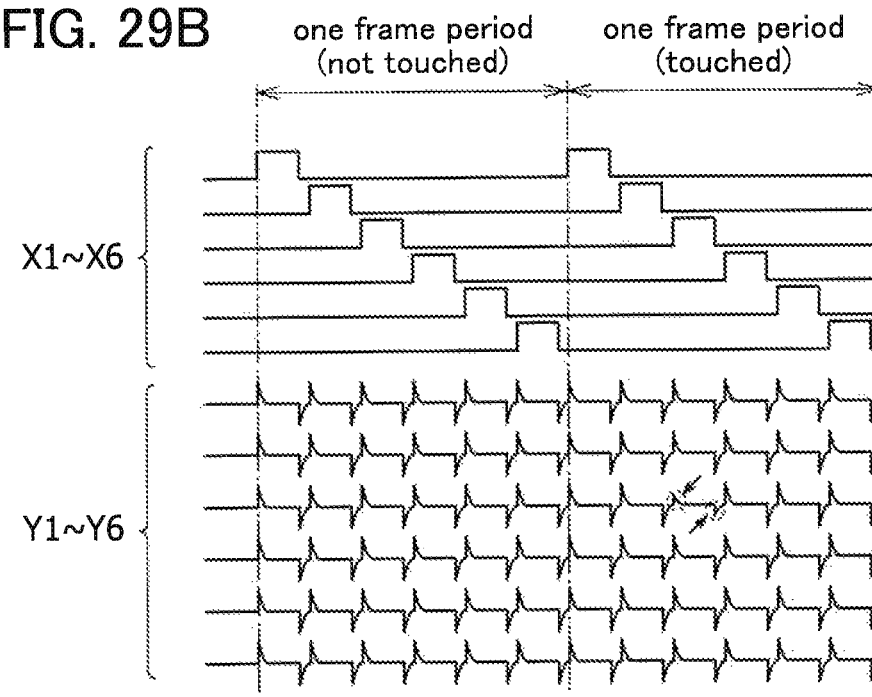

FIG. 29B is a timing chart showing input and output waveforms in the mutual capacitive touch sensor illustrated in FIG. 29A. In FIG. 29B, sensing of an object is performed in all the rows and columns in one frame period. FIG. 29B shows two cases in which an object is not detected (not touched) and in which an object is detected (touched). Note that sensed current values of the wirings Y1 to Y6 are shown as the waveforms of voltage values.

A pulse voltage is sequentially applied to the wirings X1 to X6, and the waveforms of the wirings Y1 to Y6 change uniformly in accordance with the pulse voltage. When there is no approach or contact of a sensing target, the waveforms of the wirings Y1 to Y6 change uniformly in accordance with changes in the voltages of the wirings X1 to X6. Meanwhile, the current value is decreased at the point of approach or contact of a sensing target and accordingly the waveform of the voltage value changes.

By sensing a change in mutual capacitance in this manner, the approach or contact of a sensing target can be sensed.

It is preferable that the pulse voltage output circuit 601 and the current sensing circuit 602 be mounted on a substrate in a housing of an electronic appliance or on the touch panel in the form of an IC. In the case where the touch panel has flexibility, parasitic capacitance might be increased in a bent portion of the touch panel, and the influence of noise might be increased. In view of this, it is preferable to use an IC to which a driving method less influenced by noise is applied. For example, it is preferable to use an IC to which a driving method capable of increasing a signal-noise ratio (S/N ratio) is applied.

Figure 30:
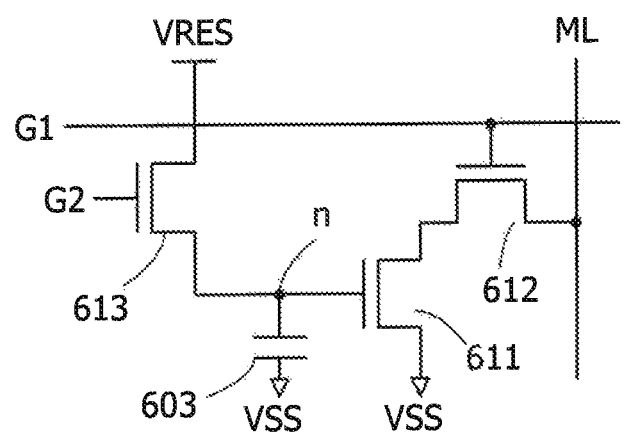
FIG. 30 A circuit diagram of a touch sensor.

Although the touch sensor in FIG. 29A is a passive matrix touch sensor in which only the capacitor 603 is provided at the intersection of wirings, an active matrix touch sensor including a transistor and a capacitor may be used. FIG. 30 is an example of a sensor circuit included in an active matrix touch sensor.

The sensor circuit includes the capacitor 603 and transistors 611, 612, and 613. A signal G2 is input to a gate of the transistor 613. Voltage VRES is applied to one of a source and a drain of the transistor 613, and one electrode of the capacitor 603 and a gate of the transistor 611 are electrically connected to the other of the source and the drain of the transistor 613. One of a source and a drain of the transistor 611 is electrically connected to one of a source and a drain of the transistor 612, and voltage VSS is applied to the other of the source and the drain of the transistor 611. A signal G1 is input to a gate of the transistor 612, and a wiring ML is electrically connected to the other of the source and the drain of the transistor 612. The voltage VSS is applied to the other electrode of the capacitor 603.

Next, the operation of the sensor circuit will be described. First, a potential for turning on the transistor 613 is supplied as the signal G2, and a potential corresponding to the voltage VRES is supplied to a node n connected to the gate of the transistor 611. Then, a potential for turning off the transistor 613 is supplied as the signal G2, whereby the potential of the node n is held.

Then, mutual capacitance of the capacitor 603 changes owing to the approach or contact of a sensing target such as a finger, and accordingly the potential of the node n is changed from VRES.

In a reading operation, a potential for turning on the transistor 612 is supplied as the signal G1. Current flowing through the transistor 611, that is, current flowing through the wiring ML changes in accordance with the potential of the node n. By sensing this current, the approach or contact of a sensing target can be sensed.

It is preferable that the transistors 611, 612, and 613 each include an oxide semiconductor in a semiconductor layer in which a channel is formed. In particular, with the transistor 613 having such a structure, the potential of the node n can be held for a long time and the frequency of operation of resupplying VRES to the node n (refresh operation) can be reduced.

[Structure Example of In-Cell Touch Panel]

Although the examples where the electrodes in the touch sensor are formed over a substrate different from a substrate where the display element and the like are provided are described above, one or both of the pair of electrodes in the touch sensor may be formed over the substrate where the display element and the like are provided.

A structure example of a touch panel incorporating the touch sensor into a display portion including a plurality of pixels will be described below. Here, an example where a liquid crystal element is used as a display element provided in the pixel is shown.

FIG. 31A is an equivalent circuit diagram of part of a pixel circuit provided in the display portion of the touch panel in this structure example.

Each pixel includes at least a transistor 3503 and a liquid crystal element 3504. In addition, a gate of the transistor 3503 is electrically connected to a wiring 3501 and one of a source and a drain of the transistor 3503 is electrically connected to a wiring 3502.

The pixel circuit includes a plurality of wirings extending in the X direction (e.g., a wiring 3510_1 and a wiring 3510_2) and a plurality of wirings extending in the Y direction (e.g., a wiring 3511). They are provided to be orthogonal to each other, and capacitance is formed therebetween.

Among the pixels provided in the pixel circuit, ones of electrodes of the liquid crystal elements of some pixels adjacent to each other are electrically connected to each other to form one block. The block is classified into two types: an island-shaped block (e.g., a block 3515_1 or a block 3515_2) and a linear block (e.g., a block 3516) extending in the Y direction. Note that only part of the pixel circuit is illustrated in FIG. 31, but actually, these two kinds of blocks are repeatedly arranged in the X direction and the Y direction.

The wiring 3510_1 (or 3510_2) extending in the X direction is electrically connected to the island-shaped block 3515_1 (or the block 3515_2). Although not illustrated, the wiring 3510_1 extending in the X direction is electrically connected to a plurality of island-shaped blocks 3515_1 which are provided discontinuously along the X direction with the linear blocks therebetween. Furthermore, the wiring 3511 extending in the Y direction is electrically connected to the linear block 3516.

Figure 31B:
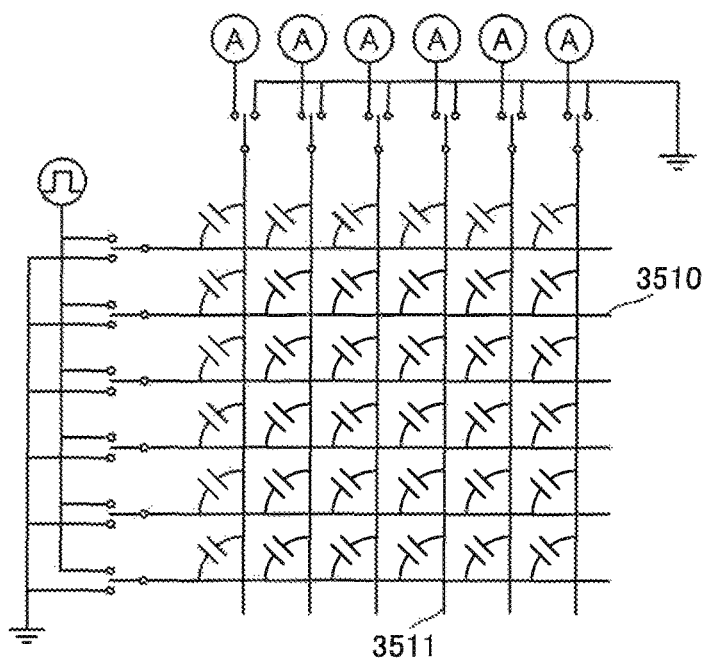

FIG. 31B is an equivalent circuit diagram illustrating the connection between a plurality of wirings 3510 extending in the X direction and the plurality of wirings 3511 extending in the Y direction. Input voltage or a common potential can be input to each of the wirings 3510 extending in the X direction. Further, a ground potential can be input to each of the wirings 3511 extending in the Y direction, or the wirings 3511 can be electrically connected to the detection circuit.

Operation of the above-described touch panel is described with reference to FIGS. 32A and 32B.

Here, one frame period is divided into a writing period and a sensing period. The writing period is a period in which image data is written to a pixel, and the wirings 3501 (also referred to as gate lines or scan lines) are sequentially selected. On the other hand, the sensing period is a period in which sensing is performed by a touch sensor, and the wirings 3510 extending in the X direction are sequentially selected and input voltage is input.

Figure 32A:
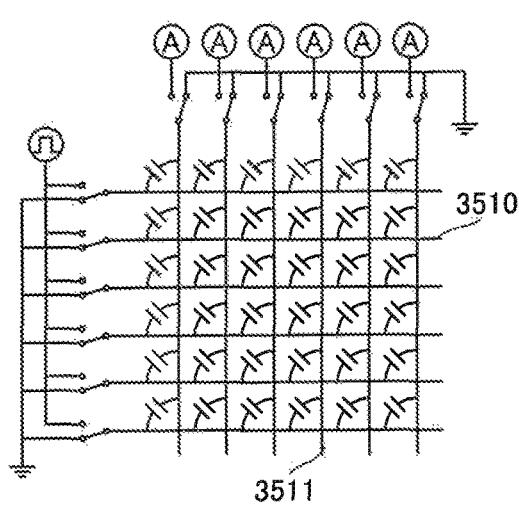
FIG. 32 Diagrams illustrating operation of touch sensors and pixels.

FIG. 32A is an equivalent circuit diagram in the writing period. In the wiring period, a common potential is input to both the wiring 3510 extending in the X direction and the wiring 3511 extending in the Y direction.

Figure 32B:
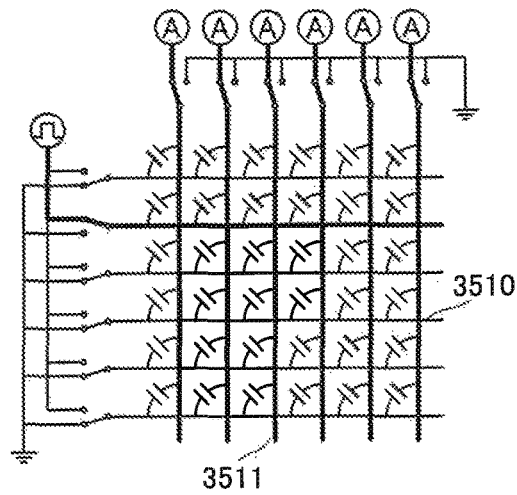

FIG. 32B is an equivalent circuit diagram at a certain point of time in the sensing period. In the detection period, each of the wirings 3511 extending in the Y direction is electrically connected to the detection circuit. Input voltage is input to the wirings 3510 extending in the X direction which are selected, and a common potential is input to the wirings 3510 extending in the X direction which are not selected.

Note that the driving method described here can be applied to not only an in-cell touch panel but also the above-described touch panels, and can be used in combination with the method described in the driving method example.

It is preferable that a period in which an image is written and a period in which sensing is performed by a touch sensor be separately provided as described above. Thus, a decrease in sensitivity of the touch sensor caused by noise generated when data is written to a pixel can be inhibited.

The structure described in this embodiment can be used as appropriate in combination with any of the structures described in the other embodiments and an example.

(Embodiment 5)

In this embodiment, a display module and electronic appliances that include a display device of one embodiment of the present invention are described with reference to FIG. 33 and FIG. 34.

Figure 33:
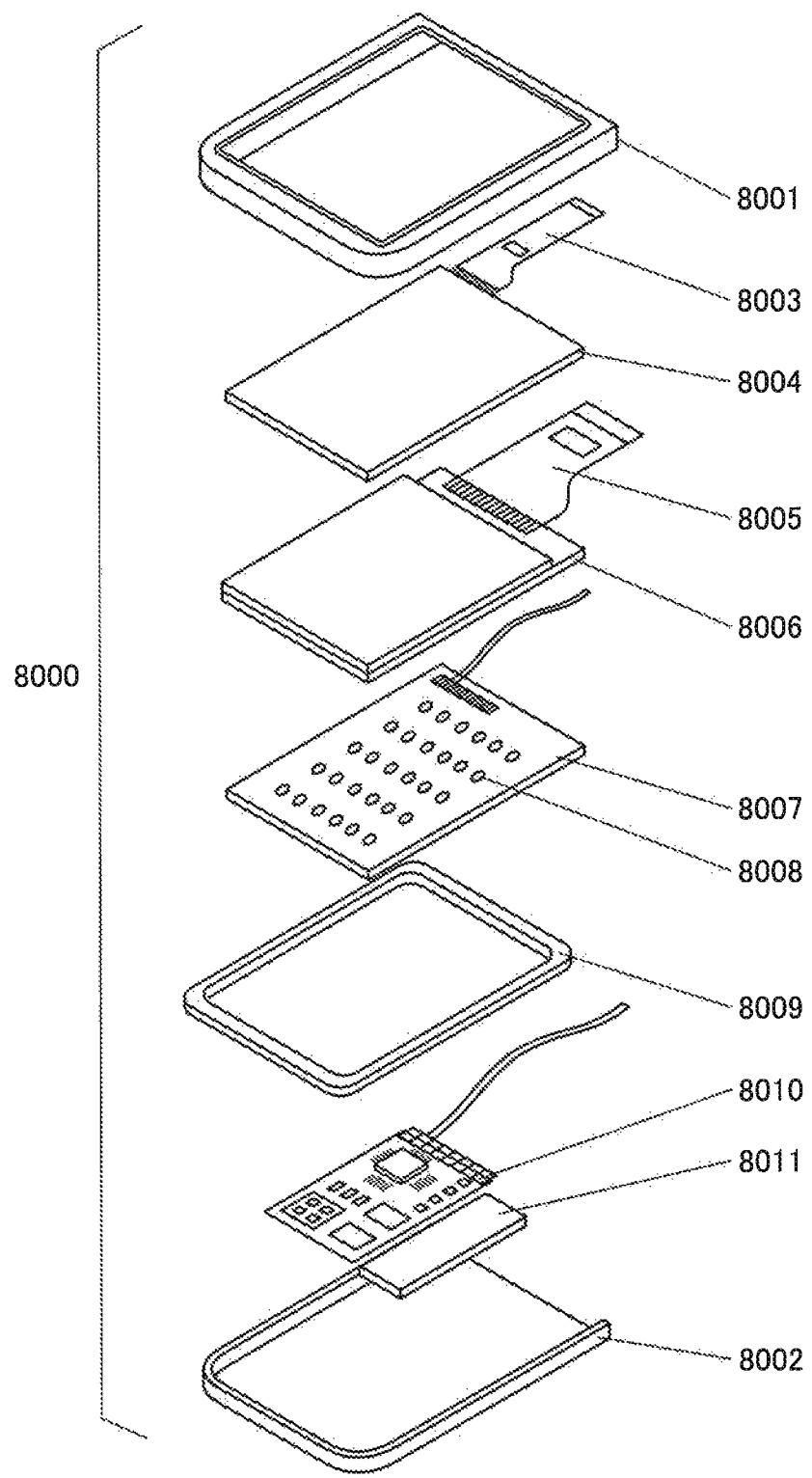
FIG. 33 A diagram illustrating a display module.

In a display module 8000 illustrated in FIG. 33, a touch panel 8004 connected to an FPC 8003, a display panel 8006 connected to an FPC 8005, a backlight 8007, a frame 8009, a printed board 8010, and a battery 8011 are provided between an upper cover 8001 and a lower cover 8002.

The display device of one embodiment of the present invention can be used for, for example, the display panel 8006.

The shape and size of the upper cover 8001 and the lower cover 8002 can be changed as appropriate in accordance with the size of the touch panel 8004 and the display panel 8006.

The touch panel 8004 can be a resistive touch panel or a capacitive touch panel and can overlap the display panel 8006. A counter substrate (sealing substrate) of the display panel 8006 can have a touch panel function. A photosensor may be provided in each pixel of the display panel 8006 to form an optical touch panel.

The backlight 8007 includes a light source 8008. Note that although a structure in which the light sources 8008 are provided over the backlight 8007 is illustrated in FIG. 33, one embodiment of the present invention is not limited to this structure. For example, a structure in which a light source 8008 is provided at an end portion of the backlight 8007 and a light diffusion plate is further provided may be employed. In the case where a self-luminous light-emitting element such as an organic EL element is used or the case where a reflective panel is used, the backlight 8007 is not necessarily provided.

The frame 8009 has a function of protecting the display panel 8006 and functions as an electromagnetic shield for blocking electromagnetic waves generated by the operation of the printed circuit board 8010. The frame 8009 can also function as a radiator plate.

The printed board 8010 has a power supply circuit and a signal processing circuit for outputting a video signal and a clock signal. As a power source for supplying power to the power supply circuit, an external commercial power source or the battery 8011 provided separately may be used. The battery 8011 can be omitted in the case of using a commercial power source.

The display module 8000 may be additionally provided with a member such as a polarizing plate, a retardation plate, or a prism sheet.

FIG. 34A to FIG. 34G illustrate electronic devices. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 34A:
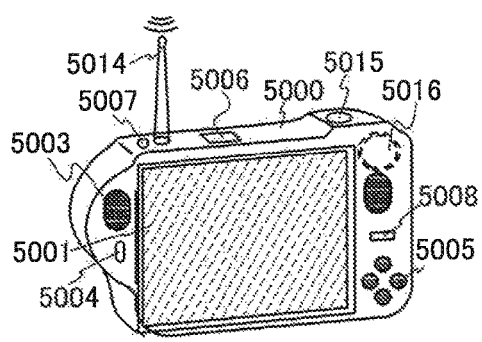
FIG. 34 Diagrams illustrating electronic appliances.
Figure 34B:
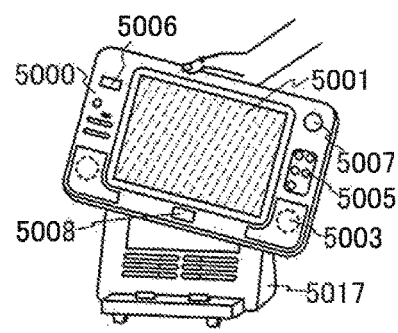

FIG. 34A illustrates a digital camera with a television reception function, and the digital camera can include an antenna 5014, a shutter button 5015, an image receiving portion 5016, and the like in addition to the above components. FIG. 33B illustrates a portable television receiver that can include a charger 5017 capable of transmitting and receiving signals, and the like in addition to the above components.

Figure 34C:
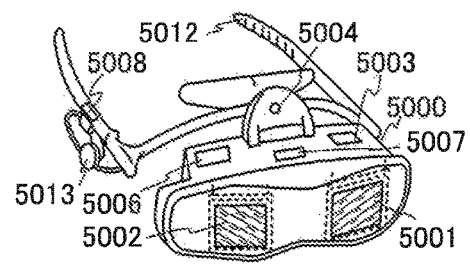
Figure 34D:
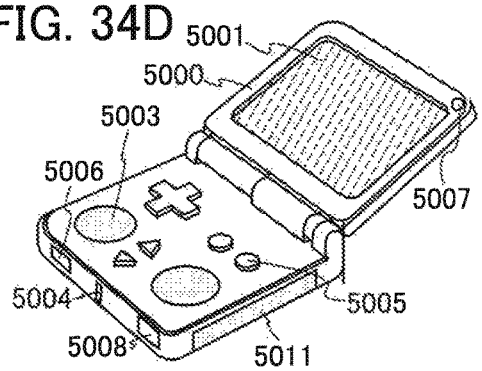
Figure 34E:
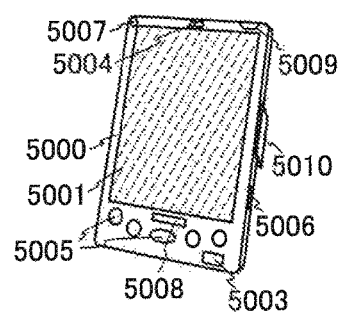
Figure 34F:
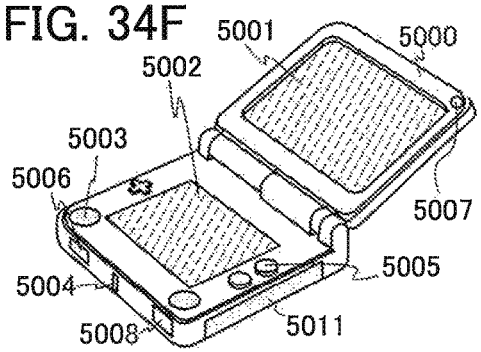
Figure 34G:
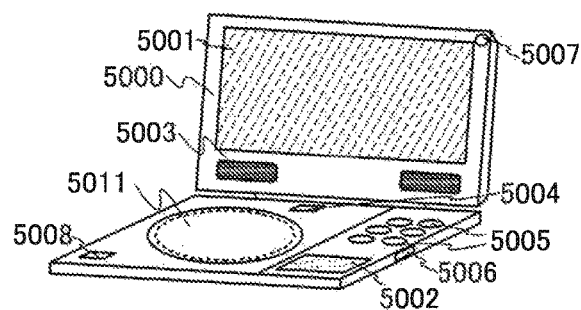

FIG. 34C illustrates a goggle-type display that can include the second display portion 5002, a support portion 5012, an earphone 5013, and the like in addition to the above components. FIG. 34D illustrates a portable game console that can include the recording medium reading portion 5011 and the like in addition to the above components. FIG. 34E illustrates a mobile computer that can include a switch 5009, an infrared port 5010, and the like in addition to the above components. FIG. 34F illustrates a portable game console that can include the second display portion 5002, the recording medium reading portion 5011, and the like in addition to the above components. FIG. 34G illustrates a portable image reproducing device (e.g., a DVD reproducing device) provided with a recording medium, and the portable image reproducing device can include a second display portion 5002, a recording medium reading portion 5011, and the like in addition to the above components.

The electronic devices illustrated in FIG. 34A to 34G can have a variety of functions, for example, a function of displaying a variety of data (e.g., a still image, a moving image, and a text image) on a display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading a program or data stored in a recording medium and displaying the program or data on a display portion. Furthermore, the electronic device including a plurality of display portions can have a function of displaying image information mainly on one display portion while displaying text information on another display portion, a function of displaying a three-dimensional image by displaying images where parallax is considered on a plurality of display portions, or the like. Furthermore, the electronic device including an image receiving portion can have a function of photographing a still image, a function of photographing a moving image, a function of automatically or manually correcting a photographed image, a function of storing a photographed image in a memory medium (an external memory medium or a memory medium incorporated in the camera), a function of displaying a photographed image on the display portion, or the like. Note that functions of the electronic devices illustrated in FIG. 34A to FIG. 34G are not limited thereto, and the electronic devices can have a variety of functions.

The electronic devices described in this embodiment is each characterized each including the display portion for displaying some sort of data. The display device described in the above embodiment can be employed for the display portion.

EXAMPLE

In this example, a display system using one embodiment of the present invention will be described with reference to FIG. 35 to FIG. 37.

FIG. 35 illustrate the measurement results of luminance changes in a 100-μm-diameter region of a display device. Note that a text image was displayed on the display device while being scrolled. The text image includes 25 lines per page. Each line includes 49 letters with a font size of 20 points.

Figure 35A:
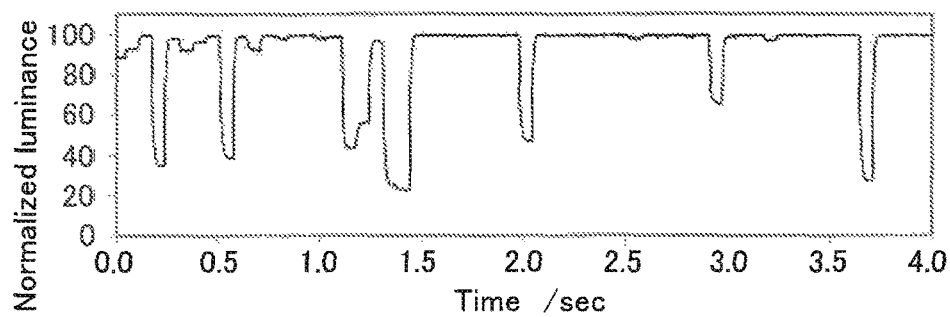
FIG. 35 Diagrams illustrating the measurement results of change in luminance of a display device.

FIG. 35A illustrates a change in luminance observed when the text image was displayed while being scrolled at a speed of 2.5 pages/sec.

Figure 35B:
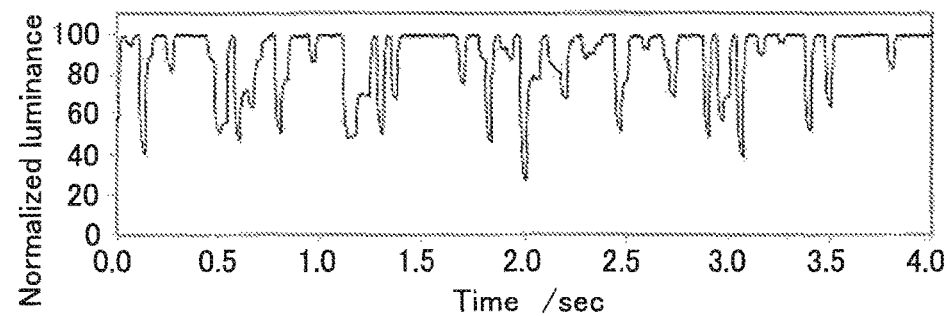

FIG. 35B illustrates a change in luminance observed when the text image using the letters with a higher gray scale than that of the letters in the test image in FIG. 35A was displayed while the text image was scrolled at a speed of 5 pages/sec. Specifically, the text image was displayed with the gray scale that makes the luminance approximately 50% to reduce the contrast.

Figure 36A:
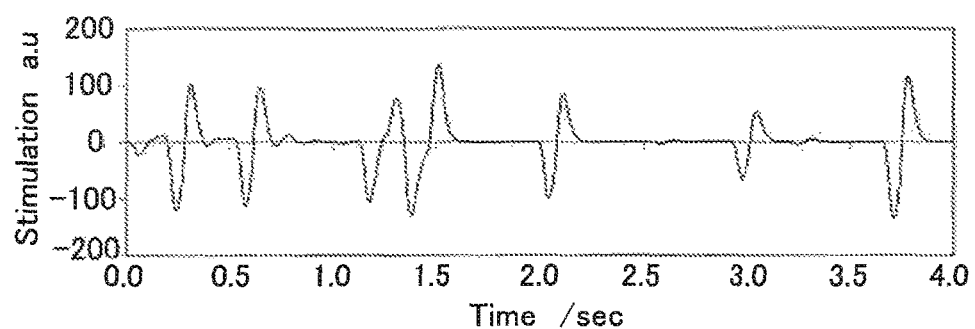
FIG. 36 Diagrams illustrating the measurement results of change in visual stimuli on the basis of change in luminance.
Figure 36B:
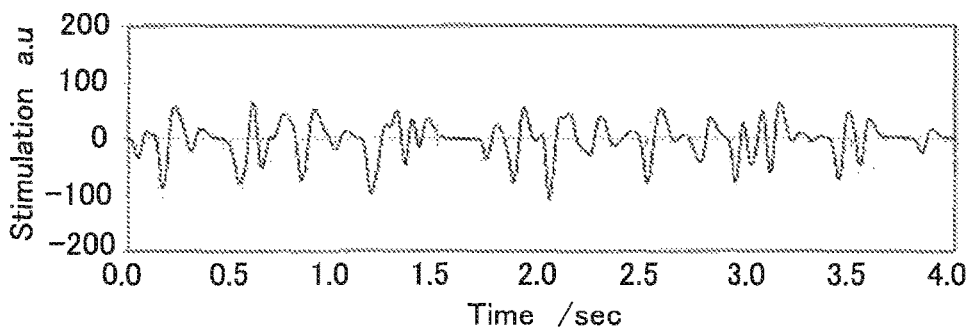
Figure 36C:
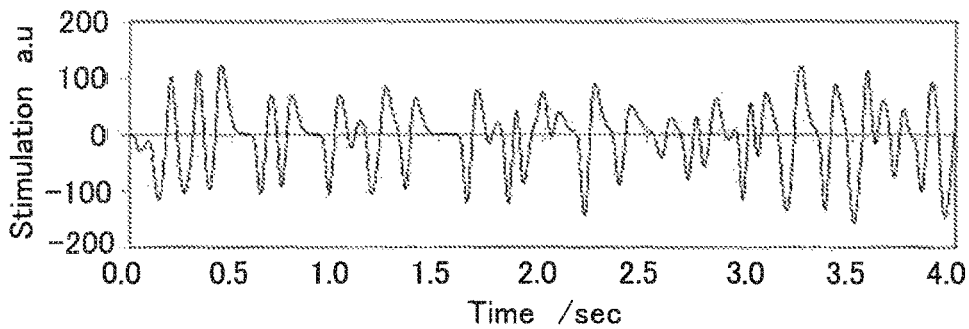

FIG. 36C illustrates a change in luminance observed when the text image using letters with the same gray scale as than that of the letters in the test image in FIG. 36A was displayed while the text image was scrolled at a speed of 5 pages/sec.

FIG. 36 illustrate the calculation result of the change in visual stimulation based on the luminance change shown in FIG. 35, which was obtained using the Barten model. The Barten model is expressed as follows.

$$S(u, w) = \frac{\frac{M_{opt}(u)}{k}}{\sqrt{\frac{2}{T}\left(\frac{1}{X_0^2} + \frac{1}{X_{max}^2} + \frac{u^2}{N_{max}^2}\right)\left(\frac{1}{\eta pE} + \frac{\Phi_0}{[H_1(w)\{1 - H_2(w)F(u)\}]^2}\right)}} \quad \text{[Formula 1]}$$

Note that in the formula, k represents a signal-noise ratio, T represents visual integration time, $X_0$ represents the size of an object, $X_{max}$ represents the upper limit of integration, $N_{max}$ represents the maximum number of integration cycles of bright and dark, η represents quantum efficiency, p represents a quantum conversion factor, E represents retinal illuminance, $\Phi_0$ represents the spectral density of neural noise, and $u_0$ represents the spatial frequency of lateral inhibition.

FIG. 36A shows the calculation result of the change in visual stimulation based on the luminance change shown in FIG. 35A, which was obtained using the Barten model.

FIG. 36B shows the calculation result of the change in visual stimulation based on the luminance change shown in FIG. 35B, which was obtained by the Barten model.

Figure 35C:
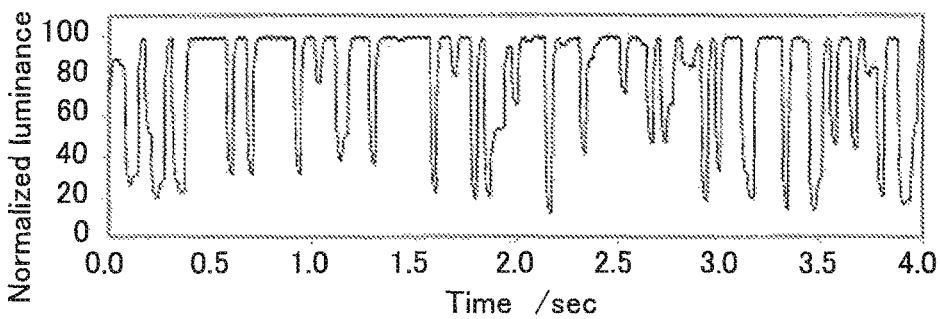

FIG. 36C shows the calculation result of the change in visual stimulation based on the luminance change shown in FIG. 35C, which was obtained using the Barten model.

FIG. 37 show the measurement results of the critical fusion frequencies (CCFs) of six subjects who observed the text images illustrated using FIG. 35. Specifically, the text image was observed for a minute while being scrolled, and then, the critical fusion frequency (CCF) was measured ten times, and the measurement values were averaged. This process was repeated five times, and added time was counted as time of stressing.

Figure 37A:
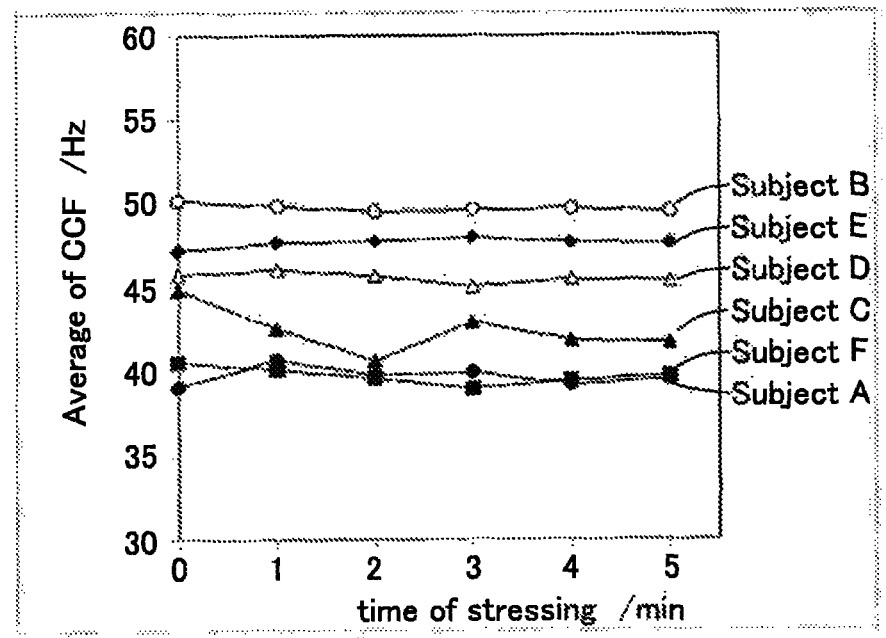
FIG. 37 Diagrams illustrating the measurement result of critical fusion frequency (CCF) of examinee who observed text image.

FIG. 37A shows the measurement results of the critical fusion frequencies (CCFs) of the six subjects who observed the text image illustrated using FIG. 35B.

Figure 37B:
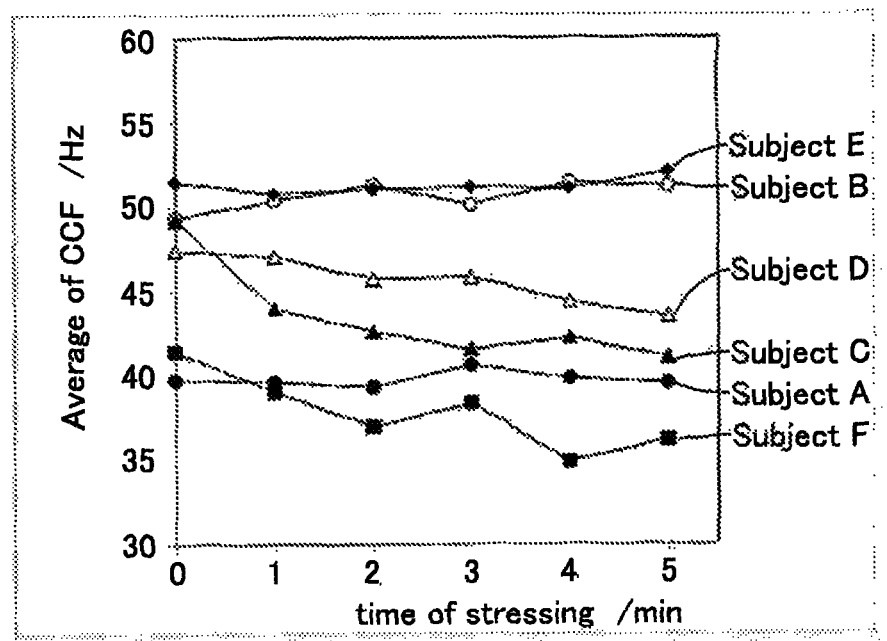

FIG. 37B shows the measurement results of the critical fusion frequencies (CCFs) of the six subjects who observed the text image illustrated using FIG. 35C.

Note that AQUOS PAD SH-06F produced by Sharp Corporation was used and text images are displayed and scrolled. The screen diagonal of the display panel was 7.0 inches, the pixel density was 323 ppi, and each pixel includes a VA-mode liquid crystal element and a transistor including an oxide semiconductor.

For the critical fusion frequency measurement, a Roken-type digital flicker value tester, model RDF-1 produced by SIBATA SCIENTIFIC TECHNOLOGY LTD. was used.

<Result>

When compared in the same period, a luminance change at a low scroll speed was smaller than that at a high scroll speed; accordingly, visual stimulation was reduced when the scroll speed was low (see FIG. 35A, FIG. 35C, FIG. 36A, and FIG. 36C).

Comparison between luminance changes at a high scroll speed in the same period showed that a luminance change in the text image displaying letters with a high gray scale to reduce the contrast was smaller, and thus, visual stimulation was suppressed (see FIG. 35B, FIG. 36B, FIG. 35C, and FIG. 36C).

In addition, decreases in the critical fusion frequencies (CCFs) of the subjects who repeatedly observed the text image scrolled at a high speed were inhibited when the letters in the text image were displayed with a high gray scale to reduce the contrast (see FIG. 37A and FIG. 37B).

This showed that eye strain on the subject accumulated by high-speed scrolling can be reduced by displaying letters with a high gray scale to reduce the contrast.

Specifically, when the letters in the text image were displayed with a high gray scale to reduce the contrast, no decrease was observed in the critical fusion frequencies of the subjects (see FIG. 37A).

On the other hand, when the letters in the text image were displayed so as not to change the contrast, the critical fusion frequencies of the subject A, the subject C, the subject D, the subject F were decreased (see FIG. 37B).

The structure described in this example can be used as appropriate in combination with any of the structures described in the other embodiments.

REFERENCE NUMERALS 30 pixel portion
40 circuit
50 pixel circuit
60 circuit
65 circuit
70 liquid crystal element
81 capacitor
90 pixel circuit
91 pixel circuit
92 pixel circuit
93 pixel circuit
94 pixel circuit
95 pixel circuit
100 diameter
200 display device
211 substrate
213 conductive film
215 insulating film
217 insulating film
219 semiconductor layer
219a semiconductor layer
220 conductive film
221a conductive film
221b conductive film
223 insulating film
225 insulating film
227 insulating film
228 insulating film
229 common electrode
243 conductive film
245 insulating film
247 conductive film
250 liquid crystal layer
251 substrate
252 transistor
255 capacitor
258 resistor
261 light-blocking film
262 coloring film
270 pixel
270a pixel
270b pixel
270c pixel
270d pixel
270e pixel
270f pixel
271 pixel portion 274 scan line driver circuit
275 common line
276 signal line driver circuit
277 scan line
279 signal line
300 display device
301 substrate
302 display portion
303 signal line driver circuit
304 scan line driver circuit
305 external connection terminal
311 transistor
312 transistor
314 liquid crystal element
321 substrate
327 color filter
328 light-blocking layer
332 insulating layer
333 gate electrode
334 insulating layer
335 semiconductor layer
336 electrode
338 insulating layer
339 insulating layer
341 insulating layer
342 insulating layer
343 electrode
352 electrode
353 liquid crystal
510 transistor
520 transistor
530 transistor
550 capacitor
560 capacitor
570 liquid crystal element
580 resistor
601 pulse voltage output circuit
602 current detection circuit
603 capacitor
610 signal line
611 transistor
612 transistor
613 transistor
620 scan line
621 electrode
622 electrode
630 scan line
640 wiring
650 wiring
660 wiring
670 wiring
810 substrate
830 semiconductor layer
831 resistive layer
840 conductive layer
850 conductive layer
855 conductive layer
860 insulating layer
870 protective film
875 conductive layer
880 protective film
920 scan line
3501 wiring
3502 wiring
3503 transistor
3504 liquid crystal element
3510 wiring
3510_1 wiring
3510_2 wiring
3511 wiring
3515_1 block
3515_2 block
3516 block
5000 housing
5001 display portion
5002 display portion
5003 speaker
5004 LED lamp
5005 operation key
5006 connection terminal
5007 sensor
5008 microphone
5009 switch
5010 infrared port
5011 recording media reading portion
5012 support portion
5013 earphone
5014 antenna
5015 shutter button
5016 image receiving portion
5017 charger
8000 display module
8001 upper cover
8002 lower cover
8003 FPC
8004 touch panel
8005 FPC
8006 display panel
8007 backlight
8008 light source
8009 frame
8010 printed circuit board
8011 battery

The invention claimed is:

1. A display device comprising:
a transistor;
a resistor;
a first capacitor;
a second capacitor; and
a liquid crystal element,
wherein one of a source and a drain of the transistor is electrically connected to one electrode of the resistor,
wherein the one of the source and the drain of the transistor is electrically connected to one electrode of the first capacitor,
wherein the other electrode of the resistor is electrically connected to a first wiring,
wherein the other of the source and the drain of the transistor is electrically connected to one electrode of the liquid crystal element,
wherein the other of the source and the drain of the transistor is electrically connected to one electrode of the second capacitor, and
wherein a gate of the transistor is electrically connected to a second wiring.

2. The display device according to claim 1, wherein the transistor comprises an oxide semiconductor in a channel formation region.

3. A display device comprising:
a first transistor;
a second transistor;
a resistor;
a first capacitor;
a second capacitor; and
a liquid crystal element,
wherein one of a source and a drain of the first transistor is electrically connected to one electrode of the resistor,
wherein the one of the source and the drain of the first transistor is electrically connected to one electrode of the first capacitor,
wherein the other electrode of the resistor is electrically connected to a first wiring,
wherein the other of the source and the drain of the first transistor is electrically connected to one electrode of the liquid crystal element,
wherein the other of the source and the drain of the first transistor is electrically connected to one electrode of the second capacitor,
wherein a gate of the first transistor is electrically connected to a second wiring,
wherein one of a source and a drain of the second transistor is electrically connected to the other electrode of the resistor,
wherein the other of the source and the drain of the second transistor is electrically connected to the other of the source and the drain of the first transistor, and
wherein a gate of the second transistor is electrically connected to a third wiring.

4. A display device comprising:
a first transistor;
a second transistor;
a resistor;
a first capacitor;
a second capacitor; and
a liquid crystal element,
wherein one of a source and a drain of the first transistor is electrically connected to a first wiring,
wherein the other of the source and the drain of the first transistor is electrically connected to one electrode of the first capacitor,
wherein the other of the source and the drain of the first transistor is electrically connected to one electrode of the resistor,
wherein the other electrode of the resistor is electrically connected to one electrode of the second capacitor,
wherein the other electrode of the resistor is electrically connected to one electrode of the liquid crystal element,
wherein a gate of the first transistor is electrically connected to a second wiring,
wherein one of a source and a drain of the second transistor is electrically connected to the one electrode of the resistor,
wherein the other of the source and the drain of the second transistor is electrically connected to the other electrode of the resistor, and
wherein a gate of the second transistor is electrically connected to a third wiring.

5. The display device according to claim 3,
wherein the first transistor and the second transistor each comprise an oxide semiconductor in a channel formation region.

6. The display device according to claim 3,
wherein a resistive layer of the resistor is an oxide.

7. The display device according to claim 3,
wherein when an image displayed with the liquid crystal element is scrolled at a speed equal to or faster than a first speed, an image signal is supplied to the liquid crystal element without being through the second transistor, and
wherein when the image displayed with the liquid crystal element is scrolled at a speed slower than the first speed, the image signal is supplied to the liquid crystal element through the second transistor.

8. An electronic device, comprising:
the display device according to claim 1;
a speaker; and
a microphone.

9. The display device according to claim 4,
wherein the first transistor and the second transistor each comprise an oxide semiconductor in a channel formation region.

10. The display device according to claim 4,
wherein a resistive layer of the resistor is an oxide.

11. The display device according to claim 4,
wherein when an image displayed with the liquid crystal element is scrolled at a speed equal to or faster than a first speed, an image signal is supplied to the liquid crystal element without being through the second transistor, and
wherein when the image displayed with the liquid crystal element is scrolled at a speed slower than the first speed, the image signal is supplied to the liquid crystal element through the second transistor.

* * * * *